(12) United States Patent
Han et al.

(10) Patent No.: US 9,374,087 B2
(45) Date of Patent: Jun. 21, 2016

(54) APPARATUS AND METHOD FOR PROCESSING VIRTUAL WORLD

(75) Inventors: Jae Joon Han, Yongin-si (KR); Seung Ju Han, Yongin-si (KR); Won Chul Bang, Yongin-si (KR); Do Kyoon Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 406 days.

(21) Appl. No.: 13/639,745

(22) PCT Filed: Apr. 4, 2011

(86) PCT No.: PCT/KR2011/002319
§ 371 (c)(1),
(2), (4) Date: Dec. 11, 2012

(87) PCT Pub. No.: WO2011/126244
PCT Pub. Date: Oct. 13, 2011

(65) Prior Publication Data
US 2013/0069804 A1     Mar. 21, 2013

(30) Foreign Application Priority Data
Apr. 5, 2010 (KR) ........................ 10-2010-0031030

(51) Int. Cl.
*H03K 17/94* (2006.01)
*G06F 3/01* (2006.01)
*H04N 19/90* (2014.01)

(52) U.S. Cl.
CPC ................ *H03K 17/94* (2013.01); *G06F 3/011* (2013.01); *H04N 19/90* (2014.11)

(58) Field of Classification Search
None
See application file for complete search history.

(56) References Cited

U.S. PATENT DOCUMENTS

| 7,647,415 | B1 | 1/2010 | Sandoz et al. |
|---|---|---|---|
| 2003/0110001 | A1 | 6/2003 | Chassin et al. |
| 2005/0114532 | A1 | 5/2005 | Chess et al. |
| 2007/0024644 | A1 | 2/2007 | Bailey |
| 2008/0114710 | A1 | 5/2008 | Pucher |
| 2009/0055126 | A1 | 2/2009 | Yanovich et al. |
| 2009/0113389 | A1 | 4/2009 | Ergo et al. |
| 2009/0150802 | A1 | 6/2009 | Do et al. |

(Continued)

FOREIGN PATENT DOCUMENTS

| CN | 1206007 C | 6/2005 |
|---|---|---|
| JP | 2002-305758 | 10/2002 |

(Continued)

OTHER PUBLICATIONS

Full motion control and navigation of avatar/objec with multi-input sources in MPEG-V, Seungju Han, ISO/IEC, Lausanne, Switzerland, Feb. 2009.*
International Search Report of Corresponding PCT Application PCT/KR2011/002319 mailed Dec. 20, 2011.

(Continued)

*Primary Examiner* — Julie Lieu
(74) *Attorney, Agent, or Firm* — NSIP Law

(57) ABSTRACT

A virtual world processing apparatus and method. Information on sensor capability is converted to binary data and then transmitted, or converted to eXtensible Markup Language (XML) data, or the XML data is further converted to binary data and then transmitted. Accordingly, data transmission rate may be increased and a low bandwidth may be used. In a data-receiving adaptation real world to virtual world (RV) engine, complexity of the adaptation RV engine may be reduced by omitting an XML parser.

23 Claims, 21 Drawing Sheets

(56) References Cited

U.S. PATENT DOCUMENTS

| | | | |
|---|---|---|---|
| 2010/0070885 A1 | 3/2010 | Bromenshenkel et al. | |
| 2010/0107127 A1* | 4/2010 | Han et al. | 715/848 |
| 2010/0238168 A1* | 9/2010 | Kim et al. | 345/420 |
| 2010/0268745 A1* | 10/2010 | Choi et al. | 707/802 |
| 2010/0274817 A1* | 10/2010 | Choi et al. | 707/802 |
| 2010/0313146 A1* | 12/2010 | Nielsen et al. | 715/757 |
| 2011/0254670 A1* | 10/2011 | Han et al. | 340/407.1 |
| 2012/0188237 A1* | 7/2012 | Han et al. | 345/419 |
| 2012/0191737 A1* | 7/2012 | Han et al. | 707/756 |
| 2013/0016124 A1* | 1/2013 | Han et al. | 345/649 |
| 2013/0038601 A1* | 2/2013 | Han et al. | 345/419 |
| 2013/0069804 A1* | 3/2013 | Han et al. | 341/20 |
| 2013/0088341 A1* | 4/2013 | Lim et al. | 340/407.1 |
| 2013/0093665 A1* | 4/2013 | Han et al. | 345/156 |
| 2013/0278633 A1* | 10/2013 | Ahn et al. | 345/633 |
| 2014/0002249 A1* | 1/2014 | Lim et al. | 340/407.1 |
| 2014/0012286 A1* | 1/2014 | Lee et al. | 606/130 |
| 2014/0015931 A1* | 1/2014 | Han et al. | 348/46 |
| 2014/0081773 A1* | 3/2014 | Foster | G06Q 40/04 705/14.72 |

FOREIGN PATENT DOCUMENTS

| | | |
|---|---|---|
| JP | 2003-058239 | 2/2003 |
| JP | 2003-187267 | 7/2003 |
| JP | 2007-206746 | 8/2007 |
| JP | 2009-140492 | 6/2009 |
| WO | WO 95/20788 A1 | 8/1995 |

OTHER PUBLICATIONS

Chinese Office Action mailed Jan. 14, 2015 in Chinese Application No. 201180017945.9 (6 pages in English, 8 pages in Chinese).

Japanese Office Action dated Sep. 24, 2014 from Japanese Patent Application No. 2013-503661, 5 pages.

Extended European Search Report issued on Feb. 2, 2016, in counterpart European Application No. 11766095.1. (9 pages in English).

Jongyeol Yang et al., "Gesture-based Table Tennis Game in AR Environment", Journal of the Korean Society for Computer Game 5.3, 2005, pp. 3-10.

Korean Office Action issued on Apr. 26, 2016 in counterpart Korean Application No. 10-2010-0031030. (10 pages with English Translation).

* cited by examiner

FIG. 13

| | | |
|---|---|---|
| 510 — Diagram | SensorCapabilityBaseType | ⊟ attributes — ⊟ grp sidccmd:Sensor Capability Base Attributes — any ##other ⟨anyAttribute⟩ |
| 520 — Attributes | ⟨Sensor Capability base attributes⟩ ⟨anyAttribute⟩ | |
| 530 — Source | ⟨!-- ############################################ --⟩<br>⟨!-- Sensor Capability base type --⟩<br>⟨!-- ############################################ --⟩<br>⟨complexType name="SensorCapabilityBaseType" abstract="true"⟩<br>  ⟨complexContent⟩<br>    ⟨extension base="dia:TerminalCapabilityBaseType"⟩<br>      ⟨attributeGroup ref="cid:SensorCapabilityBaseAttributes"/⟩<br>    ⟨/extension⟩<br>  ⟨/complexContent⟩<br>⟨/complexType⟩ | |

| | 600 |
|---|---|
| 610 Diagram | ⊟ grp sidccmd:Sensor Capability Base Attributes<br>601 — unit<br>602 — maxValue<br>603 — minValue<br>604 — offset<br>605 — numOflevels<br>606 — sensitivity<br>607 — SNR<br>608 — accuracy |
| 620 Attributes | <unit><maxValue><minValue><offset><numOflevels><sensitivity><SNR><accuracy> |
| 630 Source | <!-- ################################################# --><br><!-- Definition of SDC Base Attributes --><br><!-- ################################################# --><br><attributeGroup name="SensorCapabilityBaseAttributes"><br>  <attribute name="unit" type="cid:unitType" use="optional"/><br>631 — <attribute name="maxValue" type="float" use="optional"/><br>632 — <attribute name="minValue" type="float" use="optional"/><br>  <attribute name="offset" type="float" use="optional"/><br>633 — <attribute name="numOflevels" type="nonNegativeInteger" use="optional"/><br>  <attribute name="sensitivity" type="float" use="optional"/><br>  <attribute name="SNR" type="float" use="optional"/><br>  <attribute name="accuracy" type="float" use="optional"/><br></attributeGroup> |

FIG. 16

| | 800 |
|---|---|
| Diagram | SensorAdaptation PreferenceBaseType — [attributes — grp sidccmd:SensorAdaptation PreferenceBaseAttributes; any ##other] |
| Attributes | <SensorAdaptationPreferenceBaseAttributes><anyAttribute> |
| Source | `<!-- ############################################# -->`<br>`<!-- Sensor Preference base type               -->`<br>`<!-- ############################################# -->`<br>`<complexType name="SensorAdaptationPreferenceBaseType" abstract="true">`<br>`  <complexContent>`<br>`    <extension base="dia:UserCharacteristicBaseType">`<br>`      <attributeGroup ref="cid:SensorAdaptationPrefBaseAttributes"/>`<br>`      <anyAttribute namespace="##other" processContents="lax"/>`<br>`    </extension>`<br>`  </complexContent>`<br>`</complexType>` |

810 — Diagram
820 — Attributes
830 — Source

FIG. 17

| | |
|---|---|
| Diagram 910 | grp sidccmd:SensorAdaptationPreferenceBaseAttributes<br>901 — SensorIdRef<br>902 — SensorAdaptationMode<br>903 — activate<br>904 — unit<br>905 — maxValue<br>906 — minValue<br>907 — numOflevels |
| Attributes 920 | \<SensorIdRef\>\<SensorAdaptationMode\>\<activate\>\<unit\>\<maxValue\>\<minValue\>\<numOflevels\> |
| Source 930 | \<!-- ############################### --\><br>\<!-- SensorAdaptation Preference Base Attributes --\><br>\<!-- ############################### --\><br>\<attributeGroup name="SensorAdaptationPrefBaseAttributes"\><br>  \<attribute name="SensorIdRef" type="anyURI" use="optional"/\><br>  \<attribute name="SensorAdaptationMode" type="cid:adaptationModeType" use="optional"/\><br>931 — \<attribute name="activate" type="boolean" use="optional"/\><br>932 — \<attribute name="maxValue" type="float" use="optional"/\><br>933 — \<attribute name="minValue" type="float" use="optional"/\><br>934 — \<attribute name="numOflevels" type="nonNegativeInteger" use="optional"/\><br>\</attributeGroup\><br>\<simpleType name="adaptationModeType"\><br>  \<restriction base="string"\><br>    \<enumeration value="strict"/\><br>    \<enumeration value="scalable"/\><br>  \</restriction\><br>\</simpleType\> |

900

APPARATUS AND METHOD FOR PROCESSING VIRTUAL WORLD

CROSS-REFERENCE TO RELATED APPLICATIONS

This application is a U.S. National Stage application of PCT/KR2011/002319 filed Apr. 4, 2011 and claims the foreign priority benefit of Korean Application No. 10-2010-0031030 filed Apr. 5, 2010 in the Korean Intellectual Property Office, the contents of each of which are incorporated herein by reference.

BACKGROUND

1. Field

Example embodiments of the following disclosure relate to a method and apparatus for processing a virtual world, and more particularly, to a method and apparatus for applying information of a real world to a virtual world.

2. Description of the Related Art

Currently, consumers have been gaining an interest in experience-type games. MICROSOFT CORPORATION introduced PROJECT NATAL at the "E3 2009" Press Conference. PROJECT NATAL may provide a user body motion capturing function, a face recognition function, and a voice recognition function by combining MICROSOFT's XBOX 360 game console with a separate sensor device including a depth/color camera and a microphone array, thereby enabling a user to interact with a virtual world without a dedicated controller. In addition, SONY CORPORATION introduced WAND which is an experience-type game motion controller. The WAND enables interaction with a virtual world through input of a motion trajectory of a controller by applying, to the SONY PLAYSTATION 3 game console, a location/direction sensing technology obtained by combining a color camera, a marker, and an ultrasonic sensor.

The interaction between a real world and a virtual world operates in one of two directions. In one direction, data information obtained by a sensor in the real world may be reflected to the virtual world. In the other direction, data information obtained from the virtual world may be reflected to the real world using an actuator. Example embodiments provide a control system, control method, and commanding structure for applying data obtained by a sensor of a real world to a virtual world, so as to achieve interaction between the real world and the virtual world.

SUMMARY

According to an aspect of the present disclosure, there is provided a virtual world processing apparatus including a sensor to encode information on sensor capability into first metadata; an adaptation virtual world to real world (VR) unit to encode information on a virtual world into second metadata; and an adaptation real world to virtual world (RV) unit to generate information to be applied to the virtual world based on the first metadata and the second metadata and to encode the generated information into third metadata.

According to another aspect of the present invention, there is provided a virtual world processing method including encoding information on sensor capability into first metadata; encoding information on a virtual world into second metadata; generating information to be applied to the virtual world based on the first metadata and the second metadata; and encoding the generated information into third metadata.

BRIEF DESCRIPTION OF THE DRAWINGS

These and/or other aspects and advantages will become apparent and more readily appreciated from the following description of the embodiments, taken in conjunction with the accompanying drawings of which:

FIG. 13 illustrates syntax of a sensor capability base type, according to example embodiments;

FIG. 14 illustrates syntax of sensor capability base attributes, according to example embodiments;

FIG. 16 illustrates syntax of a sensor adaptation preference base type, according to example embodiments;

FIG. 17 illustrates syntax of sensor adaptation preference base attributes, according to example embodiments;

DETAILED DESCRIPTION

Figure 1:
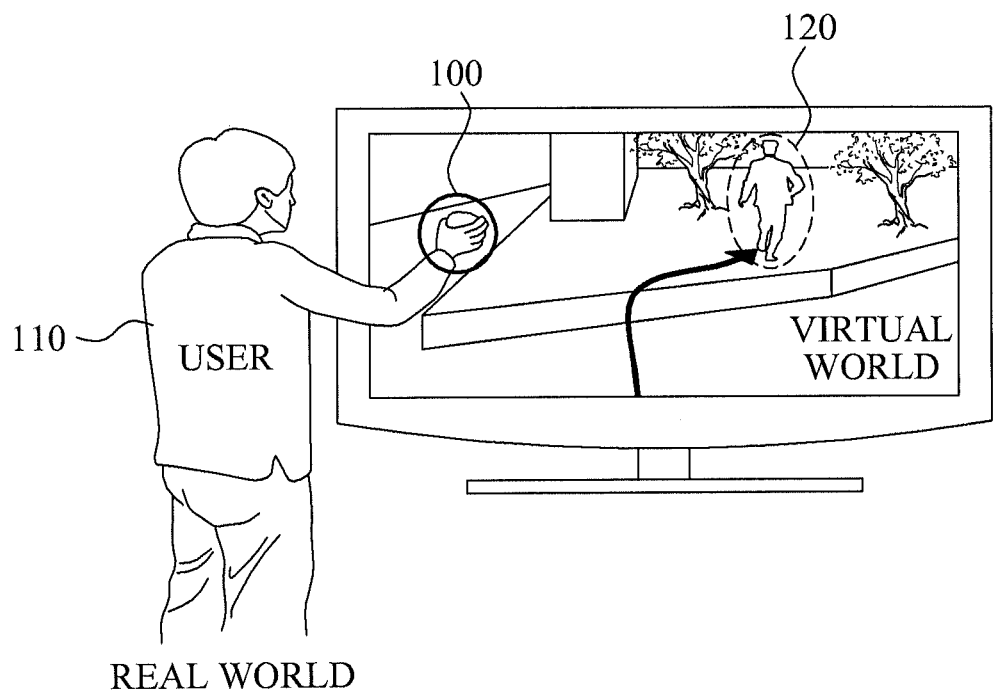
FIG. 1 illustrates an operation of manipulating an object of a virtual world using a sensor in the real world, according to example embodiments.

Reference will now be made in detail to embodiments of the present disclosure, examples of which are illustrated in the accompanying drawings, wherein like reference numerals refer to the like elements throughout. The embodiments are described below in order to explain the present disclosure by referring to the figures.

A term 'object' used herein may include an object, an avatar, and the like, implemented in a virtual world.

Hereinafter, example embodiments will be described in detail with reference to the accompanying drawings.

FIG. 1 illustrates an operation of manipulating an object 120 of a virtual world using a sensor 100 in the real world, according to example embodiments.

Referring to FIG. 1, a user 110 of a real world may manipulate the object 120 of a virtual world, using the sensor 100 in the real world. The user 110 of the real world may input his or her movement, state, intention, shape, and the like using the sensor 100. The sensor 100 may transmit a sensor signal including control information (CI) on the movement, state, intention, shape, and the like, to the virtual world processing apparatus.

Depending on embodiments, the user 110 of the real world may include a human being, an animal, a plant, and an inanimate matter such as an object, and even environments of the user 110.

Figure 2:
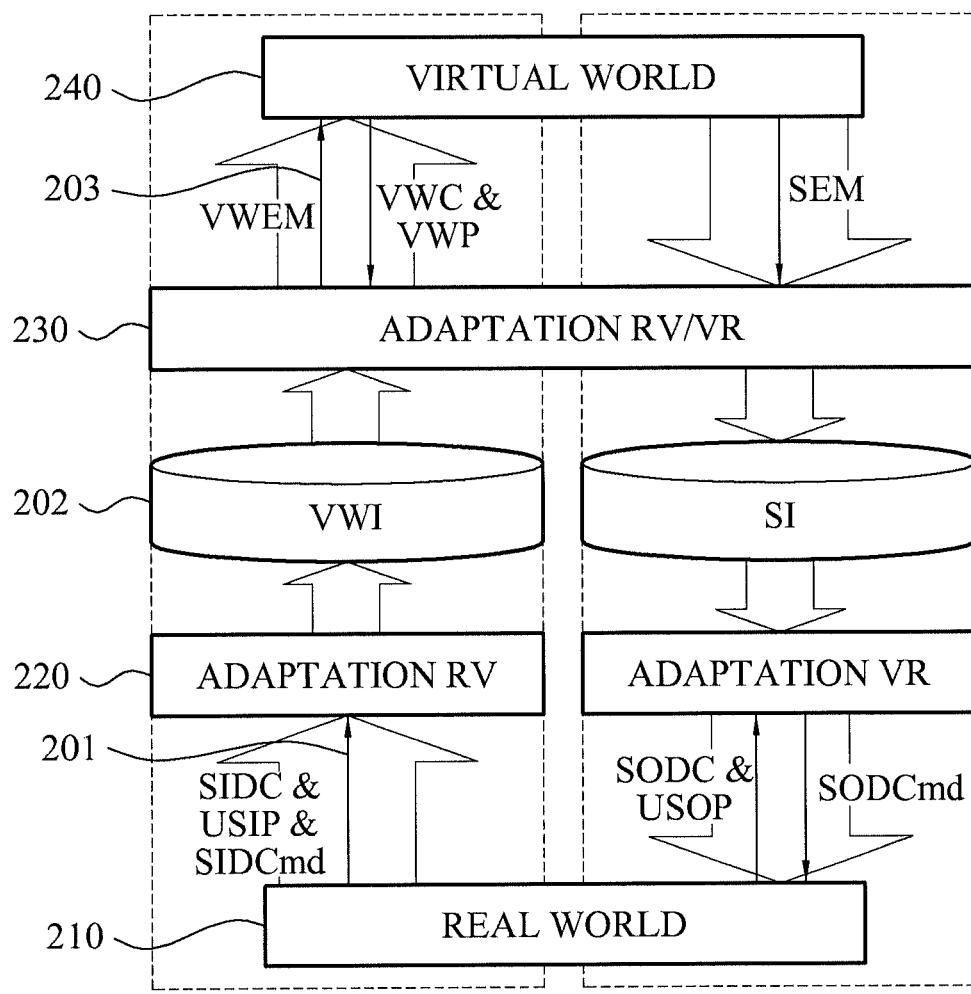
FIG. 2 illustrates a system manipulating an object of a virtual world using a sensor in the real world, according to example embodiments.

FIG. 2 illustrates a system that manipulates an object of a virtual world using a sensor in the real world, according to example embodiments.

Referring to FIG. 2, a sensor signal including CI 201 related to a movement, state, intention, shape, and the like of a user of a real world 210 may be input through a sensor, which is a device of the real world 210, and transmitted to a virtual world processing apparatus. Depending on embodiments, the CI 201 related to the movement, state, intention, shape, and the like of the user of the real world 210 may include sensor capability, sensor adaptation preference, and sensed information, which will be described in details with reference to FIGS. 12 to 21.

The virtual world processing apparatus may include an adaptation real world to virtual world (RV) 220. Depending on embodiments, the adaptation RV 220 may be implemented by an RV engine. The adaptation RV 220 may convert information on the real world 210 into information applicable to a virtual world 240, using the CI 201 related to the movement, state, intention, shape, and the like, of the user of the real world 210 and included in the sensor signal.

Depending on embodiments, the adaptation RV 220 may convert virtual world information (MI) 202 using the CI 201 related to the movement, state, intention, shape, and the like of the user of the real world 210.

The VWI 202 may denote information on the virtual world 240. For example, the VWI 202 may include information on an object of the virtual world 240 or elements constituting the object.

The virtual world processing apparatus may transmit the converted information 203 converted by the adaptation RV 220 to the virtual world 240, through an adaptation RV/virtual world to real world (RV/VR) 230.

Table 1 illustrates structures shown in FIG. 2.

TABLE 1

| SIDC | Sensory input device capabilities. Another expression of Sensor capability. | VWI | Virtual world information |
|---|---|---|---|
| USIP | User sensory input preferences. Another expression of sensor adaptation preference. | SODC | Sensory output device capabilities |
| SIDCmd | Sensory input device commands. Another expression of Sensed information. | USOP | User sensory output preferences |
| VWC | Virtual world capabilities | SODCmd | Sensory output device commands |
| VWP | Virtual world preferences | SEM | Sensory effect metadata |
| VWEM | Virtual world effect metadata | SI | Sensory information |

Figure 3:
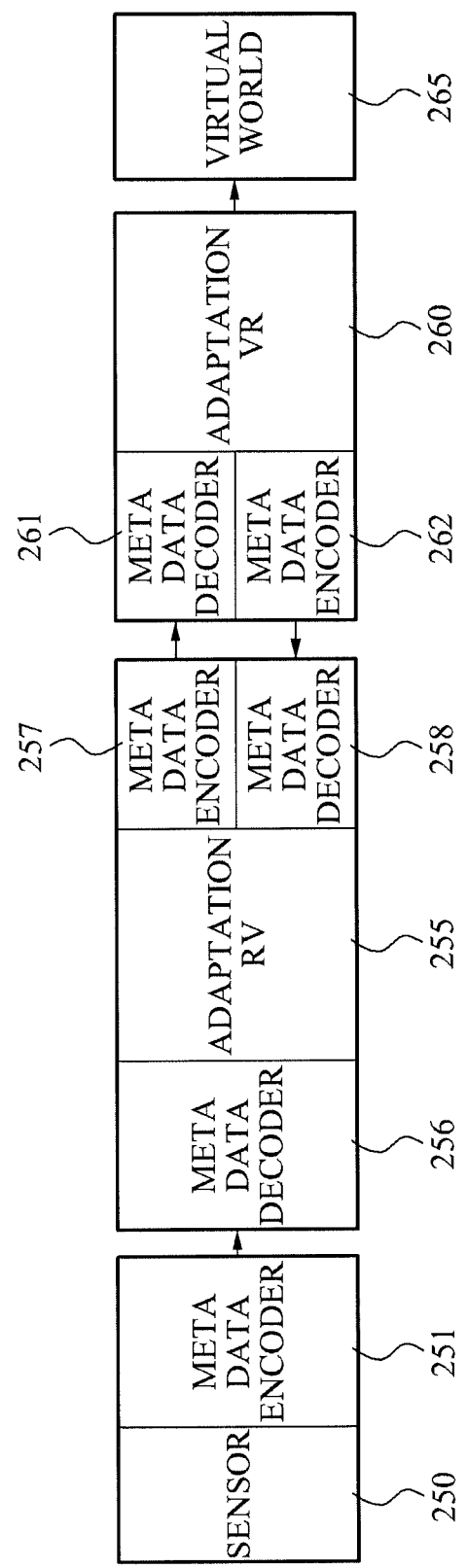
FIG. 3 illustrates a virtual world processing apparatus manipulating an object of a virtual world using a sensor in the real world, according to other example embodiments.

FIG. 3 illustrates a virtual world processing apparatus manipulating an object of a virtual world using a sensor according to other example embodiments.

Referring to FIG. 3, the virtual world processing apparatus 200 may include a sensor 250, an adaptation RV unit 255, and an adaptation VR unit 260.

The sensor 250 may collect information on the movement, state, intention, shape, and the like, of a user 110 of a real world 210. The information collected by the sensor 250 may include sensed information.

Depending on embodiments, the sensor 250 may include an input unit. The input unit may be input with sensor adaptation preference by the user of the real world.

The sensor 250 may encode information on sensor capability into first metadata, and transmit the first metadata to the adaptation RV unit 255.

The sensor 250 according to example embodiments may generate the first metadata by encoding the information on sensor capability into a binary format using the metadata encoder 251. The first metadata encoded into the binary format may include binary encoding syntax, a number of bits of attributes of the binary encoding syntax, and a type of the attributes of the binary encoding syntax. The sensor 250 may transmit the first metadata encoded into the binary format to the adaptation RV unit 255.

In addition, the sensor 250 may generate the first metadata by encoding the information on sensor capability into an eXtensible Markup Language (XML) format using the metadata encoder 251. The sensor 250 may transmit the first metadata encoded into the XML format to the adaptation RV unit 255.

The sensor 250 may generate the first metadata by encoding the information on sensor capability into the XML format and then encoding the information encoded into the XML format into a binary format. The sensor 250 may transmit the first metadata encoded into the binary format to the adaptation RV unit 255.

In addition, the sensor 250 may encode information collected from the real world into fourth metadata, and transmit the fourth metadata to the adaptation RV unit 255.

According to example embodiments, the sensor 250 may generate the fourth metadata by encoding the information collected from the real world into the binary format. Here, the fourth metadata encoded into the binary format may include the binary encoding syntax, the number of bits of the attributes of the binary encoding syntax, and the type of the attributes of the binary encoding syntax. The sensor 250 may transmit the first metadata encoded into the binary format to the adaptation RV unit 255.

The sensor 250 may generate the fourth metadata by encoding the information collected from the real world into the XML format. The sensor 250 may transmit the fourth metadata encoded into the XML format to the adaptation RV unit 255.

The sensor 250 may generate the fourth metadata by encoding the information collected from the real world into the XML format and encoding the information encoded into the XML format into the binary format. The sensor 250 may transmit the fourth metadata encoded into the binary format to the adaptation RV unit 255.

Depending on embodiments, the sensor 250 may include a metadata encoder 251.

The metadata encoder 251 may encode the information on the sensor capability into the first metadata. In this case, the sensor 250 may transmit the first metadata to the adaptation RV unit 255.

In addition, the metadata encoder 251 may encode the information collected from the real world into the fourth metadata.

A metadata decoder 256 included in the adaptation RV unit 255 may decode the first metadata received from the sensor 250.

Depending on embodiments, the metadata encoder 251 may include at least one of an XML encoder that encodes the information on the sensor capability or the information collected from the real world into data of the XML format and a binary encoder that encodes the foregoing information into data of the binary format.

Depending on embodiments, the metadata decoder 256 may include at least one of an XML decoder that decodes received data of the XML format or a binary decoder that decodes received data of the binary format.

Hereinafter, referring to FIG. 3, a description will be made about example embodiments in which the sensor 250 encodes the information on the sensor capability and example embodiments in which the adaptation RV unit 255 decodes received data.

Figure 4:
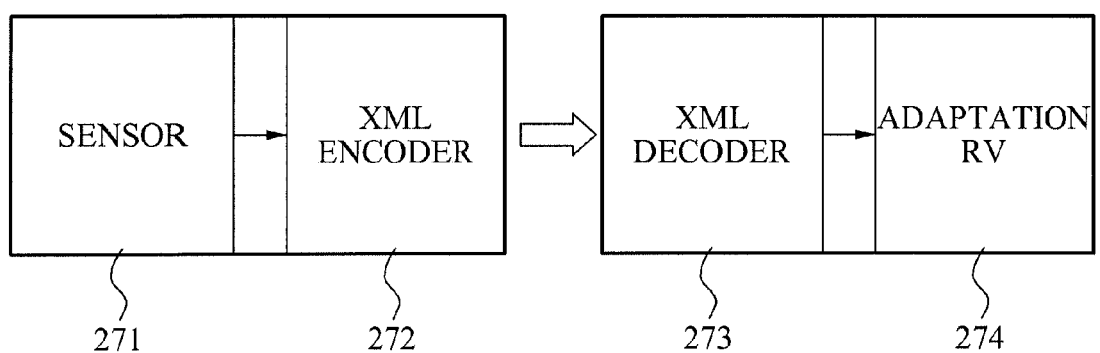
FIGS. 4 to 6 illustrate a sensor and an adaptation real world to virtual world (RV) unit, according to example embodiments.
Figure 5:
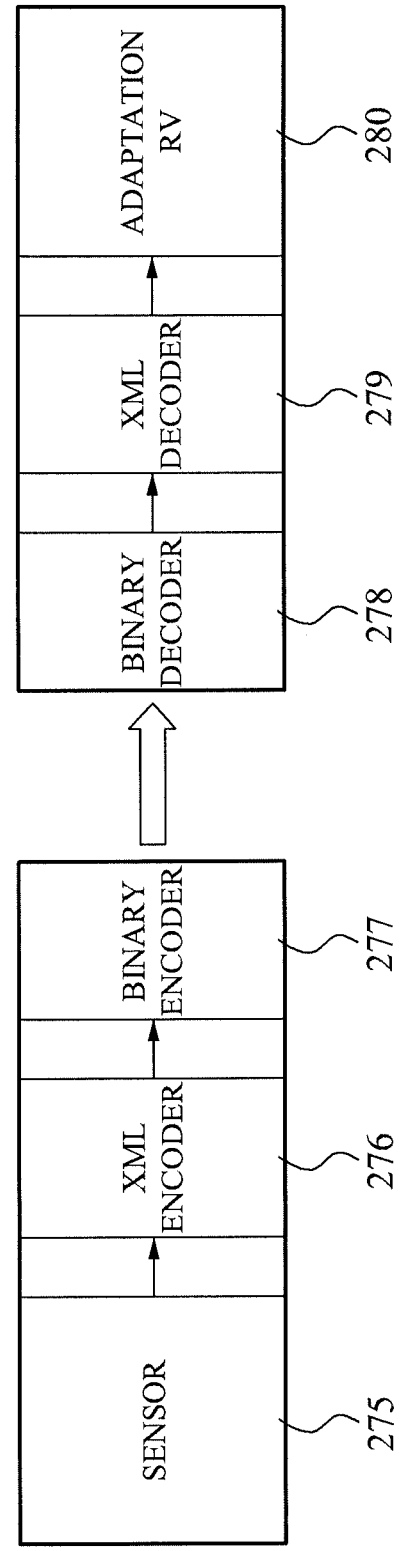
Figure 6:
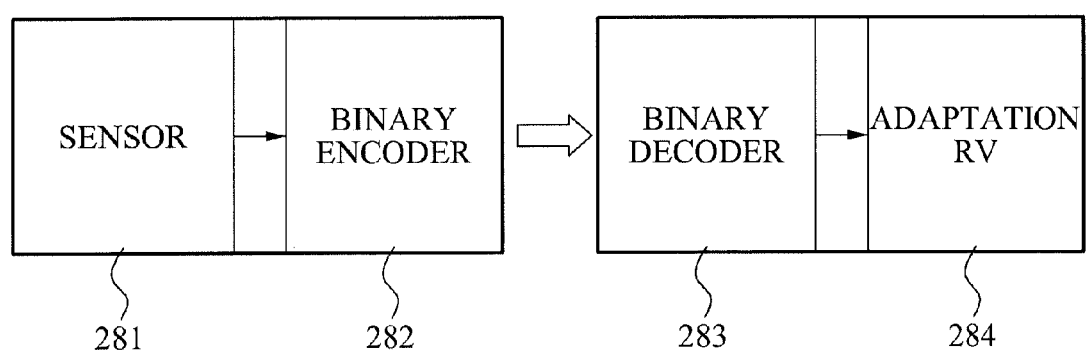

FIGS. 4 to 6 illustrate a sensor and an adaptation RV unit, according to example embodiments.

Referring to FIG. 4, a sensor 271 according to an embodiment may include an XML encoder 272. The XML encoder 272 may encode information on sensor capability of the sensor 271 into metadata of the XML format. The XML encoder 272 may encode information collected from the real world, for example sensed information, into metadata of the XML format.

In addition, the sensor 271 may transmit the metadata encoded by the XML encoder 272 to an adaptation RV unit 274.

The adaptation RV unit 274 may include an XML decoder 273. The XML decoder 273 may decode the metadata received from the sensor 271.

Referring to FIG. 5, a sensor 275 according to an embodiment may include an XML encoder 276 and a binary encoder 277. The XML encoder 276 may encode information on sensor capability of the sensor 275 into the XML format. Additionally, the XML encoder 276 may encode information collected from the real world, for example sensed information, into the XML format.

The binary encoder 277 may encode the data encoded by the XML encoder 276 into metadata of the binary format.

The sensor 275 may transmit the metadata encoded by the XML encoder 276 and the binary encoder 277 to an adaptation RV unit 280.

The adaptation RV unit 280 may include a binary decoder 278 and an XML decoder 279. The binary decoder 278 may decode the metadata received from the sensor 275. The XML decoder 279 may decode again the data decoded into the XML format by the binary decoder 278.

Referring to FIG. 6, a sensor 281 according to an example embodiment may include a binary encoder 282. The binary encoder 282 may encode information on sensor capability of the sensor 271 into metadata of the binary format. Additionally, the binary encoder 282 may encode information collected from the real world by the sensor 281, for example, sensed information, into the binary format.

In addition, the sensor 281 may transmit the metadata encoded by the binary encoder 282 to an adaptation RV unit 284.

The adaptation RV unit 284 may include a binary decoder 283. The binary decoder 283 may decode the metadata received from the sensor 281.

Referring back to FIG. 3, the adaptation VR unit 260 may encode information on a virtual world 265 into second metadata.

The adaptation VR unit 260 may generate second metadata by encoding the information on the virtual world 265 into the binary format. Here, the second metadata encoded into the binary format may include binary encoding syntax, a number of bits of attributes of the binary encoding syntax, and a type of the attributes of the binary encoding syntax. The adaptation VR unit 260 may transmit the second metadata encoded into the binary format to the adaptation RV unit 255.

In addition, the adaptation VR unit 260 may generate the second metadata by encoding information collected from the virtual world 265 into the XML format and encoding the information encoded into the XML format into the binary format. The adaptation VR unit 260 may transmit the second metadata encoded into the binary format to the adaptation RV unit 255.

Depending on embodiments, the adaptation VR unit 260 may include a metadata encoder 262. The metadata encoder 262 may encode the information on the virtual world 265 into the second metadata.

Depending on embodiments, the metadata encoder 262 may include at least one of an XML encoder that encodes the information on the virtual world 265 into metadata of the XML format and a binary encoder that encodes the information on the virtual world 265 into metadata of the binary format.

Depending on embodiments, the metadata encoder 262 may include the XML encoder which encodes the information on the virtual world 265 into data of the XML format.

The metadata encoder 262 may further include the XML encoder and the binary encoder. The XML encoder may encode the information on the virtual world 265 into the data of the XML format. The binary encoder may encode the data of the XML format back to data of the binary format.

In addition, the metadata encoder 262 may include the binary encoder which encodes the information on the virtual world 265 into data of the binary format.

The adaptation RV unit 255 may generate information to be applied to the virtual world 265, based on first metadata encoded from the information on sensor capability received from the sensor 250 and second metadata encoded from the information on the virtual world received from the adaptation VR unit 260. Here, the adaptation RV unit 255 may encode the generated information into third metadata.

Depending on embodiments, the adaptation RV unit 255 may generate the information to be applied to the virtual world 265, based on the first metadata encoded from the information on sensor capability received from the sensor 250, the fourth metadata encoded from the information collected from the real world, for example the sensed information, and the second metadata encoded from the information on the virtual world 265. In this instance, the adaptation RV unit 255 may encode the generated information into the third metadata.

Depending on embodiments, the adaptation RV unit 255 may include a metadata decoder 256, a metadata decoder 258, and a metadata encoder 257.

The adaptation RV unit 255 may generate the information to be applied to the virtual world 265, based on information decoded from the first metadata and information decoded from the second metadata by the metadata decoder 258. That is, the adaptation RV unit 255 may generate the information to be applied to the virtual world 265 to correspond to virtual world object characteristics included in the second metadata and the sensed information.

Depending on embodiments, the adaptation RV unit 255 may generate the information to be applied to the virtual world 265, based on the information decoded from the first metadata by the metadata decoder 256, that is, the information on sensor capability, the information decoded from the fourth metadata, that is, the sensed information, and the information decoded from the second metadata by the metadata decoder 258, that is, the information on the virtual world 265. Here, the adaptation RV unit 255 may generate the information to be applied to the virtual world 265 to correspond to the virtual world object characteristics included in the second metadata and the sensed information.

The metadata encoder 257 may encode the information to be applied to the virtual world 265, which is generated by the adaptation RV unit 255, into the third metadata. In addition, the adaptation RV unit 255 may transmit the third metadata to the adaptation VR unit 260.

According to an aspect of the present disclosure, the adaptation VR unit 260 may include a metadata decoder 261. The metadata decoder 261 may decode the third metadata. The adaptation VR unit 260 may convert attributes of an object of the virtual world 265 based on the decoded information. Also, the adaptation VR unit 260 may apply the converted attributes to the virtual world 265.

The virtual world processing system may transmit the information on the virtual world 265 to an actuator of the real world to reflect the information on the virtual world 265 to the real world. Hereinafter, example embodiments to reflect the information on the virtual world 265 to the real world will be described in detail with reference to FIGS. 7 to 9.

Figure 7:
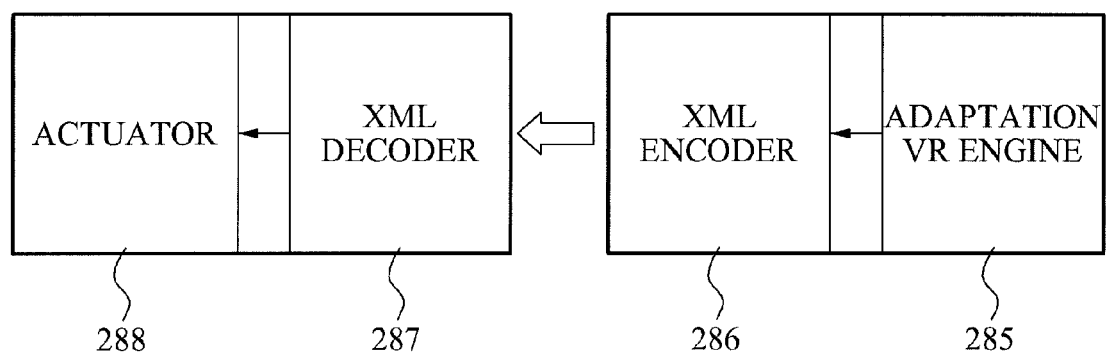
FIGS. 7 to 9 illustrate an adaptation VR engine and an actuator, according to example embodiments.
Figure 8:
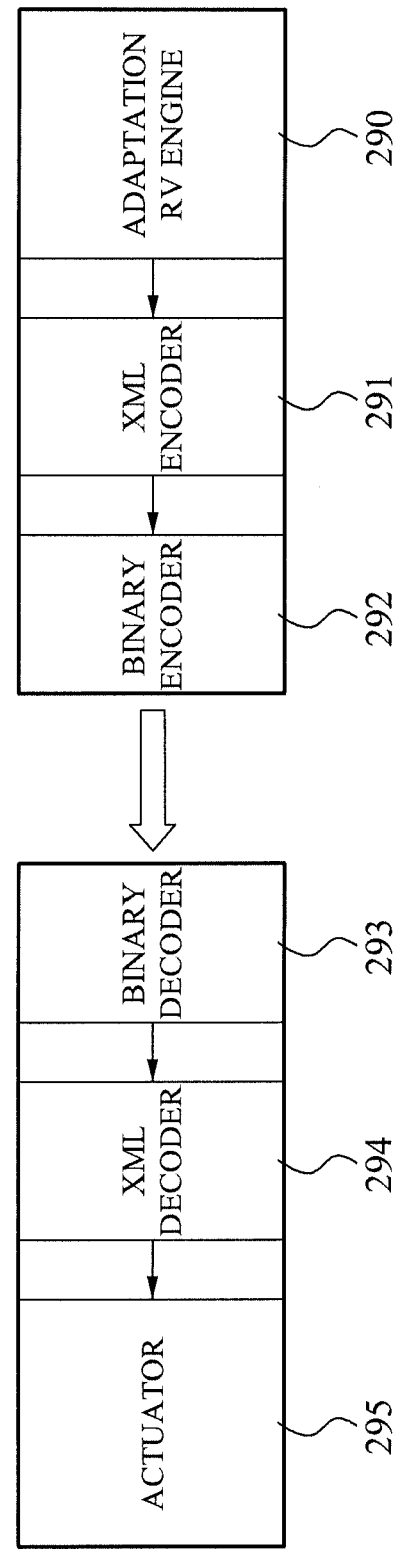
Figure 9:
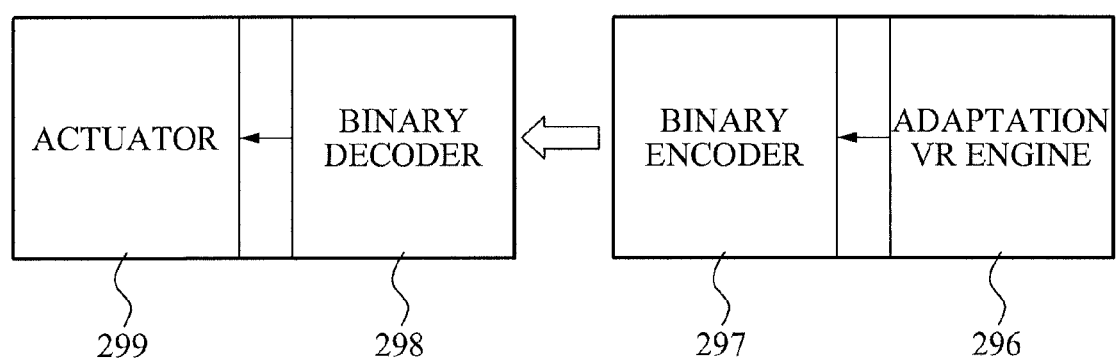

FIGS. 7 to 9 illustrate an adaptation VR engine and an actuator, according to example embodiments.

Referring to FIG. 7, an adaptation RV engine 285 may include an XML encoder 286. The adaptation VR engine 285, as an example embodiment of the adaptation RV unit 255 illustrated in FIG. 3, may transmit the information on the virtual world 265 to an actuator 288 of the real world so that the information on the virtual world 265 is reflected to the real world.

The adaptation VR unit 260 may collect information on change in the attributes of the object and transmit the collected information to the adaptation VR engine 285. The adaptation VR engine 285 may include an XML encoder 286. The XML encoder 286 may encode the received information on the virtual world 265 into data of the XML format. In addition, the adaptation VR engine 285 may transmit the data encoded by the XML encoder 286 to the actuator 288.

The actuator 288 may include an XML decoder 287. The XML decoder 287 may decode the data of the XML format received from the adaptation VR engine 285.

The actuator 288 may operate in response to the information decoded by the XML decoder 287.

Referring to FIG. 8, an adaptation VR engine 290 may include an XML encoder 291 and a binary encoder 292.

The adaptation VR unit 290 may collect information on a change in attributes of an object of the virtual world 265 and transmit the collected information to the adaptation VR engine 290. The adaptation VR engine 290 may include the XML encoder 291 and the binary encoder 292. The XML encoder 291 may encode the received information on the virtual world 265 into data of the XML format. The binary encoder 292 may encode the data encoded by the XML encoder 291 back to data of the binary format. In addition, the adaptation VR engine 290 may transmit the data encoded by the binary encode 292 to an actuator 295.

The actuator 295 may include a binary decoder 293 and an XML decoder 294. The binary decoder 293 may decode the data of the binary format received from the adaptation VR engine 290 into the data of the XML format. The XML decoder 294 may decode the data decoded into the XML format by the binary decoder 293.

The actuator 295 may operate in response to the information decoded by the XML decoder 294.

Referring to FIG. 9, the adaptation VR engine 296 may include a binary encoder 297.

The adaptation VR unit 260 may collect information on change in attributes of an object of the virtual world 265 and transmit the collected information to the adaptation VR engine 296. The adaptation VR engine 296 may include a binary encoder 297. The binary encoder 297 may encode the received information on the virtual world 265 into data of the binary format. In addition, the adaptation VR engine 296 may transmit the data encoded by the binary encoder 297 to an actuator 299.

The actuator 299 may include a binary decoder 298. The binary decoder 298 may decode the data of the binary format received from the adaptation VR engine 296.

The actuator 299 may operate in response to the information decoded by the binary decoder 298.

Figure 10:
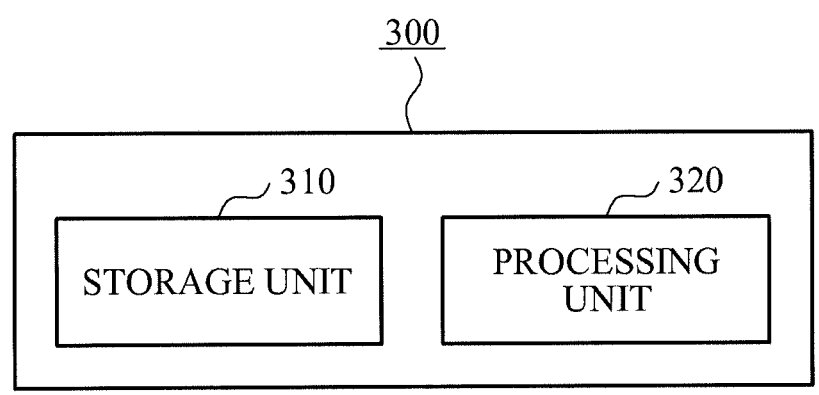
FIG. 10 illustrates a structure of a virtual world processing apparatus, according to example embodiments.

FIG. 10 illustrates a structure of a virtual world processing apparatus 300, according to example embodiments.

Referring to FIG. 10, the virtual world processing apparatus 300 may include a storage unit 310 and a processing unit 320.

The storage unit 310 may store sensor capability related to a sensor in the real world, for example, sensor 250.

The sensor refers to a device to measure a movement, state, intention, shape, and the like of a user of a real world. The sensor may be implemented by a sensory input device. Depending on embodiments, the sensor may be classified based on sensor types including (1) acoustic, sound, vibration, (2) automotive, transportation, (3) chemical, (4) electric current, electric potential, magnetic, radio, (5) environment, weather, (6) flow, (7) ionizing radiation, subatomic particles, (8) navigation instruments, (9) position, angle, displacement, distance, speed, acceleration, (10) optical, light, imaging, (11) pressure, force, density, level, (12) thermal, heat, temperature, (13) proximity, presence, and (14) sensor technology.

Table 2 shows example embodiments of the sensor according to the sensor types. However, the sensors introduced in Table 2 are only example embodiments, and thus, the present disclosure is not limited thereto.

TABLE 2

| sensor type | list of sensors |
|---|---|
| (1) acoustic, sound, vibration | Geophone<br>Hydrophone<br>lace sensor, a guitar pickup<br>Microphone<br>Seismometer<br>Accelerometer |
| (2) automotive, transportation | crank sensor<br>curb feeler<br>defect detector<br>map sensor<br>parking sensors<br>Parktronic<br>radar gun<br>Speedometer<br>speed sensor<br>throttle position sensor<br>variable reluctance sensor<br>wheel speed sensor |
| (3) chemical | Breathalyzer<br>carbon dioxide sensor<br>carbon monoxide detector<br>catalytic bead sensor<br>chemical field-effect transistor<br>electronic nose<br>electrolyte-insulator-semiconductor sensor<br>hydrogen sensor<br>infrared point sensor |

TABLE 2-continued

| sensor type | list of sensors |
|---|---|
| | ion-selective electrode |
| | nondispersive infrared sensor |
| | microwave chemistry sensor |
| | nitrogen oxide sensor |
| | Optode |
| | oxygen sensor |
| | Pellistor |
| | pH glass electrode |
| | potentiometric sensor |
| | redox electrode |
| | smoke detector |
| | zinc oxide nanorod sensor |
| (4) electric current, electric potential, magnetic, radio | Ammeter |
| | current sensor |
| | Galvanometer |
| | hall effect sensor |
| | hall probe |
| | leaf electroscope |
| | magnetic anomaly detector |
| | Magnetometer |
| | metal detector |
| | Multimeter |
| | Ohmmeter |
| | Voltmeter |
| | watt-hour meter |
| (5) environment, weather | fish counter |
| | gas detector |
| | Hygrometer |
| | Pyranometer |
| | Pyrgeometer |
| | rain gauge |
| | rain sensor |
| | Seismometers |
| (6) flow | air flow meter |
| | flow sensor |
| | gas meter |
| | mass flow sensor |
| | water meter |
| (7) ionizing radiation, subatomic particles | bubble chamber |
| | cloud chamber |
| | geiger counter |
| | neutron detection |
| | particle detector |
| | scintillation counter |
| | Scintillator |
| | wire chamber |
| (8) navigation instruments | air speed indicator |
| | Altimeter |
| | attitude indicator |
| | fluxgate compass |
| | Gyroscope |
| | inertial reference unit |
| | magnetic compass |
| | MHD sensor |
| | ring laser gyroscope |
| | turn coordinator |
| | Variometer |
| | vibrating structure gyroscope |
| | yaw rate sensor |
| (9) position, angle, displacement, distance, speed, acceleration | Accelerometer |
| | Inclinometer |
| | laser rangefinder |
| | linear encoder |
| | linear variable differential transformer (LVDT) |
| | liquid capacitive inclinometers |
| | Odometer |
| | piezoelectric accelerometer |
| | position sensor |
| | rotary encoder |
| | rotary variable differential transformer |
| | Selsyn |
| | Tachometer |
| (10) optical, light, imaging | charge-coupled device |
| | Colorimeter |
| | infra-red sensor |
| | LED as light sensor |
| | nichols radiometer |
| | fiber optic sensors |
| | Photodiode |
| | photomultiplier tubes |
| | Phototransistor |
| | photoelectric sensor |
| | photoionization detector |
| | Photomultiplier |
| | Photoresistor |
| | Photoswitch |
| | Phototube |
| | proximity sensor |
| | Scintillometer |
| | shack-Hartmann wavefront sensor |
| (11) pressure, force, density, level | Anemometer |
| | Bhangmeter |
| | Barograph |
| | Barometer |
| | Hydrometer |
| | Level sensor |
| | Load cell |
| | magnetic level gauge |
| | oscillating U-tube |
| | pressure sensor |
| | piezoelectric sensor |
| | pressure gauge |
| | strain gauge |
| | torque sensor |
| | Viscometer |
| (12) thermal, heat, temperature | Bolometer |
| | Calorimeter |
| | heat flux sensor |
| | infrared thermometer |
| | Microbolometer |
| | microwave radiometer |
| | net radiometer |
| | resistance temperature detector |
| | resistance thermometer |
| | Thermistor |
| | Thermocouple |
| | Thermometer |
| (13) proximity, presence | alarm sensor |
| | bedwetting alarm |
| | motion detector |
| | occupancy sensor |
| | passive infrared sensor |
| | reed switch |
| | stud finder |
| | triangulation sensor |
| | touch switch |
| | wired glove |
| (14) sensor technology | active pixel sensor |
| | machine vision |
| | Biochip |
| | Biosensor |
| | capacitance probe |
| | catadioptric sensor |
| | carbon paste electrode |
| | displacement receiver |
| | electromechanical film |
| | electro-optical sensor |
| | image sensor |
| | inductive sensor |
| | intelligent sensor |
| | lab-on-a-chip |
| | leaf sensor |
| | RADAR |
| | sensor array |
| | sensor node |
| | soft sensor |
| | staring array |
| | Transducer |
| | ultrasonic sensor |
| | video sensor |

For example, the microphone belonging to a sensor type (1) acoustic, sound, and vibration may collect voice of the user of the real world and ambient sounds of the user. The speed sensor belonging to the sensor type (2) automotive and transportation may measure speed of the user of the real world and speed of an object, such as, a vehicle of the real world. The oxygen sensor belonging to the sensor type (3) chemical may measure an oxygen ratio in ambient air around the user of the real world and an oxygen ratio in liquid around the user of the real world. The metal detector belonging to the sensor type (4) electric current, electric potential, magnetic, and radio may detect metallic substances present in or around the user of the real world. The rain sensor belonging to the sensor type (5) environment and weather may detect whether it is raining in the real world. The flow sensor belonging to the sensor type (6) flow may measure a ratio of a fluid flow of the real world. The scintillator belonging to the sensor type (7) ionizing radiation and subatomic particles may measure a ratio or radiation present in or around the user of the real world. The variometer belonging to the sensor type (8) navigation instruments may measure a vertical movement speed of or around the user of the real world. The odometer belonging to the sensor type (9) position, angle, displacement, distance, speed, and acceleration may measure a traveling distance of an object of the real world, such as a vehicle. The phototransistor belonging to the sensor type (10) optical, light, and imaging may measure light of the real world. The barometer belonging to the sensor type (11) pressure, force, density, and level may measure an atmospheric pressure of the real world. The bolometer belonging to the sensor type (12) thermal, heat, and temperature may measure radiation rays of the real world. The motion detector belonging to the sensor type (13) proximity and presence may measure a motion of the user of the real world. The biosensor belonging to the sensor type (14) may measure biological characteristics of the user of the real world.

Figure 11:
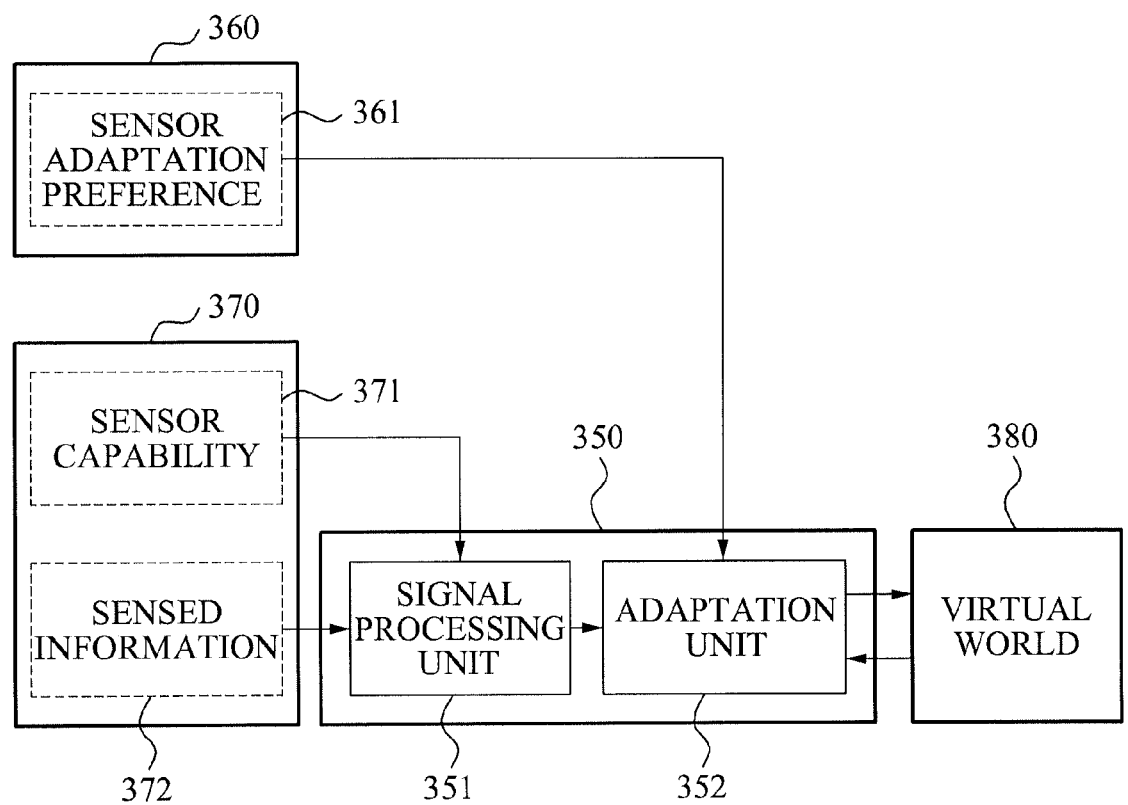
FIG. 11 illustrates a structure of a virtual world processing apparatus, according to other example embodiments.

FIG. 11 illustrates a structure of a virtual world processing apparatus 350, according to other example embodiments.

Referring to FIG. 11, an input device 360 may be input with sensor adaptation preference 361 from a user of a real world. Depending on embodiments, the input device 360 may be inserted in the form of a module in a sensor 370 or the virtual world processing apparatus 350. The sensor adaptation preference 361 will be described in further detail with reference to FIGS. 15 to 17.

The sensor 370 may transmit sensor capability 371 and sensed information 372 to the virtual world processing apparatus 350. The sensor capability 371 and the sensed information 372 will be described in further detail with reference to FIGS. 12 to 14 and 18.

The virtual world processing apparatus 350 may include a signal processing unit 351 and an adaptation unit 352.

The signal processing unit 351 may receive the sensor capability 371 and the sensed information 372 from the sensor 370, and perform signal processing with respect to the received sensor capability 371 and the sensed information 372. Depending on embodiments, the signal processing unit 351 may perform filtering and validation with respect to the sensor capability 371 and the sensed information 372.

The adaptation unit 352 may receive sensor adaptation preference 361 from the input device 360, and perform adaptation with respect to the information processed by the signal processing unit 351 based on the received sensor adaptation preference 361, so that the processed information is applied to a virtual world 380. Furthermore, the virtual world processing apparatus 350 may apply the information having undergone the adaptation by the adaptation unit 352 to the virtual world 380.

The sensor capability 371 refers to information on capability of the sensor 370.

The sensor capability base type may refer to a base type of the sensor capability. Depending on embodiments, the sensor capability base type may be a base abstract type of the metadata related to sensor capability commonly applied to all types of sensors, as part of metadata types related to the sensor capability.

Hereinafter, the sensor capability and the sensor capability base type will be described in detail with reference to FIGS. 12 to 14.

Figure 12:
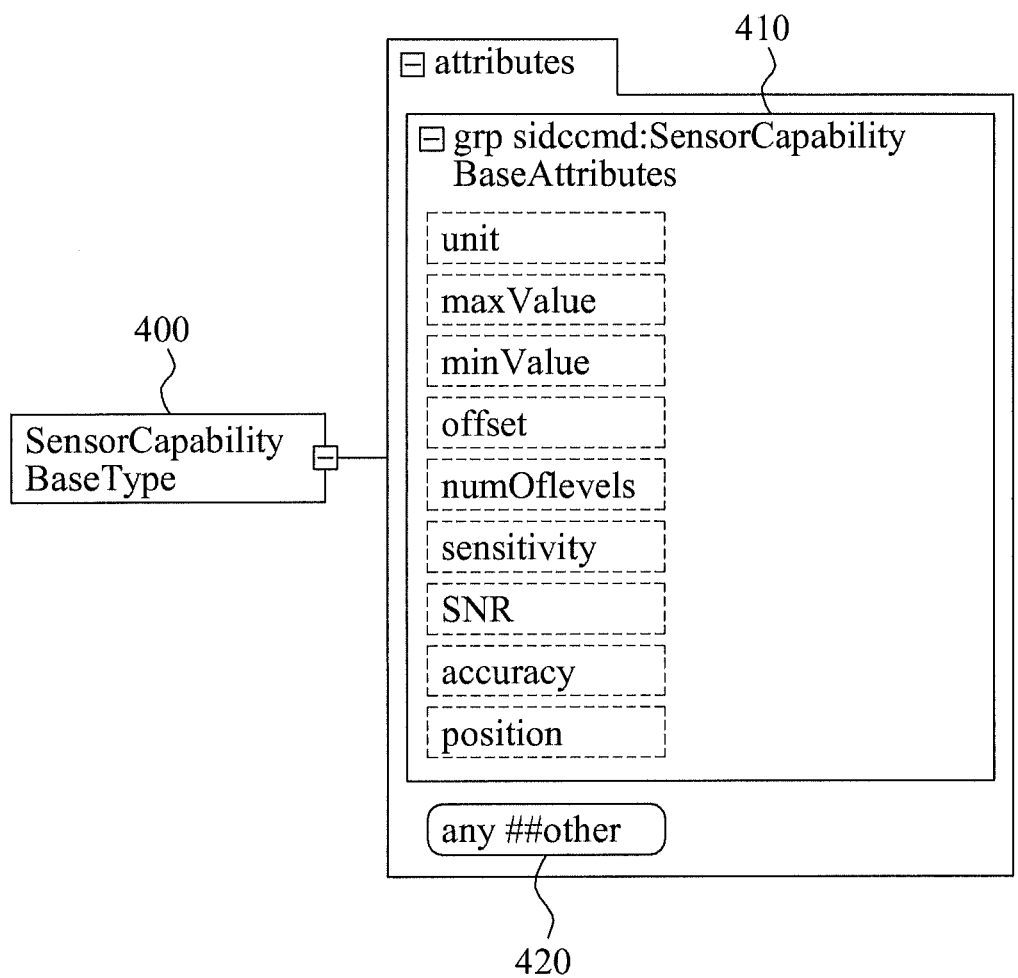
FIG. 12 illustrates a sensor capability base type, according to example embodiments.

FIG. 12 illustrates a sensor capability base type 400, according to example embodiments.

Referring to FIG. 12, the sensor capability base type 400 may include sensor capability base attributes 410 and any other attributes 420.

The sensor capability base attributes 410 denote a group of sensor capabilities basically included in the sensor capability base type 400.

The any other attributes 420 denote a group of additional sensor capabilities of a sensor. The any other attributes 420 may be unique additional sensor capabilities applicable to an arbitrary sensor. The any other attributes 420 may allow for the inclusion of any attributes defined within a namespace other than the target namespace.

FIG. 13 illustrates syntax 500 of a sensor capability base type 400, according to example embodiments.

Referring to FIG. 13, the syntax 500 of the sensor capability base type 400 may include a diagram 510, attributes 520, and a source 530.

The diagram 510 may include a diagram of the sensor capability base type 400.

The attributes 520 may include sensor capability base attributes and any attributes.

The source 530 may include a program representing the sensor capability base type 400 using an XML format. However, the source 530 shown in FIG. 13 is suggested by way of example, and thus, the present disclosure is not limited thereto.

Table 2-2 shows a source of a sensor capability base type, according to other example embodiments.

TABLE 2-2

```
<!-- ################################################## -->
<!-- Sensor Capability base type                        -->
<!-- ################################################## -->
<complexType name="SensorCapabilityBaseType" abstract="true">
    <complexContent>
        <extension base="dia:TerminalCapabilityBaseType">
            <sequence>
                <element name="Accuracy"
type="cidl:AccuracyType" minOccurs="0"/>
            </sequence>
            <attributeGroup
                ref="cidl:SensorCapabilityBaseAttributes"/>
        </extension>
    </complexContent>
</complexType>
<complexType name="AccuracyType" abstract="true">
    <complexContent>
        <restriction base="anyType"/>
    </complexContent>
</complexType>
<complexType name="PercentAccuracy">
    <complexContent>
        <extension base="cidl:AccuracyType">
            <attribute name="value"
                type="mpeg7:zeroToOneType"/>
        </extension>
    </complexContent>
</complexType>
<complexType name="ValueAccuracy">
    <complexContent>
```

TABLE 2-2-continued

```
<extension base="cidl:AccuracyType">
    <attribute name="value" type="float"/>
</extension>
</complexContent>
</complexType>
```

Table 2-3 shows binary representation syntax corresponding to the sensor capability base type, according to the example embodiments.

TABLE 2-3

| SensorCapabilityBaseType { | Number of bits | Mnemonic |
|---|---|---|
| AccuracyFlag | 1 | bslbf |
| TerminalCapabilityBase if(AccuracyFlag){ | | TerminalCapabilityBaseType |
| Accuracy } | | AccuracyType |
| SensorCapabilityBaseAttributes } | | SensorCapabilityBaseAttributesType |
| AccuracyType { | | |
| AccuracySelect | 2 | bslbf |
|   if(AccuracySelect==00){ | | |
|     PercentAccuracy | | mpeg7:zeroToOneType |
|   } else if (AccuracySelect==01) { | | |
|     ValueAccuracy | 32 | fsbf |
|   } | | |
| } | | |

Table 2-4 shows descriptor components semantics corresponding to the sensor capability base type, according to the example embodiments.

TABLE 2-4

| Names | Description |
|---|---|
| SensorCapabilityBaseType | SensorCapabilityBaseType extends dia: TerminalCapabilityBaseType and provides a base abstract type for a subset of types defined as part of the sensor device capability metadata types. For details of dia: TerminalCapabilityBaseType, refer to the Part 7 of ISO/IEC 21000. |
| AccuracyFlag | This field, which is only present in the binary representation, signals the presence of the activation attribute. A value of "1" means the attribute shall be used and "0" means the attribute shall not be used. |
| TerminalCapabilityBase | |
| Accuracy | Describes the degree of closeness of a measured quantity to its actual value in AccuracyType. |
| SensorCapabilityBaseAttributes | Describes a group of attributes for the sensor capabilities. |
| AccuracyType | Becomes a parent type providing a choice of describing the accuracy in either relative value or absolute value. |
| AccuracySelect | This field, which is only present in the binary representation, describes which accuracy scheme shall be used. "0" means that the PercentAccuracy type shall be used, and "1" means that the ValueAccuracy type shall be used. |
| PercentAccuracy | Describes the degree of closeness of a measured quantity to its actual value in a relative way using a value ranging from 0 to 1.0. |
| ValueAccuracy | Describes the degree of closeness of a measured quantity to its actual value in an absolute value of given unit. |

FIG. 14 illustrates syntax of sensor capability base attributes, according to example embodiments.

Referring to FIG. 14, the syntax 600 of the sensor capability base attributes may include a diagram 610, attributes 620, and a source 630.

The diagram 610 may include a diagram of the sensor capability base attributes.

The attributes 620 may include a unit 601, a maximum value (maxValue) 602, a minimum value 603 (minValue), an offset 604, a number of levels (numOflevels) 605, a sensitivity 606, a signal to noise ratio (SNR) 607, and an accuracy 608.

The unit 601 is a unit of the values that are measured by a sensor. Depending on embodiments, for example, when the sensor is a thermometer, the unit 601 may be Celsius (° C.) and Fahrenheit (° F.). When the sensor is a speed sensor, the unit 601 may be kilometers per hour (km/h) and meters per second (m/s).

The maxValue 602 and the minValue 603 denote a maximum value and a minimum value measurable by the sensor, respectively. Depending on embodiments, for example, when the sensor is a thermometer, the maxValue 602 may be 50° C. and the minValue 603 may be 0° C. Even in the same type of sensor, for example, the thermometer, the maxValue 602 and the minValue 603 may be varied according to use and function of the sensor. Accordingly, the present disclosure is not limited thereto.

The offset 604 denotes an offset value added to a value measured by the sensor to obtain an absolute value. Depending on embodiments, for example, presuming that the sensor is a speed sensor and a user or an object of a real world stays still, when a value other than zero is measured as speed, the sensor may determine the offset 604 to a value making the speed zero. For example, when −1 km/h is measured as speed of a vehicle of the real world, the offset 604 may be 1 km/h.

The numOflevels 605 denotes a number of values measurable by the sensor. Depending on embodiments, for example, presuming that the sensor is a thermometer and the maximum value and the minimum value are 50° C. and 0° C., respectively, when the numOflevels 605 is 5, the sensor may measure five values, that is, 10° C., 20° C., 30° C., 40° C., and 50° C. Even when temperature of the real world is 27° C., not only when 20° C., the temperature may be measured as 20° C. through round-down. Alternatively, in this case, the temperature may be measured as 30° C. through roundup.

The sensitivity 606 denotes a minimum input value required for the sensor to measure an output value. Depending on embodiments, for example, when the sensor is a thermometer and the sensitivity 606 is 1° C., the sensor may not measure a temperature change less than 1° C. but measure only the temperature change of at least 1° C. That is, the thermometer may measure integer values of temperature. For example, when the temperature in the real world increases from 15° C. to 15.5° C., the sensor may measure the temperature still as 15° C.

The SNR 607 denotes a relative degree of a signal measured by the sensor with respect to a noise. Depending on embodiments, presuming that the sensor is a microphone to measure and a vocal sound of the user of the real world, when an ambient noise is large, the SNR 607 of the sensor may be relatively small.

The accuracy 608 denotes an error of the sensor. Depending on embodiments, when the sensor is a microphone, the accuracy 608 may be a measurement error caused by variation of a propagation speed of a sound according to temperature, humidity, and the like. Alternatively, the accuracy 608 of the sensor may be determined through a statistical error of the values already measured by the sensor.

Depending on embodiments, the accuracy 608 may be expressed by two methods, which are a percent accuracy method and a value accuracy method.

The percent accuracy method may express the accuracy of the measured value with respect to an available measurement range. For example, the accuracy 608 may be expressed by values between 0 and 1.

The value accuracy method may express the accuracy 608 using a difference between the measured value and an actual value.

Depending on embodiments, the attributes 620 may further include a position. The position denotes a position of the sensor. For example, when the sensor is a thermometer, the position of the sensor may be an armpit of the user of the real world. The position may include longitude and latitude, and height and direction from a ground surface, however, the present disclosure is not limited thereto.

The unit 601, the maximum value 602, the minimum value 603, the offset 604, the number of levels 605, the sensitivity 606, the SNR 607, the accuracy 608, and the position, as the sensor capability base attributes, may be rearranged as shown in Table 3.

TABLE 3

| Name | Definition |
| --- | --- |
| Unit 601 | the unit of value |
| maxValue 602 | the maximum value that the input device (sensor) can provide. The terms will be different according to the individual device type. |

TABLE 3-continued

| Name | Definition |
| --- | --- |
| minValue 603 | the minimum value that the input device (sensor) can provide. The terms will be different according to the individual device type. |
| Offset 604 | the number of value locations added to a base value in order to get to a specific absolute value. |
| numOflevels 605 | the number of value levels that the device can provide in between maximum and minimum value. |
| Sensitivity 606 | the minimum magnitude of input signal required to produce a specified output signal. |
| SNR 607 | the ratio of a signal power to the noise power corrupting the signal |
| Accuracy 608 | the degree of closeness of a measured quantity to its actual value |
| Position | the position of the device from the user's perspective according to the x-, y-, and z-axis |

The source 630 may include a program representing the sensor capability base attributes using the XML format.

A reference numeral 631 defines the maximum value 602 using the XML format. According to the reference numeral 631, the maximum value 602 has "float" type data and is optionally used.

A reference numeral 632 defines the minimum value 603 using the XML format. According to the reference numeral 632, the minimum value 603 has "float" type data and is optionally used.

A reference numeral 633 defines the numOflevels 605 using the XML. According to the reference numeral 633, the numOflevels 605 has "onNegativeInteger" type data and is optionally used.

However, the source 630 shown in FIG. 14 is only an example embodiment, and thus, the present disclosure is not limited thereto.

Table 3-2 shows a source of sensor capability base attributes according to other example embodiments.

TABLE 3-2

```
<!-- ############################################# -->
<!-- Definition of Sensor Capability Base Attributes -->
<!-- ############################################# -->
<attributeGroup name="SensorCapabilityBaseAttributes">
        <attribute name="unit" type="mpegvct:unitType"
        use="optional"/>
        <attribute name="maxValue" type="float" use="optional"/>
        <attribute name="minValue" type="float" use="optional"/>
        <attribute name="offset" type="float" use="optional"/>
        <attribute name="numOfLevels" type="nonNegativeInteger"
        use="optional"/>
        <attribute name="sensitivity" type="float" use="optional"/>
        <attribute name="SNR" type="float" use="optional"/>
</attributeGroup>
```

Table 3-3 shows binary representation syntax corresponding to the sensor capability base attributes, according to the example embodiments.

TABLE 3-3

| SensorCapabilityBaseAttributesType { | Number of bits | Mnemonic |
| --- | --- | --- |
| unitFlag | 1 | bslbf |
| maxValueFlag | 1 | bslbf |
| minValueFlag | 1 | bslbf |
| offsetFlag | 1 | bslbf |
| numOfLevelsFlag | 1 | bslbf |

TABLE 3-3-continued

| SensorCapabilityBaseAttributesType { | Number of bits | Mnemonic |
|---|---|---|
| sensitivityFlag | 1 | bslbf |
| SNRFlag | 1 | bslbf |
| if(unitFlag){ | | |
| Unit | | unitType |
| } | | |
| if(maxValueFlag){ | | |
| maxValue | 32 | fsbf |
| } | | |
| if(minValueFlag){ | | |
| minValue | 32 | fsbf |
| } | | |
| if(offsetFlag){ | | |
| Offset | 32 | fsbf |
| } | | |
| if(numOfLevelsFlag){ | | |
| numOfLevels | 32 | uimsbf |
| } | | |
| if(sensitivityFlag){ | | |
| Sensitivity | 32 | fsbf |
| } | | |
| if(SNRFlag){ | | |
| SNR | 32 | fsbf |
| } | | |
| } | | |

Table 3-4 shows descriptor components semantics of the sensor capability base attributes, according to the example embodiments.

TABLE 3-4

| Names | Description |
|---|---|
| SensorCapabilityBaseAttributesType | SensorCapabilityBaseType extends dia: TerminalCapabilityBaseType and provides a base abstract type for a subset of types defined as part of the sensor device capability metadata types. For details of dia: TerminalCapabilityBaseType, refer to the Part 7 of ISO/IEC 21000. |
| unitFlag | This field, which is only present in the binary representation, signals the presence of the activation attribute. A value of "1" means the attribute shall be used and "0" means the attribute shall not be used. |
| maxValueFlag | This field, which is only present in the binary representation, signals the presence of the activation attribute. A value of "1" means the attribute shall be used and "0" means the attribute shall not be used. |
| minValueFlag | This field, which is only present in the binary representation, signals the presence of the activation attribute. A value of "1" means the attribute shall be used and "0" means the attribute shall not be used. |
| offsetFlag | This field, which is only present in the binary representation, signals the presence of the activation attribute. A value of "1" means the attribute shall be used and "0" means the attribute shall not be used. |
| numOfLevelsFlag | This field, which is only present in the binary representation, signals the presence of the activation attribute. A value of "1" means the attribute shall be used and "0" means the attribute shall not be used. |
| sensitivityFlag | This field, which is only present in the binary representation, signals the presence of the activation attribute. A value of "1" means the attribute shall be used and "0" means the attribute shall not be used. |
| SNRFlag | This field, which is only present in the binary representation, signals the presence of the activation attribute. A value of "1" means the attribute shall be used and "0" means the attribute shall not be used. |
| Unit | Describes the unit of the sensor's measuring value. Specifies the unit of the sensor's measuring value as a reference to a classification scheme term provided by UnitTypeCS defined in A.2.1 of Part 6 of ISO/IEC 23005, if a unit other than the default unit specified in the semantics of the maxValue and minValue is used for the values of maxValue and minValue are used. |
| maxValue | Describes the maximum value that the sensor can perceive. The terms will be different according to the individual sensor type. |
| minValue | Describes the minimum value that the sensor can perceive. The terms will be different according to the individual sensor type. |
| offset | Describes the number of value locations added to a base value in order to get to a specific absolute value. |
| numOfLevels | Describes the number of value levels that the sensor can perceive in between maximum and minimum value. EXAMPLE The value 5 means the sensor can perceive 5 steps from minValue to maxValue. |

TABLE 3-4-continued

| Names | Description |
|---|---|
| sensitivity | Describes the minimum magnitude of input signal required to produce a specified output signal in given unit. |
| SNR | Describes the ratio of a signal power to the noise power corrupting the signal. |

Referring back to FIG. 3A, the processing unit 320 may determine a first value received from the sensor based on the sensor capability, and transmit a second value corresponding to the first value to the virtual world.

Depending on embodiments, the processing unit 320 may transmit the second value that corresponds to the first value to the virtual world when the first value received from the sensor is within a range of the sensor, i.e., less than or equal to a maximum value measurable by the sensor and greater than or equal to a minimum value measurable by the sensor.

The virtual world processing apparatus 300 may further include a second storage unit (not shown) to store sensor adaptation preference for manipulation of the first value received from the sensor. The processing unit 320 may generate a third value from the first value based on the sensor capability, and generate the second value from the third value based on the sensor adaptation preference.

Depending on embodiments, information on the motion, state, intention, shape, and the like of the user of the real world, which are measured through the sensor, may be directly reflected to the virtual world.

Hereinafter, the sensor capability will be described in relation to specific embodiments of the sensor. Although not limited to those embodiments, the sensor may include a position sensor, an orientation sensor, an acceleration sensor, a light sensor, a sound sensor, a temperature sensor, a humidity sensor, a distance sensor, a motion sensor, an intelligent camera sensor, an ambient noise sensor, an atmospheric sensor, a velocity sensor, an angular velocity sensor, an angular acceleration sensor, a force sensor, a torque sensor, and a pressure sensor.

Table 3-5 shows metadata encoding that classifies the sensors according to the example embodiments based on sensor types.

TABLE 3-5

| Binary representation for sensor type | Term of Sensor |
|---|---|
| 00000 | Light sensor |
| 00001 | Ambient noise sensor |
| 00010 | Temperature sensor |
| 00011 | Humidity sensor |
| 000100 | Distance sensor |
| 00101 | Atmospheric sensor |
| 00110 | Position sensor |
| 00111 | Velocity sensor |
| 01000 | Acceleration sensor |
| 01001 | Orientation sensor |
| 01010 | Angular velocity sensor |
| 01011 | Angular acceleration sensor |
| 01100 | Force sensor |
| 01101 | Torque sensor |
| 01110 | Pressure sensor |
| 01111 | Motion sensor |
| 10000 | Intelligent camera sensor |
| 10001-11111 | Reserved |

Table 4 shows sensor capability with respect to the position sensor using the XML format. However, a program source shown in Table 4 is only an example embodiment, and thus, the present disclosure is not limited thereto.

TABLE 4

```
<!-- ################################################## -->
<!-- Position Sensor capability type                  -->
<!-- ################################################## -->
<complexType name="PositionSensorCapabilityType">
    <complexContent>
        <extension base="scdv:SensorCapabilityBaseType">
            <sequence>
                <element name="range"
                    type="scdv:RangeType"/>
            </sequence>
        </extension>
    </complexContent>
</complexType>
<complexType name="RangeType">
    <sequence>
        <element name="XminValue" type="float"/>
        <element name="XmaxValue" type="float"/>
        <element name="YminValue" type="float"/>
        <element name="YmaxValue" type="float"/>
        <element name="ZminValue" type="float"/>
        <element name="ZmaxValue" type="float"/>
    </sequence>
</complexType>
```

The position sensor capability type is a tool for describing sensor capability of the position sensor.

The position sensor capability type may include sensor capability base attributes of the position sensor.

The sensor capability base attributes of the position sensor may include a range, a range type, an x maximum value (xmaxValue), an x minimum value (xminValue), a y maximum value (ymaxValue), a y minimum value (yminValue), a z maximum value (zmaxValue), and a z minimum value (zminValue).

The range refers to a measurable range of the position sensor. For example, the measurable range of the position sensor may be indicated by a range type and a global coordinate system.

An origin of the global coordinate may be located at a top left corner. A right handed coordinate system may be applied to the global coordinate. In the global coordinate, a positive direction of an x-axis may be a direction to a top right corner of a screen, a positive direction of a y-axis may be a gravity direction, that is, a bottomward direction of the screen, and a positive direction of a z-axis may be a direction opposite to the user, that is, a direction into the screen.

The range type refers to a range of the global coordinate system according to the x-axis, the y-axis, and the z-axis.

The xmaxValue denotes a maximum value on the x-axis, measurable by the position sensor using a unit of a position coordinate, for example, meter.

The xminValue denotes a minimum value on the x-axis, measurable by the position sensor using a unit of a position coordinate, for example, meter.

The ymaxValue denotes a maximum value on the y-axis, measurable by the position sensor using a unit of a position coordinate, for example, meter.

The yminValue denotes a minimum value on the y-axis, measurable by the position sensor using a unit of a position coordinate, for example, meter.

The zmaxValue denotes a maximum value on the z-axis, measurable by the position sensor using a unit of a position coordinate, for example, meter.

The zminValue denotes a minimum value on the z-axis, measurable by the position sensor using a unit of a position coordinate, for example, meter.

Table 4-2 shows binary encoding syntax that converts the position sensor capability type from the XML format to the binary format.

TABLE 4-2

| PositionSensorCapabilityType { | Number of bits | Mnemonic |
|---|---|---|
| SensorCapabilityBase | | SensorCapabilityBaseType |
| range | | RangeType |
| } | | |
| RangeType { | | |
| XminValue | 32 | fsbf |
| XmaxValue | 32 | fsbf |
| YminValue | 32 | fsbf |
| YmaxValue | 32 | fsbf |
| ZminValue | 32 | fsbf |
| ZmaxValue | 32 | fsbf |
| } | | |

Table 4-3 shows descriptor components semantics of the position sensor capability type according to the example embodiments.

TABLE 4-3

| Names | Description |
|---|---|
| PositionSensorCapabilityType | Tool for describing a position sensor capability. |
| SensorCapabilityBase | SensorCapabilityBaseType extends dia: TeminalCapabilityBaseType and provides a base abstract type for a subset of types defined as part of the sensor device capability metadata types. For details of dia: TerminalCapabilityBaseType, refer to the Part 7 of ISO/IEC 21000. |
| range | Describes the range that the position sensor can perceive in terms of RangeType in its global coordinate system. |
| RangeType | Defines the range in a local coordinate system relative to the position of the sensor in idle state according to the x-, y-, and z-axis. |
| XminValue | Describes the minimum value that the position sensor can perceive along the x-axis in the unit of meter. |
| XmaxValue | Describes the maximum value that the position sensor can perceive along the x-axis in the unit of meter. |
| YminValue | Describes the minimum value that the position sensor can perceive along the y-axis in the unit of meter. |
| YmaxValue | Describes the maximum value that the position sensor can perceive along the y-axis in the unit of meter. |
| ZminValue | Describes the minimum value that the position sensor can perceive along the z-axis in the unit of meter. |
| ZmaxValue | Describes the maximum value that the position sensor can perceive along the z-axis in the unit of meter. |

Table 5 shows sensor capability with respect to the orientation sensor using the XML format. However, a program source shown in Table 5 is only an example embodiment, and thus, the present disclosure is not limited thereto.

TABLE 5

```
<!-- ################################################## -->
<!-- Orientation Sensor capability type              -->
<!-- ################################################## -->
<complexType name="OrientationSensorCapabilityType">
    <complexContent>
        <extension base="scdv:SensorCapabilityBaseType">
            <sequence>
                <element name="OrientationRange" type="scdv:OrientationRangeType"/>
            </sequence>
        </extension>
    </complexContent>
</complexType>
<complexType name="OrientationRangeType">
    <sequence>
        <element name="XMinRotation" type="float"/>
        <element name="XMaxRotation" type="float"/>
        <element name="YMinRotation" type="float"/>
        <element name="YMaxRotation" type="float"/>
        <element name="ZMinRotation" type="float"/>
        <element name="ZMaxRotation" type="float"/>
    </sequence>
</complexType>
```

The orientation sensor capability type is a tool for describing sensor capability of the orientation sensor.

The orientation sensor capability type may include sensor capability base attributes of the orientation sensor.

The sensor capability base attributes related to the orientation sensor may include an orientation range, an orientation range type, an x maximum value (xmaxValue), an x minimum value (xminValue), a y maximum value (ymaxValue), a y minimum value (yminValue), a z maximum value (zmaxValue), and a z minimum value (zminValue).

The range denotes a measurable range of the orientation sensor. For example, the measurable range of the orientation sensor may be indicated using the orientation range type and the global coordinate system.

The orientation range type denotes an orientation range of the global coordinate system according to the x-axis, the y-axis, and the z-axis.

The xmaxValue denotes a maximum value on the x-axis, measurable by the orientation sensor using a unit of an orientation coordinate, for example, radian.

The xminValue denotes a minimum value on the x-axis, measurable by the orientation sensor using a unit of an orientation coordinate, for example, radian.

The ymaxValue denotes a maximum value on the y-axis, measurable by the orientation sensor using a unit of an orientation coordinate, for example, radian.

The yminValue denotes a minimum value on the y-axis, measurable by the orientation sensor using a unit of an orientation coordinate, for example, radian.

The zmaxValue denotes a maximum value on the z-axis, measurable by the orientation sensor using a unit of an orientation coordinate, for example, radian.

The zminValue denotes a minimum value on the z-axis, measurable by the orientation sensor using a unit of an orientation coordinate, for example, radian.

Table 5-2 shows binary encoding syntax that converts the orientation sensor capability type from the XML format to the binary format.

TABLE 5-2

| OrientationSensorCapabilityType { | Number of bits | Mnemonic |
|---|---|---|
| SensorCapabilityBase | | SensorCapabilityBaseType |
| OrientationRange | | OrientationRangeType |
| } | | |
| OrientationRangeType { | | |
| YawMin | 32 | fsbf |
| YawMax | 32 | fsbf |
| PitchMin | 32 | fsbf |
| PitchMax | 32 | fsbf |
| RollMin | 32 | fsbf |
| RollMax | 32 | fsbf |
| } | | |

Table 5-3 shows descriptor components semantics of the orientation sensor capability type according to the example embodiments.

TABLE 5-3

| Names | Description |
|---|---|
| OrientationSensorCapabilityType | Tool for describing an orientation sensor capability. |
| SensorCapabilityBase | SensorCapabilityBaseType extends dia:TeminalCapabilityBaseType and provides a base abstract type for a subset of types defined as part of the sensor device capability metadata types. For details of dia:TerminalCapabilityBaseType, refer to the Part 7 of ISO/IEC 21000. |
| Orientation Range | Describes the range that the orientation sensor can perceive in terms of OrientationRangeType. |
| OrientationRangeType | Defines the range from the local coordinate system according to the Yaw, Pitch and Roll. |
| YawMin | Describes the minimum value that the orientation sensor can perceive for Yaw in the unit of degree. |
| YawMax | Describes the maximum value that the orientation sensor can perceive for Yaw in the unit of degree. |
| PitchMin | Describes the minimum value that the orientation sensor can perceive for Pitch in the unit of degree. |
| PitchMax | Describes the maximum value that the orientation sensor can perceive for Pitch in the unit of degree. |
| RollMin | Describes the minimum value that the orientation sensor can perceive for Roll in the unit of degree. |
| RollMax | Describes the maximum value that the orientation sensor can perceive for Roll in the unit of degree. |

Table 6 shows sensor capability of an acceleration sensor using the XML format. However, a program source shown in Table 5 is only an example embodiment, and thus, the present disclosure is not limited thereto.

TABLE 6

```
<!-- ################################################## -->
<!-- Acceleration Sensor capability type              -->
<!-- ################################################## -->
<complexType name="AccelerationSensorCapabilityType">
    <complexContent>
        <extension base="scdv:SensorCapabilityBaseType">
        </extension>
    </complexContent>
</complexType>
```

An acceleration sensor capability type is a tool for describing the sensor capability of the acceleration sensor.

The acceleration sensor capability type may include sensor capability base attributes of the acceleration sensor.

The sensor capability base attributes of the acceleration sensor may include a maximum value (maxValue) and a minimum value (minValue).

The maxValue denotes a maximum value measurable by the acceleration sensor using a unit of acceleration, for example, m/s2.

The minValue denotes a minimum value measurable by the acceleration sensor using a unit of acceleration, for example, m/s2.

Table 6-2 shows binary encoding syntax that converts the orientation sensor capability type from the XML format to the binary format.

TABLE 6-2

| AccelerationSensorCapabilityType { | Number of bits | Mnemonic |
|---|---|---|
| SensorCapabilityBase | | SensorCapabilityBaseType |
| } | | |

Table 6-3 shows descriptor components semantics of the acceleration sensor capability type, according to the example embodiments.

TABLE 6-3

| Names | Description |
|---|---|
| AccelerationSensorCapabilityType | Tool for describing an acceleration sensor capability. |
| SensorCapabilityBase | SensorCapabilityBaseType extends dia: TeminalCapabilityBaseType and provides a base abstract type for a subset of types defined as part of the sensor device capability metadata types. For details of dia: TerminalCapabilityBaseType, refer to the Part 7 of ISO/IEC 21000. |

Table 7 shows sensor capability of a light sensor using the XML format. However, a program source shown in Table 7 is only an example embodiment, and thus, the present disclosure is not limited thereto.

TABLE 7

```
<!-- ################################################## -->
<!-- Light Sensor capability type                        -->
<!-- ################################################## -->
<complexType name="LightSensorCapabilityType">
    <complexContent>
        <extension base="scdv:SensorCapabilityBaseType">
            <sequence>
                <element name="color"
                    type="scdv:colorType" minOccurs="0"
                                        maxOccurs="unbounded"/>
            </sequence>
            <attribute name="location"
type="mpeg7:termReferenceType" use="optional"/>
        </extension>
    </complexContent>
</complexType>
```

A light sensor capability type is a tool for describing the sensor capability of the light sensor.

The light sensor capability type may include sensor capability base attributes of the light sensor.

The sensor capability base attributes of the light sensor may include a maximum value (maxValue), a minimum value (minValue), a color, and a location.

The maxValue denotes a maximum value measurable by the light sensor using a unit of light intensity, for example, LUX.

The minValue denotes a minimum value measurable by the light sensor using a unit of light intensity, for example, LUX.

The color denotes a color that may be provided by the light sensor. For example, the color may be an RGB color value.

The location denotes a location of the light sensor. For example, the location of the light sensor may be expressed using the global coordinate system according to the x-axis, the y-axis, and the z-axis.

Table 7-2 shows binary encoding syntax that converts the light sensor capability type from the XML format to the binary format.

TABLE 7-2

| LightSensorCapabilityType { | Number of bits | Mnemonic |
|---|---|---|
| colorFlag | 1 | bslbf |
| locationFlag | 1 | bslbf |
| SensorCapabilityBase |  | SensorCapabilityBaseType |
| if(colorFlag){ |  |  |
| Loopcolor |  | vluimsbf5 |
| for(k=0;k<Loopcolor;k++){ |  |  |
| color[k] |  | ColorType |
| } |  |  |
| } |  |  |
| if(locationFlag){ |  |  |
| Location |  | Float3DVectorType |
| } |  |  |
| } |  |  |
| Float3DVectorType { |  |  |
| X | 32 | fsbf |
| Y | 32 | fsbf |
| Z | 32 | fsbf |
| } |  |  |

Table 7-3 shows descriptor components semantics of the light sensor capability type according to the example embodiments.

TABLE 7-3

| Names | Description |
|---|---|
| LightSensorCapabilityType | Tool for describing a light sensor capability. |
| colorFlag | This field, which is only present in the binary representation, signals the presence of the activation attribute. A value of "1" means the attribute shall be used and "0" means the attribute shall not be used. |
| locationFlag | This field, which is only present in the binary representation, signals the presence of the activation attribute. A value of "1" means the attribute shall be used and "0" means the attribute shall not be used. |
| SensorCapabilityBase | SensorCapabilityBaseType extends dia: TeminalCapabilityBaseType and provides a base abstract type for a subset of types defined as part of the sensor device capability metadata types. For details of dia: TerminalCapabilityBaseType, refer to the Part 7 of ISO/IEC 21000. |
| Loopcolor | This field, which is only present in the binary representation, specifies the number of Color contained in the description. |
| color | Describes the list of colors which the lighting device can provide as a reference to a classification scheme term or as RGB value. A CS that may be used for this purpose is the |

TABLE 7-3-continued

| Names | Description |
|---|---|
| | ColorCS defined in A.2.3 of ISO/IEC 23005-6. EXAMPLE urn:mpeg:mpeg-v:01-SI-ColorCS-NS:alice_blue would describe the color Alice blue. |
| location | Describes the location of the device from the global coordinate system according to the x-, y-, and z-axis in the unit of meter (m). |
| Float3DVectorType | Tool for describing a 3D position vector |
| X | Describes the sensed value in x-axis in the unit. |
| Y | Describes the sensed value in y-axis in the unit. |
| Z | Describes the sensed value in z-axis in the unit. |

Table 8 shows sensor capability related to a sound sensor using the XML format. However, a program source shown in Table 8 is only an example embodiment, and thus, the present disclosure is not limited thereto.

TABLE 8

```
<!--######################-->
<!-- Sound Sensor capability type -->
<!--######################-->
<complexType name="SoundSensorCapabilityType">
  <complexContent>
    <extension base="sidc:CapabilityBaseType"/>
  </complexContent>
</complexType>
```

A sound sensor capability type is a tool for describing the sensor capability of the sound sensor.

The sound sensor capability type may include sensor capability base attributes of the sound sensor.

The sensor capability base attributes of the sound sensor may include a max value (maxValue) and a minimum value (minValue).

The maxValue denotes a maximum value measurable by the sound sensor using a unit of sound intensity, for example, decibel (dB).

The minValue denotes a minimum value measurable by the sound sensor using a unit of sound intensity, for example, dB.

Table 8-2 shows binary encoding syntax that converts the sound sensor capability type from the XML format to the binary format.

TABLE 8-2

| SoundSensorCapabilityType { | Number of bits | Mnemonic |
|---|---|---|
| locationFlag | 1 | bslbf |
| SensorCapabilityBase | | SensorCapabilityBaseType |
| if(locationFlag){ | | |
| location | | Float3DVectorType |
| } | | |
| } | | |

Table 8-3 shows descriptor components semantics of the sound sensor capability type, according to the example embodiments.

TABLE 8-3

| Names | Description |
|---|---|
| SoundSensorCapabilityType | Tool for describing a sound sensor capability. |
| locationFlag | This field, which is only present in the binary representation, signals the presence of the activation attribute. A value of "1" means the attribute shall be used and "0" means the attribute shall not be used. |
| SensorCapabilityBase | SensorCapabilityBaseType extends dia: TeminalCapabilityBaseType and provides a base abstract type for a subset of types defined as part of the sensor device capability metadata types. For details of dia: TerminalCapabilityBaseType, refer to the Part 7 of ISO/IEC 21000. |
| location | Describes the location of the device from the global coordinate system according to the x-, y-, and z-axis in the unit of meter (m). |

Table 9 shows sensor capability related to a temperature sensor using the XML format. However, a program source shown in Table 9 is only an example embodiment, and thus, the present disclosure is not limited thereto.

TABLE 9

```
<!-- ################################################ -->
<!-- Temperature Sensor capability type              -->
<!-- ################################################ -->
<complexType name="TemperatureSensorCapabilityType">
    <complexContent>
        <extension base="scdv:SensorCapabilityBaseType">
            <attribute name="location"
type="mpeg7:termReferenceType" use="optional"/>
        </extension>
    </complexContent>
</complexType>
```

A temperature sensor capability type is a tool for describing the sensor capability of the temperature sensor.

The temperature sensor capability type may include sensor capability base attributes of the temperature sensor.

The sensor capability base attributes of the temperature sensor may include a maximum value (maxValue), a minimum value (minValue), and a location.

The maximum value denotes a maximum value measurable by the temperature sensor using a unit of temperature, for example, ° C. and ° F.

The minimum value denotes a minimum value measurable by the temperature sensor using a unit of temperature, for example, ° C. and ° F.

The location denotes a location of the temperature sensor. For example, the location of the temperature sensor may be expressed using the global coordinate system according to the x-axis, the y-axis, and the z-axis.

Table 9-2 shows binary encoding syntax that converts the temperature sensor capability type from the XML format to the binary format.

TABLE 9-2

| TemperatureSensorCapabilityType { | Number of bits | Mnemonic |
|---|---|---|
| locationFlag | 1 | bslbf |
| SensorCapabilityBase |  | SensorCapabilityBaseType |
| if(locationFlag){ |  |  |
| Location |  | Float3DVectorType |
| } |  |  |
| } |  |  |

Table 9-3 shows descriptor components semantics of the temperature sensor capability type according to the example embodiments.

TABLE 9-3

| Names | Description |
|---|---|
| TemperatureSensorCapabilityType | Tool for describing a temperature sensor capability |
| locationFlag | This field, which is only present in the binary representation, signals the presence of the activation attribute. A value of "1" means the attribute shall be used and "0" means the attribute shall not be used. |
| SensorCapabilityBase | SensorCapabilityBaseType extends dia: TeminalCapabilityBaseType and provides a base abstract type for a subset of types defined as part of the sensor device capability metadata types. For details of dia: TerminalCapabilityBaseType, refer to the Part 7 of ISO/IEC 21000. |
| Location | Describes the location of the device from the global coordinate system according to the x-, y-, and z-axis in the unit of meter (m). |

Table 10 shows sensor capability related to a humidity sensor using the XML format. However, a program source shown in Table 9 is only an example embodiment, and thus, the present disclosure is not limited thereto.

TABLE 10

```
<!-- ############################################### -->
<!-- Humidity Sensor capability type                 -->
<!-- ############################################### -->
<complexType name="HumiditySensorCapabilityType">
    <complexContent>
        <extension base="scdv:SensorCapabilityBaseType">
            <attribute name="location"
type="mpeg7:termReferenceType" use="optional"/>
        </extension>
    </complexContent>
</complexType>
```

A humidity sensor type is a tool for describing the sensor adaptation preference of the humidity sensor.

A humidity sensor capability type may include sensor adaptation preference base attributes of the humidity sensor.

The sensor adaptation preference base attributes of the humidity sensor may include a maximum value (maxValue), a minimum value (minValue), and a location.

The maxValue denotes a maximum value of a user preference related to humidity information measured by the humidity sensor.

The minValue denotes a minimum value of the user preference related to the humidity information measured by the humidity sensor.

The location denotes a location of the humidity sensor. For example, the location of the humidity sensor may be expressed using the global coordinate system according to the x-axis, the y-axis, and the z-axis.

Table 10-2 shows binary encoding syntax that converts the humidity sensor capability type from the XML format to the binary format.

TABLE 10-2

| HumiditySensorCapabilityType { | Number of bits | Mnemonic |
|---|---|---|
| locationFlag | 1 | bslbf |
| SensorCapabilityBase |  | SensorCapabilityBaseType |
| if(locationFlag){ |  |  |
| location |  | Float3DVectorType |
| } |  |  |
| } |  |  |

Table 10-3 shows descriptor components semantics of the humidity sensor capability type, according to the example embodiments.

TABLE 10-3

| Names | Description |
|---|---|
| HumiditySensorCapabilityType | Tool for describing a humidity sensor capability. |
| locationFlag | This field, which is only present in the binary representation, signals the presence of the activation attribute. A value of "1" means the attribute shall be used and "0" means the attribute shall not be used. |
| SensorCapabilityBase | SensorCapabilityBaseType extends dia: TeminalCapabilityBaseType and provides a base abstract type for a subset of types defined as part of the sensor device capability metadata types. For details of dia: TerminalCapabilityBaseType, refer to the Part 7 of ISO/IEC 21000. |
| location | Describes the location of the device from the global coordinate system according to the x-, y-, and z-axis in the unit of meter (m). |

Table 11 shows a sensor adaptation preference related to a distance sensor using the XML format. However, a program source shown in Table 11 is only an example embodiment, and thus, the present disclosure is not limited thereto.

TABLE 11

```
<!-- ############################################## -->
<!-- Distance Sensor capability type             -->
<!-- ############################################## -->
<complexType name="DistanceSensorCapabilityType">
    <complexContent>
        <extension base="scdv:SensorCapabilityBaseType">
            <attribute name="location"
type="mpeg7:termReferenceType" use="optional"/>
        </extension>
    </complexContent>
</complexType>
```

A distance sensor capability type is a tool for describing sensor capability of the distance sensor.

The distance sensor capability type may include sensor capability base attributes of the distance sensor.

The sensor capability base attributes of the distance sensor may include a maximum value (maxValue), a minimum value (minValue), and a location.

The maxValue denotes a maximum value measurable by the distance sensor using a unit of length, for example, a meter.

The minValue denotes a minimum value measurable by the distance sensor using a unit of length, for example, a meter.

The location denotes a location of the distance sensor. For example, the location of the distance sensor may be expressed using the global coordinate system according to the x-axis, the y-axis, and the z-axis.

Table 11-2 shows binary encoding syntax that converts the distance sensor capability type from the XML format to the binary format.

TABLE 11-2

| DistanceSensorCapabilityType { | Number of bits | Mnemonic |
|---|---|---|
| locationFlag | 1 | bslbf |
| SensorCapabilityBase | | SensorCapabilityBaseType |
| if(locationFlag){ | | |
| Location | | Float3DVectorType |
| } | | |
| } | | |

Table 11-3 shows descriptor components semantics of the distance sensor capability type, according to the example embodiments.

TABLE 11-3

| Names | Description |
|---|---|
| DistanceSensorCapabilityType | Tool for describing a distance sensor capability. |
| locationFlag | This field, which is only present in the binary representation, signals the presence of the activation attribute. A value of "1" means the attribute shall be used and "0" means the attribute shall not be used. |
| SensorCapabilityBase | SensorCapabilityBaseType extends dia: TeminalCapabilityBaseType and provides a base abstract type for a subset of types defined as part of the sensor device capability metadata types. For details of dia: TerminalCapabilityBaseType, refer to the Part 7 of ISO/IEC 21000. |
| Location | Describes the location of the device from the global coordinate system according to the x-, y-, and z-axis in the unit of meter (m). |

Table 12 shows sensor capability related to a motion sensor using the XML format. However, a program source shown in Table 12 is only an example embodiment, and thus, the present disclosure is not limited thereto.

TABLE 12

```
<!-- ############################################## -->
<!-- Motion Sensor capability type                -->
<!-- ############################################## -->
<complexType name="MotionSensorCapabilityType">
    <sequence>
        <element name="OrientationCapability"
type="scdv:PositionSensorCapabilityType" minOccurs="0"/>
        <element name="OrientationCapability"
type="scdv:OrientationSensorCapabilityType" minOccurs="0"/>
        <element name="VelocityCapability"
type="scdv:VelocitySensorCapabilityType" minOccurs="0"/>
        <element name="AngularVelocityCapability"
type="scdv:AngularVelocitySensorCapabilityType" minOccurs="0"/>
        <element name="AccelerationCapability"
type="scdv:AccelerationSensorCapabilityType" minOccurs="0"/>
        <element name="AngularAccelerationCapability"
type="scdv:AngularAccelerationSensorCapabilityType" minOccurs="0"/>
    </sequence>
</complexType>
```

A motion sensor capability type is a tool for describing the sensor capability of the motion sensor.

The motion sensor may be an integrated sensor of a plurality of sensors. For example, the motion sensor may integrally include a position sensor, a velocity sensor, an acceleration sensor, an orientation sensor, an angular velocity sensor, and an angular acceleration sensor.

The motion sensor capability type may include sensor capability base attributes of the motion sensor.

The sensor capability base attributes related to the motion sensor may include position capability, velocity capability, acceleration capability, orientation capability, angular velocity capability, and angular acceleration capability.

The position capability denotes capability with respect to the position.

The velocity capability denotes capability with respect to the velocity.

The acceleration capability denotes capability with respect to the acceleration.

The orientation capability denotes capability with respect to the orientation.

The angular velocity capability denotes capability with respect to the angular velocity.

The angular acceleration capability denotes capability with respect to the angular acceleration.

Table 12-2 shows binary encoding syntax that converts the motion sensor capability type from the XML format to the binary format.

TABLE 12-2

| MotionSensorCapabilityType { | Number of bits | Mnemonic |
|---|---|---|
| PositionCapabilityFlag | 1 | bslbf |
| OrientationCapabilityFlag | 1 | bslbf |
| VelocityCapabilityFlag | 1 | bslbf |
| AngularVelocityCapabilityFlag | 1 | bslbf |
| AccelerationCapabilityFlag | 1 | bslbf |
| AngularAccelerationCapabilityFlag | 1 | bslbf |
|   if(PositionCapabilityFlag){ | | |
| PositionCapability | | PositionSensorCapabilityType |
|   } | | |
|   if(OrientationCapabilityFlag){ | | |
| OrientationCapability | | OrientationSensorCapabilityType |
|   } | | |
|   if(VelocityCapabilityFlag){ | | |
| VelocityCapability | | VelocitySensorCapabilityType |
|   } | | |
|   if(AngularVelocityCapabilityFlag){ | | |
| AngularVelocityCapability | | AngularVelocitySensorCapabilityType |
|   } | | |
|   if(AccelerationCapabilityFlag){ | | |
| AccelerationCapability | | AccelerationSensorCapabilityType |
|   } | | |
| if(AngularAccelerationCapabilityFlag) | | |
| { | | |
| AngularAccelerationCapability | | AngularAccelerationSensorCapabilityType |
|   } | | |
| } | | |

Table 12-3 shows descriptor components semantics of the motion sensor capability type, according to the example embodiments.

TABLE 12-3

| Names | Description |
|---|---|
| MotionSensorCapabilityType | Tool for describing a pressure sensor capability. |
| PositionCapabilityFlag | This field, which is only present in the binary representation, signals the presence of the activation attribute. A value of "1" means the attribute shall be used and "0" means the attribute shall not be used. |
| OrientationCapabilityFlag | This field, which is only present in the binary representation, signals the presence of the activation attribute. A value of "1" means the attribute shall be used and "0" means the attribute shall not be used. |
| VelocityCapabilityFlag | This field, which is only present in the binary representation, signals the presence of the activation attribute. A value of "1" means the attribute shall be used and "0" means the attribute shall not be used. |
| AngularVelocityCapabilityFlag | This field, which is only present in the binary representation, signals the presence of the activation attribute. A value of "1" means the attribute shall be used and "0" means the attribute shall not be used. |
| AccelerationCapabilityFlag | This field, which is only present in the binary representation, signals the presence of the activation attribute. A value of "1" means the attribute shall be used and "0" means the attribute shall not be used. |
| AngularAccelerationCapabilityFlag | This field, which is only present in the binary representation, signals the presence of the activation attribute. A value of "1" means the attribute shall be used and "0" means the attribute shall not be used. |
| PositionCapability | Describes the capability with respect to the position as defined in PositionSensorCapabilityType. |
| OrientationCapability | Describes the capability with respect to the orientation as defined in OrientationSensorCapabilityType. |
| VelocityCapability | Describes the capability with respect to the velocity as defined in VelocitySensorCapabilityType. |
| AngularVelocityCapability | Describes the capability with respect to the angular as defined in AngularVelocitySensorCapabilityType. |
| AccelerationCapability | Describes the capability with respect to the acceleration as defined in AccelerationSensorCapabilityType. |
| AngularAccelerationCapability | Describes the capability with respect to the angular acceleration as defined in AngularAccelerationSensorCapabilityType. |

Table 13 shows sensor capability of an intelligent camera sensor using the XML format. However, a program source shown in Table 13 is only an example embodiment, and thus, the present disclosure is not limited thereto.

TABLE 13

```
<!-- ################################################## -->
<!-- Intelligent Camera CapabilityType       -->
<!-- ################################################## -->
<complexType name="IntelligentCameraCapabilityType">
    <complexContent>
        <extension base="scdv:SensorCapabilityBaseType">
            <sequence>
                <element name=
"FeatureTrackingStatus" type="boolean" minOccurs="0"/>
                <element name=
"FacialExpressionTrackingStatus" type="boolean" minOccurs="0"/>
                <element name=
"GestureTrackingStatus" type="boolean" minOccurs="0"/>
                <element name=
"maxBodyFeaturePoint" type="nonNegativeInteger" minOccurs="0"/>
                <element name="maxFaceFeaturePoint"
type="nonNegativeInteger" minOccurs="0"/>
                <element name="TrackedFeature"
type="scdv:FeatureType" minOccurs="0"/>
                <element name=
"TrackedFacialFeaturePoints" type="scdv:FacialFeatureMask"
minOccurs="0"/>
                <element name=
"TrackedBodyFeaturePoints" type="scdv:BodyFeatureMask"
minOccurs="0"/>
            </sequence>
        </extension>
    </complexContent>
</complexType>
<complexType name="FeatureType">
    <sequence>
        <element name="Face" type="boolean"/>
        <element name="Body" type="boolean"/>
        <element name="Both" type="boolean"/>
    </sequence>
</complexType>
<complexType name="FacialFeatureMask">
    <sequence>
        <element name="FaceFeaturePoint"
type="boolean" minOccurs="60" maxOccurs="200"/>
    </sequence>
</complexType>
<complexType name="BodyFeatureMask">
    <sequence>
        <element name="BodyFeaturePoint"
```

TABLE 13-continued

```
type="boolean" minOccurs="60" maxOccurs="200"/>
    </sequence>
</complexType>
```

An intelligent camera sensor capability type is a tool for describing the sensor capability of the intelligent camera sensor.

The intelligent camera sensor capability type may include sensor capability base attributes of the intelligent camera sensor.

The sensor capability base attributes of the intelligent camera sensor may include a feature tracking status, an expression tracking status, a body movement tracking status, a maximum body feature point, a maximum face feature point, a tracked feature, tracked facial feature points, tracked body feature points, a feature type, a facial feature mask, and a body feature mask.

The feature tracking status denotes information on whether an intelligent camera sensor is capable of tracking features.

The expression tracking status denotes information on whether the intelligent camera sensor is capable of extracting animation related to a facial expression.

The body movement tracking status denotes information on whether the intelligent camera sensor is capable of extracting animation related to a body.

The maximum body feature point denotes a maximum value of a body feature that can be tracked by the intelligent camera sensor.

The maximum face feature point denotes a maximum value of a face feature that can be tracked by the intelligent camera sensor.

The tracked feature denotes information on whether tracking of the body feature and the face feature is possible.

The tracked facial feature points denote information on whether the respective face features are activated or based on the facial feature mask.

The tracked body feature points denote information on whether the respective body features are activated or based on the body feature mask.

The feature type denotes a list of feature types. For example, the feature type may include a face, a Body, and a face and body.

The facial feature mask denotes a list of facial features.

The body feature mask denotes a list of body features.

Table 13-2 shows binary encoding syntax that converts the intelligent camera sensor capability type from the XML format to the binary format.

TABLE 13-2

| IntelligentCameraCapabilityType { | Number of bits | Mnemonic |
|---|---|---|
| FeatureTrackingStatusFlag | 1 | bslbf |
| FacialExpressionTrackingStatusFlag | 1 | bslbf |
| GestureTrackingStatusFlag | 1 | bslbf |
| maxBodyFeaturePointFlag | 1 | bslbf |
| maxFaceFeaturePointFlag | 1 | bslbf |
| TrackedFeatureFlag | 1 | bslbf |
| TrackedFacialFeaturePointsFlag | 1 | bslbf |
| TrackedBodyFeaturePointsFlag | 1 | bslbf |
| SensorCapabilityBase | | SensorCapabilityBaseType |
| if(FeatureTrackingStatusFlag){ | | |
| FeatureTrackingStatus | 1 | bslbf |
| } | | |
| if(FacialExpressionTrackingStatusFlag){ | | |
| FacialExpressionTrackingStatus | 1 | bslbf |
| } | | |
| if(GestureTrackingStatusFlag){ | | |
| GestureTrackingStatus | 1 | bslbf |
| } | | |

TABLE 13-2-continued

| IntelligentCameraCapabilityType { | Number of bits | Mnemonic |
|---|---|---|
| if(maxBodyFeaturePointFlag){ | | |
| maxBodyFeaturePoint | 8 | uimsbf |
| } | | |
| if(maxFaceFeaturePointFlag){ | | |
| maxFaceFeaturePoint | 8 | uimsbf |
| } | | |
| if(TrackedFeatureFlag){ | | |
| TrackedFeature | 8 | FeatureType |
| } | | |
| if(TrackedFacialFeaturePointsFlag){ | | |
| TrackedFacialFeaturePoints | 8 | FacialFeatureMask |
| } | | |
| if(TrackedBodyFeaturePointsFlag){ | | |
| TrackedBodyFeaturePoints | 8 | BodyFeatureMask |
| } | | |
| } | | |
| FeatureType { | | |
|   Face | 1 | bslbf |
|   Body | 1 | bslbf |
|   Both | 1 | bslbf |
| } | | |
| FacialFeatureMask { | | |
|   for(k=0;k< maxFaceFeaturePoint;k++){ | | |
|     FaceFeaturePoint[k] | 1 | bslbf |
|   } | | |
| } | | |
| BodyFeatureMask { | | |
|   for(k=0;k< maxBodyFeaturePoint;k++){ | | |
|     BodyFeaturePoint[k] | 1 | bslbf |
|   } | | |
| } | | |

Table 13-3 shows descriptor components semantics of the intelligent camera sensor capability type, according to the example embodiments.

TABLE 13-3

| Names | Description |
|---|---|
| IntelligentCameraCapabilityType | Tool for describing an intelligent camera capability. |
| FeatureTrackingStatusFlag | This field, which is only present in the binary representation, signals the presence of the activation attribute. A value of "1" means the attribute shall be used and "0" means the attribute shall not be used. |
| FacialExpressionTrackingStatusFlag | This field, which is only present in the binary representation, signals the presence of the activation attribute. A value of "1" means the attribute shall be used and "0" means the attribute shall not be used. |
| GestureTrackingStatusFlag | This field, which is only present in the binary representation, signals the presence of the activation attribute. A value of "1" means the attribute shall be used and "0" means the attribute shall not be used. |
| maxBodyFeaturePointFlag | This field, which is only present in the binary representation, signals the presence of the activation attribute. A value of "1" means the attribute shall be used and "0" means the attribute shall not be used. |
| maxFaceFeaturePointFlag | This field, which is only present in the binary representation, signals the presence of the activation attribute. A value of "1" means the attribute shall be used and "0" means the attribute shall not be used. |
| TrackedFeatureFlag | This field, which is only present in the binary representation, signals the presence of the TrackedFeature element. A value of "1" means the attribute shall be used and "0" means the attribute shall not be used. |
| TrackedFacialFeaturePointsFlag | This field, which is only present in the binary representation, signals the presence of the TrackedFacialFeaturePoints element. A value of "1" means the attribute shall be used and "0" means the attribute shall not be used. |
| TrackedBodyFeaturePointsFlag | This field, which is only present in the binary representation, signals the presence of the TrackedBodyFeaturePoints element. A value of "1" means the attribute shall be used and "0" means the attribute shall not be used. |

TABLE 13-3-continued

| Names | Description |
|---|---|
| SensorCapabilityBase | SensorCapabilityBaseType extends dia: TeminalCapabilityBaseType and provides a base abstract type for a subset of types defined as part of the sensor device capability metadata types. For details of dia: TerminalCapabilityBaseType, refer to the Part 7 of ISO/IEC 21000. |
| FeatureTrackingStatus | Describes whether the feature tracking is capable or not. |
| FacialExpressionTrackingStatus | Describes whether the intelligent camera can extract the facial animation or not. |
| GestureTrackingStatus | Describes whether the intelligent camera can extract the body animation or not. |
| maxBodyFeaturePoint | Describes the maximum number of body feature points that the intelligent camera can track. |
| maxFaceFeaturePoint | Describes the maximum number of facial feature points that the intelligent camera can track. |
| TrackedFeature | Describes what kind of feature points can be tracked as given in FeatureType, e.g., body, face or both. |
| TrackedFacialFeaturePoints | Describes whether each of the facial feature points orderly listed in 2.2.15 of ISO/IEC 23005-4 is active or not, based on FacialFeatureMask. |
| TrackedBodyFeaturePoints | Describes whether each of the body feature points orderly listed in 2.2.14 of ISO/IEC 23005-4is active or not, based on BodyFeatureMask. |
| FeatureType | Describes a list of feature type (1. face, 2. body, and 3. both). |
| Face | Describes whether the intelligent camera can extract the face feature or not. |
| Body | Describes whether the intelligent camera can extract the body feature or not. |
| Both | Describes whether the intelligent camera can extract both (face and body) feature or not. |
| FacialFeatureMask | Provides a Boolean map of facial feature points in the order listed in 2.2.15 of ISO/IEC 23005-4 to identify active feature points. |
| FaceFeaturePoint | Describes whether each of the facial feature points can be activated or not. A value of "1" means the attribute shall be used and "0" means the attribute shall not be used. |
| BodyFeatureMask | Provides a Boolean map of body feature points in the order listed in 2.2.14 of ISO/IEC 23005-4 to identify active feature points. |
| BodyFeaturePoint | Describes whether each of the body feature points can be activated or not. A value of "1" means the attribute shall be used and "0" means the attribute shall not be used. |

Table 14 shows sensor capability related to an ambient noise sensor using the XML format. However, a program source shown in Table 14 is only an example embodiment, and thus, the present disclosure is not limited thereto.

TABLE 14

```
<!-- ################################################## -->
<!-- Ambient noise Sensor capability type            -->
<!-- ################################################## -->
<complexType name="AmbientNoiseSensorCapabilityType">
    <complexContent>
        <extension base="scdv:SensorCapabilityBaseType">
            <attribute name="location"
type="mpeg7:termReferenceType" use="optional"/>
        </extension>
    </complexContent>
</complexType>
```

An ambient noise sensor capability type is a tool for describing the sensor capability related to the ambient noise sensor.

The ambient noise sensor capability type may include sensor capability base attributes related to the ambient noise sensor.

The sensor capability base attributes related to the ambient noise sensor may include a maximum value, a minimum value, and a location.

The maximum value denotes a maximum value measurable by the ambient noise sensor. For example, a unit for the ambient noise sensor may be dB.

The minimum value denotes a minimum value measurable by the ambient noise sensor. For example, a unit for the ambient noise sensor may be dB.

The location denotes a location of the ambient noise sensor. For example, the location of the ambient noise sensor may be expressed using the global coordinate according to the x-axis, the y-axis, and the z-axis.

Table 14-2 shows binary encoding syntax that converts the ambient noise sensor capability type from the XML format to the binary format.

TABLE 14-2

| AmbientNoiseSensorCapabilityType { | Number of bits | Mnemonic |
|---|---|---|
| locationFlag | 1 | bslbf |
| SensorCapabilityBase | | SensorCapabilityBaseType |

TABLE 14-2-continued

| AmbientNoiseSensorCapabilityType { | Number of bits | Mnemonic |
|---|---|---|
| if(locationFlag){ | | |
| location | | Float3DVectorType |
| } | | |
| } | | |

Table 14-3 shows descriptor components semantics of the ambient noise sensor capability type according to the example embodiments.

TABLE 14-3

| Names | Description |
|---|---|
| AmbientNoiseSensorCapabilityType | Tool for describing an ambient noise sensor capability. |
| locationFlag | This field, which is only present in the binary representation, signals the presence of the activation attribute. A value of "1" means the attribute shall be used and "0" means the attribute shall not be used. |
| SensorCapabilityBase | SensorCapabilityBaseType extends dia: TerminalCapabilityBaseType and provides a base abstract type for a subset of types defined as part of the sensor device capability metadata types. For details of dia: TerminalCapabilityBaseType, refer to the Part 7 of ISO/IEC 21000. |
| location | Describes the location of the device from the global coordinate system according to the x-, y-, and z-axis in the unit of meter (m). |

Table 15 denotes sensor capability related to an atmospheric pressure sensor using the XML format. However, a program source shown in Table 15 is only an example embodiment, and thus, the present disclosure is not limited thereto.

TABLE 15

```
<!-- ################################################ -->
<!-- Atmospheric Pressure Sensor capability type    -->
<!-- ################################################ -->
<complexType name="AtmosphericPressureSensorCapabilityType">
    <complexContent>
        <extension base="scdv:SensorCapabilityBaseType">
            <attribute name="location"
type="mpeg7:termReferenceType" use="optional"/>
        </extension>
    </complexContent>
</complexType>
```

An atmospheric pressure sensor capability type is a tool for describing the sensor capability of the atmospheric pressure sensor.

The atmospheric pressure sensor capability type may include sensor capability base attributes of the atmospheric pressure sensor.

The atmospheric pressure capability base attributes of the atmospheric pressure sensor may include a maximum value (maxValue), a minimum value (minValue), and a location.

The maxValue denotes a maximum value measurable by the atmospheric pressure sensor using a unit of atmospheric pressure, for example, hectopascal (hPa).

The minValue denotes a minimum value measurable by the atmospheric pressure sensor using a unit of atmospheric pressure, for example, hPa.

The location denotes a location of the atmospheric pressure sensor. For example, the location of the atmospheric pressure sensor may be expressed using the global coordinate according to the x-axis, the y-axis, and the z-axis.

Table 15-2 shows binary encoding syntax that converts the atmospheric pressure sensor capability type from the XML format to the binary format.

TABLE 15-2

| AtmosphericPressureSensorCapabilityType { | Number of bits | Mnemonic |
|---|---|---|
| locationFlag | 1 | Bslbf |
| SensorCapabilityBase | | SensorCapabilityBaseType |
| if(locationFlag){ | | |
| location | | Float3DVectorType |
| } | | |
| } | | |

Table 15-3 shows descriptor components semantics of the atmospheric pressure sensor capability type according to the example embodiments.

TABLE 15-3

| Names | Description |
|---|---|
| AtmosphericPressureSensorCapabilityType | Tool for describing an atmospheric pressure sensor capability. |
| locationFlag | This field, which is only present in the binary representation, signals the presence of the activation attribute. A value of "1" means the attribute shall be used and "0" means the attribute shall not be used. |
| SensorCapabilityBase | SensorCapabilityBaseType extends dia: TerminalCapabilityBaseType and provides a base abstract type for a subset of types defined as part of the sensor device capability metadata types. For |

Table 16 shows sensor capability related to a velocity sensor using the XML format. However, a program source shown in Table 16 is only an example embodiment, and thus, the present disclosure is not limited thereto.

TABLE 16

```
<!-- ################################################### -->
<!-- Velocity Sensor capability type                 -->
<!-- ################################################### -->
<complexType name="VelocitySensorCapabilityType">
    <complexContent>
        <extension base="scdv:SensorCapabilityBaseType">
        </extension>
    </complexContent>
</complexType>
```

A velocity sensor capability type is a tool for describing the sensor capability of the velocity sensor.

The velocity sensor capability type may include sensor capability base attributes of the velocity sensor.

The velocity capability base attributes of the velocity sensor may include a maximum value (maxValue) and a minimum value (minValue).

The maxValue denotes a maximum value measurable by the velocity sensor using a unit of velocity, for example, m/s.

The minValue denotes a minimum value measurable by the velocity sensor using a unit of velocity, for example, m/s.

Table 16-2 shows binary encoding syntax that converts the velocity sensor capability type from the XML format to the binary format.

TABLE 16-2

| VelocitySensorCapabilityType { | Number of bits | Mnemonic |
|---|---|---|
| SensorCapabilityBase<br>} | | SensorCapabilityBaseType |

Table 16-3 shows descriptor components semantics of the velocity sensor capability type according to the example embodiments.

TABLE 16-3

| Names | Description |
|---|---|
| VelocitySensorCapabilityType | Tool for describing a velocity sensor capability. |
| SensorCapabilityBase | SensorCapabilityBaseType extends dia:TeminalCapabilityBaseType and provides a base abstract type for a subset of types defined as part of the sensor device capability metadata types. For details of dia: TerminalCapabilityBaseType, refer to the Part 7 of ISO/IEC 21000. |

Table 17 shows sensor capability related to an angular velocity sensor using the XML format. However, a program source shown in Table 17 is only an example embodiment, and thus, the present disclosure is not limited thereto.

TABLE 17

```
<!-- ################################################### -->
<!-- Angular Velocity Sensor capability type         -->
<!-- ################################################### -->
<complexType name="AngularVelocitySensorCapabilityType">
    <complexContent>
        <extension base="scdv:SensorCapabilityBaseType">
        </extension>
    </complexContent>
</complexType>
```

An angular velocity sensor capability type is a tool for describing the sensor capability related to the angular velocity sensor.

The angular velocity sensor capability type may include sensor capability base attributes related to the angular velocity sensor.

The angular velocity capability base attributes related to the angular velocity sensor may include a maximum value (maxValue) and a minimum value (minValue).

The maxValue denotes a maximum value measurable by the angular velocity sensor using a unit of angular velocity, for example, radian/s.

The minValue denotes a minimum value measurable by the angular velocity sensor using a unit of angular velocity, for example, radian/s.

Table 17-2 shows binary encoding syntax that converts the angular velocity sensor capability type from the XML format to the binary format.

TABLE 17-2

| AngularVelocitySensorCapabilityType { | Number of bits | Mnemonic |
|---|---|---|
| SensorCapabilityBase<br>} | | SensorCapabilityBaseType |

Table 17-3 shows descriptor components semantics of the angular velocity sensor capability type according to the example embodiments.

TABLE 17-3

| Names | Description |
|---|---|
| AngularVelocitySensorCapabilityType | Tool for describing an angular velocity sensor capability. |
| SensorCapabilityBase | SensorCapabilityBaseType extends dia:TeminalCapabilityBaseType and provides a base abstract type for a subset of types defined as part of the sensor device capability metadata types. For details of dia: TerminalCapabilityBaseType, refer to the Part 7 of ISO/IEC 21000, |

Table 18 shows sensor capability related to an angular acceleration sensor using the XML format. However, a program source shown in Table 18 is only an example embodiment, and thus, the present disclosure is not limited thereto.

TABLE 18

```
<!-- ################################################## -->
<!-- Angular Acceleration Sensor capability type       -->
<!-- ################################################## -->
<complexType name="AngularAccelerationSensorCapabilityType">
    <complexContent>
        <extension base="scdv:SensorCapabilityBaseType">
        </extension>
    </complexContent>
</complexType>
```

An angular acceleration sensor capability type is a tool for describing the sensor capability related to the angular acceleration sensor.

The angular acceleration sensor capability type may include sensor capability base attributes related to the angular acceleration sensor.

The angular acceleration capability base attributes related to the angular acceleration sensor may include a maximum value (maxValue) and a minimum value (minValue).

The maxValue denotes a maximum value measurable by the angular acceleration sensor using a unit of angular acceleration, for example, radian/s2.

The minValue denotes a minimum value measurable by the angular acceleration sensor using a unit of angular acceleration, for example, radian/s2.

Table 18-2 shows binary encoding syntax that converts the angular acceleration sensor capability type from the XML format to the binary format.

TABLE 18-2

| AngularAccelerationSensorCapabilityType { | Number of bits | Mnemonic |
|---|---|---|
| SensorCapabilityBase | | SensorCapability-BaseType |
| } | | |

Table 18-3 shows descriptor components semantics of the angular acceleration sensor capability type according to the example embodiments.

TABLE 18-3

| Names | Description |
|---|---|
| AngularAccelerationSensorCapabilityType | Tool for describing an angular acceleration sensor capability. |
| SensorCapabilityBase | SensorCapabilityBaseType extends dia: TeminalCapabilityBaseType and provides a base abstract type for a subset of types defined as part of the sensor device capability metadata types. For details of dia: TerminalCapabilityBaseType, refer to the Part 7 of ISO/IEC 21000. |

Table 19 denotes sensor capability related to a force sensor type using the XML format. However, a program source shown in Table 19 is only an example embodiment, and thus, the present disclosure is not limited thereto.

TABLE 19

```
<!-- ################################################## -->
<!-- Force Sensor capability type                      -->
<!-- ################################################## -->
<complexType name="ForceSensorCapabilityType">
    <complexContent>
        <extension base="scdv:SensorCapabilityBaseType">
        </extension>
```

TABLE 19-continued

```
    </complexContent>
</complexType>
```

A force sensor capability type is a tool for describing the sensor capability related to the force sensor.

The force sensor capability type may include sensor capability base attributes related to the force sensor.

The force capability base attributes related to the force sensor may include a maximum value (maxValue) and a minimum value (minValue).

The maxValue denotes a maximum value measurable by the force sensor using a unit of force, for example, Newton (N).

The minValue denotes a minimum value measurable by the force sensor using a unit of force, for example, N.

Table 19-2 shows binary encoding syntax that converts the force sensor capability type from the XML format to the binary format.

TABLE 19-2

| ForceSensorCapabilityType { | Number of bits | Mnemonic |
|---|---|---|
| SensorCapabilityBase | | SensorCapabilityBaseType |
| } | | |

Table 19-3 shows descriptor components semantics of the force sensor capability type according to the example embodiments.

TABLE 19-3

| Names | Description |
|---|---|
| ForceSensorCapabilityType | Tool for describing a force sensor capability. |
| SensorCapabilityBase | SensorCapabilityBaseType extends dia: TeminalCapabilityBaseType and provides a base abstract type for a subset of types defined as part of the sensor device capability metadata types. For details of dia: TerminalCapabilityBaseType, refer to the Part 7 of ISO/IEC 21000. |

Table 20 denotes a sensor adaptation preference related to a torque sensor type using the XML format. However, a program source shown in Table 20 is only an example embodiment, and thus, the present disclosure is not limited thereto.

TABLE 20

```
<!-- ################################################## -->
<!-- Torque Sensor capability type                     -->
<!-- ################################################## -->
<complexType name="TorqueSensorCapabilityType">
    <complexContent>
        <extension base="scdv:SensorCapabilityBaseType">
        </extension>
    </complexContent>
</complexType>
```

A torque sensor capability type is a tool for describing the sensor capability related to the torque sensor.

The torque sensor capability type may include sensor capability base attributes related to the torque sensor.

The torque capability base attributes related to the torque sensor may include a maximum value (maxValue), a minimum value (minValue), and a location.

The maxValue denotes a maximum value measurable by the torque sensor using a unit of torque, for example, Newton millimeter (N-mm).

The minValue denotes a minimum value measurable by the torque sensor using a unit of torque, for example, N-mm.

The location denotes a location of the torque sensor. For example, the location of the torque sensor may be expressed using the global coordinate according to the x-axis, the y-axis, and the z-axis.

Table 20-2 shows binary encoding syntax that converts the torque sensor capability type from the XML format to the binary format.

TABLE 20-2

| TorqueSensorCapabilityType { | Number of bits | Mnemonic |
|---|---|---|
| SensorCapabilityBase } | | SensorCapabilityBaseType |

Table 20-3 shows descriptor components semantics of the torque sensor capability type, according to the example embodiments.

TABLE 20-3

| Names | Description |
|---|---|
| TorqueSensorCapabilityType | Tool for describing a torque sensor capability. |
| SensorCapabilityBase | SensorCapabilityBaseType extends dia:TeminalCapabilityBaseType and provides a base abstract type for a subset of types defined as part of the sensor device capability metadata types. For details of dia: TerminalCapabilityBaseType, refer to the Part 7 of ISO/IEC 21000. |

Table 21 shows sensor capability related to a pressure sensor using the XML format. However, a program source shown in Table 21 is only an example embodiment, and thus, the present disclosure is not limited thereto.

TABLE 21

```
<!-- ################################################## -->
<!-- Pressure Sensor capability type              -->
<!-- ################################################## -->
<complexType name="PressureSensorCapabilityType">
    <complexContent>
        <extension base="scdv:SensorCapabilityBaseType">
        </extension>
    </complexContent>
</complexType>
```

A pressure sensor capability type is a tool for describing the sensor capability related to the pressure sensor.

The pressure sensor capability type may include sensor capability base attributes related to the pressure sensor.

The pressure capability base attributes related to the pressure sensor may include a maximum value (maxValue), a minimum value (minValue), and a location.

The maxValue denotes a maximum value measurable by the pressure sensor using a unit of pressure, for example, Pascal (Pa).

The minValue denotes a minimum value measurable by the pressure sensor using a unit of pressure, for example, Pa.

The location denotes a location of the pressure sensor. For example, the location of the pressure sensor may be expressed using the global coordinate according to the x-axis, the y-axis, and the z-axis.

Table 21-2 shows binary encoding syntax that converts the pressure sensor capability type from the XML format to the binary format.

TABLE 21-2

| PressureSensorCapabilityType { | Number of bits | Mnemonic |
|---|---|---|
| SensorCapabilityBase } | | SensorCapabilityBaseType |

Table 21-3 shows descriptor components semantics of the pressure sensor capability type according to the example embodiments.

TABLE 21-3

| Names | Description |
|---|---|
| PressureSensorCapabilityType | Tool for describing a pressure sensor capability. |
| SensorCapabilityBase | SensorCapabilityBaseType extends dia:TeminalCapabilityBaseType and provides a base abstract type for a subset of types defined as part of the sensor device capability metadata types. For details of dia: TerminalCapabilityBaseType, refer to the Part 7 of ISO/IEC 21000. |

Hereinafter, the sensor adaptation preference will be described in detail.

The sensor adaptation preference denotes information for manipulating a value received from a sensor.

A sensor adaptation preference base type denotes a base type of manipulation information of the user. Depending on embodiments, the sensor adaptation preference base type may be a base abstract type of the metadata related to a sensor adaptation preference commonly applied to all types of sensors, as part of metadata types related to the sensor adaptation preference.

Hereinafter, the sensor adaptation preference and the sensor adaptation preference base type will be described in detail with reference to FIGS. 15 through 17.

Figure 15:
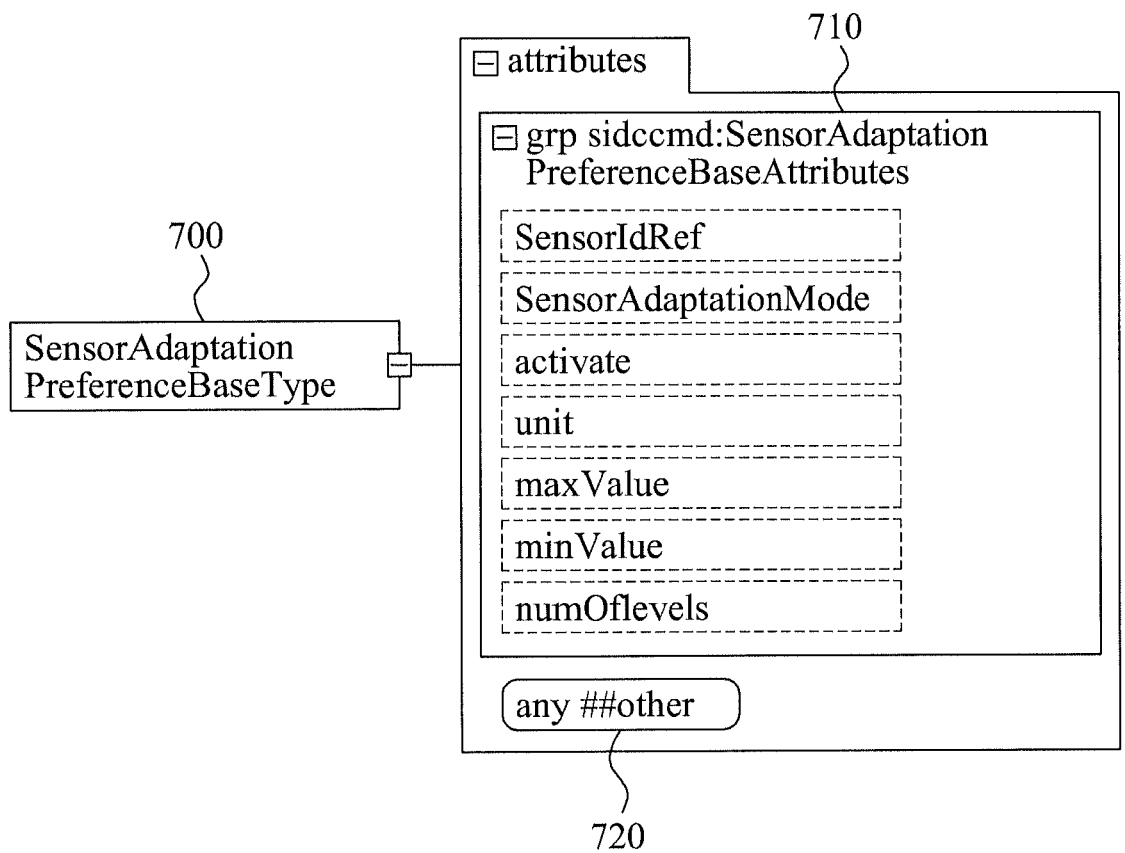
FIG. 15 illustrates a sensor adaptation preference base type, according to example embodiments.

FIG. 15 illustrates a sensor adaptation preference base type 700 according to example embodiments.

Referring to FIG. 15, the sensor adaptation preference base type 700 may include sensor adaptation preference base attributes 710 and any other attributes 720.

The sensor adaptation preference base attributes 710 denote a group of sensor adaptation preferences basically included in the sensor adaptation preference base type 700.

The any other attributes 720 denote a group of additional sensor adaptation preferences. The any other attributes 720 may be unique additional sensor capabilities which are applicable to an arbitrary sensor. The any other attributes 420 may allow for the inclusion of any other attributes defined within a namespace other than the target namespace.

FIG. 16 illustrates syntax 800 of a sensor adaptation preference base type, according to example embodiments.

Referring to FIG. 16, the syntax of the sensor adaptation preference base type may include a diagram 810, attributes 820, and a source 830.

The diagram 810 may include a diagram of the sensor adaptation preference base type.

The attributes 820 may include sensor adaptation preference base attributes and any attributes.

The source 830 may be a program representing the sensor adaptation preference base type using an XML format. However, the source 830 shown in FIG. 16 is suggested by way of example, and thus, the present disclosure is not limited thereto.

FIG. 17 illustrates syntax 900 of sensor adaptation preference base attributes, according to example embodiments.

Referring to FIG. 17, the syntax 900 of the sensor adaptation preference base attributes may include a diagram 910, attributes 920, and a source 930.

The diagram 910 may include a diagram of the sensor adaptation preference base attributes.

The attributes 920 may include a sensor reference identifier (ID) 901, a sensor adaptation mode 902, an activation state 903, a unit 904, a maximum value 905, a minimum value 906, and a number of levels 907.

The sensor reference ID 901 denotes information referencing an ID of an individual sensor that generates specific sensed information.

The sensor adaptation mode 902 denotes user preference information related to a method of adapting a sensor. Depending on embodiments, the sensor adaptation mode 902 may be a sensor adaptation preference related to an adaptation method that refines information on a motion, state, intention, shape, and the like of a user of a real world, measured through the sensor, and reflects the information to a virtual world. For example, a 'strict' value may denote a user preference that directly applies sensed information of the real world to the virtual world. A 'scalable' value may denote a user preference that varies the sensed information of the real world according to the user preference and applies the sensed information to the virtual world.

The activation state information 903 denotes information on whether to activate the sensor in the virtual world. Depending on embodiments, the activation state information 903 may be a sensor adaptation preference that determines whether the sensor is in operation.

The unit 904 denotes a unit of a value used in the virtual world. For example, the unit 904 may be a pixel. Also, the unit 904 may be a unit of a value corresponding to the value received from the sensor.

The maximum value 905 and the minimum value 906 denote a maximum value and a minimum value used in the virtual world, respectively. Depending on embodiments, the maximum value 905 and the minimum value 906 may be the unit of the value corresponding to the value received from the sensor.

The number of levels 907 denotes a number of levels used in the virtual world. Depending on embodiments, the number of levels 907 may be a value for dividing levels between the maximum value and the minimum used in the virtual world.

The sensor reference ID 901, the adaptation mode 902, the activation state 903, the unit 904, the maximum value 905, the minimum value 906, and the number of levels 907, as the sensor adaptation preference base attributes, may be rearranged as shown in Table 22.

TABLE 22

| Name | Definition |
|---|---|
| SensorIdRef 901 | Refers the Id of an individual sensor that has generated the specific sensed information |
| Sensor adaptation mode 902 | the user's preference on the adaptation method for the virtual world effect |
| Activate 903 | whether the effect shall be activated. A value of true means the effect shall be activated and false means the effect shall be deactivated |

TABLE 22-continued

| Name | Definition |
|---|---|
| Unit 904 | the unit of value |
| maxValue 905 | the maximum desirable value of the effect in percentage according to the max scale defined within the semantics definition of the individual effects |
| minValue 906 | the minimum desirable value of the effect in percentage according to the min scale defined within the semantics definition of the individual effects |
| numOflevels 907 | the number of value levels that the device can provide in between maximum and minimum value |

The source 930 may be a program representing the sensor adaptation preference base attributes using the XML.

A reference numeral 931 defines the activation state 903 using the XML format. According to the reference numeral 931, the activation state 903 has "boolean" type data and is optionally used.

A reference numeral 932 defines the maximum value 905 using the XML format. According to the reference numeral 932, the maximum value 905 has "float" type data and is optionally used.

A reference number 933 defines minimum value 906 using the XML format. According to the reference numeral 933, the minimum value 906 has "float" type data and is optionally used.

A reference numeral 934 defines the number of levels 907 using the XML. According to the reference numeral 934, the number of levels 907 has "nonNegativeInteger" type data and is optionally used.

However, the source 930 illustrated in FIG. 17 is only an example embodiment, and thus, the present disclosure is not limited thereto.

Hereinafter, the sensor adaptation preference will be described in relation to specific embodiments of the sensor.

Table 23 denotes a sensor adaptation preference related to a position sensor using the XML format. However, a program source shown in Table 23 is only an example embodiment, and thus, the present disclosure is not limited thereto.

TABLE 23

```
<!-- ############################################### -->
<!-Position Sensor Preference type             -->
<!-- ############################################### -->
<complexType name="PositionSensorPrefType">
    <complexContent>
        <extension base="scdv:SensorCapabilityBaseType">
            <sequence>
                <element name="range" type="scdv:RangeType"/>
            </sequence>
        </extension>
    </complexContent>
</complexType>
```

A position sensor type is a tool for describing the sensor adaptation preference related to the position sensor.

A position sensor capability type may include sensor adaptation preference base attributes related to the position sensor.

The sensor adaptation preference base attributes related to the position sensor may include a range and a number of levels.

The range denotes a range of a user preference with respect to position information measured by the position sensor.

The number of levels denotes a number of levels of the user preference with respect to the position information measured by the position sensor.

Table 24 denotes a sensor adaptation preference related to an orientation sensor using the XML format. However, a program source shown in Table 24 is only an example embodiment, and thus, the present disclosure is not limited thereto.

TABLE 24

```
<!-- ############################################## -->
<!-- Orientation Sensor Preference type          -->
<!-- ############################################## -->
<complexType name="OrientationSensorPrefType">
    <complexContent>
        <extension base=cid:SensorCapabilityBaseType/>
    <sequence>
                <element name="orientationrange"
type="scdv:OrientationRangeType"/>
                </sequence>
    </extension>
    </complexContent>
</complexType>
```

An orientation sensor type is a tool for describing the sensor adaptation preference related to the orientation sensor.

An orientation sensor capability type may include sensor adaptation preference base attributes related to the orientation sensor.

The sensor adaptation preference base attributes related to the orientation sensor may include an orientation range and a number of levels.

The orientation range denotes a range of a user preference with respect to orientation information measured by the orientation sensor.

The number of levels denotes a number of levels of the user preference with respect to the orientation information measured by the orientation sensor.

Table 25 denotes a sensor adaptation preference related to an acceleration sensor using the XML format. However, a program source shown in Table 25 is only an example embodiment, and thus, the present disclosure is not limited thereto.

TABLE 25

```
<!-- ############################################## -->
<!-- Acceleration Sensor Preference type          -->
<!-- ############################################## -->
<complexType name="AccelerationSensorPrefType">
    <complexContent>
        <extension base=cid:SensorCapabilityBaseType/>
    </complexContent>
</complexType>
```

An acceleration sensor type is a tool for describing the sensor adaptation preference related to the acceleration sensor.

An acceleration sensor capability type may include sensor adaptation preference base attributes related to the acceleration sensor.

The sensor adaptation preference base attributes related to the acceleration sensor may include a maximum value, a minimum value, and a number of levels.

The maximum value denotes a maximum value of a user preference related to acceleration information measured by the acceleration sensor.

The minimum value denotes a minimum value of the user preference related to the acceleration information measured by the acceleration sensor.

The number of levels denotes a number of levels of the user preference with respect to the acceleration information measured by the acceleration sensor.

Table 26 denotes a sensor adaptation preference related to a light sensor using the XML format. However, a program source shown in Table 26 is only an example embodiment, and thus, the present disclosure is not limited thereto.

TABLE 26

```
<!-- ############################################## -->
<!-- Light Sensor Preference type                -->
<!-- ############################################## -->
<complexType name="LightSensorPrefType">
    <complexContent>
        <extension base="scdv:UserSensorPreferenceBaseType">
            <sequence>
                <element name="color" type="scdv:colorType"
                    minOccurs="0"
                                maxOccurs="unbounded"/>
            </sequence>
        </extension>
    </complexContent>
</complexType>
```

A light sensor type is a tool for describing the sensor adaptation preference related to the light sensor.

A light sensor capability type may include sensor adaptation preference base attributes related to the light sensor.

The sensor adaptation preference base attributes related to the light sensor may include a maximum value, a minimum value, a number of levels, and an unfavorable color.

The maximum value denotes a maximum value of a user preference related to a value measured by the light sensor.

The minimum value denotes a minimum value of the user preference related to a value measured by the light sensor.

The number of levels denotes a number of levels of the user preference with respect to a value measured by the light sensor.

The unfavorable color denotes a list of unfavorable colors of the user, as RGB color values or a classification reference, for example.

Table 27 denotes a sensor adaptation preference related to a sound sensor using the XML format. However, a program source shown in Table 27 is only an example embodiment, and thus, the present disclosure is not limited thereto.

TABLE 27

```
<!--########################-->
<!-- USIPV Sound Sensor type            -->
<!--########################-->
<complexType name="SoundSensorType">
    <complexContent>
        <extension base="usip:PreferenceBaseType"/>
    </complexContent>
</complexType>
```

A sound sensor type is a tool for describing the sensor adaptation preference related to the sound sensor.

A sound sensor capability type may include sensor adaptation preference base attributes related to the sound sensor.

The sensor adaptation preference base attributes related to the sound sensor may include a maximum value and a minimum value.

The maximum value denotes a maximum value allowed by the user as a measured value of the sound sensor.

The minimum value denotes a minimum value allowed by the user as a measured value of the sound sensor.

Table 28 denotes a sensor adaptation preference related to a temperature sensor using the XML format. However, a program source shown in Table 28 is only an example embodiment, and thus, the present disclosure is not limited thereto.

TABLE 28

```
###############################################-->
<!-- Temperature Sensor Preference type           -->
######################################################-->
<complexType name="TemperatureSensorPrefType">
    <complexContent>
        <extension base="scdv:UserSensorPreferenceBaseType"/>
    </complexContent>
</complexType>
```

A temperature sensor type is a tool for describing the sensor adaptation preference related to the temperature sensor.

A temperature sensor capability type may include sensor adaptation preference base attributes related to the temperature sensor.

The sensor adaptation preference base attributes related to the temperature sensor may include a maximum value, a minimum value, and a number of levels.

The maximum value denotes a maximum value of a user preference related to temperature information measured by the temperature sensor.

The minimum value denotes a minimum value of the user preference related to the temperature information measured by the temperature sensor.

The number of levels denotes a number of levels of the user preference with respect to the temperature information measured by the temperature sensor.

Table 29 denotes a sensor adaptation preference related to a humidity sensor using the XML format. However, a program source shown in Table 29 is only an example embodiment, and thus, the present disclosure is not limited thereto.

TABLE 29

```
###############################################-->
<!-- Humidity Sensor Preference type              -->
######################################################-->
<complexType name="HumiditySensorPrefType">
    <complexContent>
        <extension base="scdv:UserSensorPreferenceBaseType"/>
    </complexContent>
</complexType>
```

A humidity sensor type is a tool for describing the sensor adaptation preference related to the humidity sensor.

A humidity sensor capability type may include sensor adaptation preference base attributes related to the humidity sensor.

The sensor adaptation preference base attributes related to the humidity sensor may include a maximum value, a minimum value, and a number of levels.

The maximum value denotes a maximum value of a user preference related to humidity information measured by the humidity sensor.

The minimum value denotes a minimum value of the user preference related to the humidity information measured by the humidity sensor.

The number of levels denotes a number of levels of the user preference with respect to the humidity information measured by the humidity sensor.

Table 30 denotes a sensor adaptation preference related to a distance sensor using the XML format. However, a program source shown in Table 30 is only an example embodiment, and thus, the present disclosure is not limited thereto.

TABLE 30

```
###############################################-->
<!-- Distance Sensor Preference type              -->
######################################################-->
<complexType name="DistanceSensorPrefType">
    <complexContent>
        <extension base="scdv:UserSensorPreferenceBaseType"/>
    </complexContent>
</complexType>
```

A distance sensor type is a tool for describing the sensor adaptation preference related to the distance sensor.

A distance sensor capability type may include sensor adaptation preference base attributes related to the distance sensor.

The sensor adaptation preference base attributes related to the distance sensor may include a maximum value, a minimum value, and a number of levels.

The maximum value denotes a maximum value of a user preference related to length information measured by the distance sensor.

The minimum value denotes a minimum value of the user preference related to the length information measured by the distance sensor.

The number of levels denotes a number of levels of the user preference with respect to the length information measured by the distance sensor.

Table 31 denotes a sensor adaptation preference related to a motion sensor using the XML format. However, a program source shown in Table 31 is only an example embodiment, and thus, the present disclosure is not limited thereto.

TABLE 31

```
###############################################-->
<!- Motion Sensor Preference type                 -->
######################################################-->
    <complexType name="MotionSensorPrefType">
        <sequence>
            <element name="positionpreference" type=
"scdv:PositionSensorPrefType" minOccurs="0"/>
            <element name="orientationpreference" type=
"scdv:OrientationSensorPrefType" minOccurs="0"/>
            <element name="velocitypreference" type=
"scdv:VelocitySensorPrefType" minOccurs="0"/>
            <element name="angularvelocitypreference"
type="scdv:AngularVelocitySensorPrefType" minOccurs="0"/>
            <element name="accelerationpreference"
type="scdv:AccelerationSensorPrefType" minOccurs="0"/>
            <element name="angularaccelerationpreference"
type="scdv:AngularAccelerationSensorPrefType" minOccurs="0"/>
        </sequence>
    </complexType>
```

A motion sensor capability type is a tool for describing the sensor adaptation preference related to the motion sensor.

The motion sensor capability type may include sensor adaptation preference base attributes related to the motion sensor.

The sensor adaptation preference base attributes related to the motion sensor may include a position preference, a velocity preference, an acceleration preference, an orientation preference, an angular velocity preference, and an angular acceleration preference.

The position preference denotes a user preference with respect to the position.

The velocity preference denotes a user preference with respect to the velocity.

The acceleration preference denotes a user preference with respect to the acceleration.

The orientation preference denotes a user preference with respect to the orientation.

The angular velocity preference denotes a user preference with respect to the angular velocity.

The angular acceleration preference denotes a user preference with respect to the angular acceleration.

Table 32 denotes a sensor adaptation preference related to an intelligent camera sensor using the XML format. However, a program source shown in Table 32 is only an example embodiment, and thus, the present disclosure is not limited thereto.

TABLE 32

```
<!-- ############################################### -->
<!-- Intelligent Camera Preference Type               -->
<!-- ############################################### -->
<complexType name="IntelligentCameraPreferenceType">
    <complexContent>
        <extension base="scdv:SensorAdaptationPreferenceBaseType">
            <sequence>
                <element name="FaceFeatureTrackingOn" type="boolean" minOccurs="0"/>
                <element name="BodyFeatureTrackingOn" type="boolean" minOccurs="0"/>
                <element name="FacialExpressionTrackingOn" type="boolean" minOccurs="0"/>
                <element name="GestureTrackingOn" type="boolean" minOccurs="0"/>
                <element name="FacialFeatureMask" type="scdv:FacialFeatureMaskType"/>
                <element name="BodyFeatureMask" type="scdv:BodyFeatureMaskType"/>
            </sequence>
        </extension>
    </complexContent>
</complexType>
<complexType name="FacialFeatureMaskType">
    <sequence>
        <element name="Eyes" type="boolean"/>
<element name="Mouth" type="boolean"/>
<element name="Nose" type="boolean"/>
<element name="Ears" type="boolean"/>
    </sequence>
</complexType>
<complexType name="BodyFeatureMaskType">
    <sequence>
        <element name="Head" type="boolean"/>
        <element name="Arms" type="boolean"/>
<element name="Hands" type="boolean"/>
        <element name="Legs" type="boolean"/>
        <element name="Feet" type="boolean"/>
<element name="MiddleBody" type="boolean"/>
    </sequence>
</complexType>
```

An intelligent camera sensor capability type is a tool for describing the sensor adaptation preference related to the intelligent camera sensor.

The intelligent camera sensor capability type may include sensor adaptation preference base attributes related to the intelligent camera sensor.

The sensor adaptation preference base attributes related to the intelligent camera sensor may include a face feature tracking on, a body feature tracking on, a facial expression tracking on, a gesture tracking on, a face tracking map, and a body tracking map.

The 'face feature tracking on' denotes information regarding whether to activate a face feature tracking mode in which an intelligent camera sensor tracks features on a face of the user.

The 'body feature tracking on' denotes information regarding whether to activate a body feature tracking mode in which the intelligent camera sensor tracks features on a body of the user.

The 'facial expression tracking on' denotes information regarding user preference with respect to tracking of a facial expression of the user by the intelligent camera sensor.

The 'gesture tracking on' denotes information regarding user preference with respect to tracking of a gesture of the user by the intelligent camera sensor.

The face tracking map provides a Boolean map related to a face tracking map type. The Boolean map provides face portions that the user wants to track. Depending on embodiments, the Boolean map according to the face tracking map type may provide eyes, a mouth, a noise, and ears as the face portions.

The body tracking map provides a Boolean map related to a body tracking map type. The Boolean map provides body portions that the user wants to track. Depending on embodiments, the Boolean map according to the body tracking map type may provide a head, arms, hands, legs, feet, and a middle body as the body portions.

Table 33 denotes a sensor adaptation preference related to an ambient noise sensor using the XML format. However, a program source shown in Table 33 is only an example embodiment, and thus, the present disclosure is not limited thereto.

TABLE 33

```
<!-- ############################################### -->
<!-- Ambient Noise Sensor Preference type             -->
<!-- ############################################### -->
<complexType name="AmbientNoiseSensorPrefType">
    <complexContent>
        <extension base="scdv:UserSensorPreferenceBaseType"/>
    </complexContent>
</complexType>
```

An ambient noise sensor type is a tool for describing the sensor adaptation preference related to the ambient noise sensor.

An ambient noise sensor capability type may include sensor adaptation preference base attributes related to the ambient noise sensor.

The sensor adaptation preference base attributes related to the ambient noise sensor may include a maximum value, a minimum value, and a number of levels.

The maximum value denotes a maximum value of a user preference with respect to ambient noise information measured by the ambient noise sensor.

The minimum value denotes a minimum value of the user preference with respect to the ambient noise information measured by the ambient noise sensor.

The number of levels denotes a number of levels of the user preference with respect to the ambient noise information measured by the ambient noise sensor.

Table 34 denotes a sensor adaptation preference related to an atmospheric pressure sensor using the XML format. However, a program source shown in Table 34 is only an example embodiment, and thus, the present disclosure is not limited thereto.

TABLE 34

```
<!-- ############################################### -->
<!-- Atmospheric Pressure Sensor Preference type      -->
<!-- ############################################### -->
<complexType name="AtmosphericPressureSensorPrefType">
    <complexContent>
        <extension base=" scdv:UserSensorPreferenceBaseType"/>
    </complexContent>
</complexType>
```

An atmospheric pressure sensor type is a tool for describing the sensor adaptation preference related to the atmospheric pressure sensor.

An atmospheric pressure sensor capability type may include sensor adaptation preference base attributes related to the atmospheric pressure sensor.

The sensor adaptation preference base attributes related to the atmospheric pressure sensor may include a maximum value, a minimum value, and a number of levels.

The maximum value denotes a maximum value of a user preference with respect to atmospheric pressure information measured by the atmospheric pressure sensor.

The minimum value denotes a minimum value of the user preference with respect to the atmospheric pressure information measured by the atmospheric pressure sensor.

The number of levels denotes a number of levels of the user preference with respect to the atmospheric pressure information measured by the atmospheric pressure sensor.

Table 35 denotes a sensor adaptation preference related to a velocity sensor using the XML format. However, a program source shown in Table 35 is only an example embodiment, and thus, the present disclosure is not limited thereto.

TABLE 35

```
<!-- ################################################ -->
<!-- Velocity Sensor Preference type         -->
<!-- ################################################ -->
<complexType name="VelocitySensorPrefType">
    <complexContent>
        <extension base=cid:SensorCapabilityBaseType/>
    </complexContent>
</complexType>
```

A velocity sensor type is a tool for describing the sensor adaptation preference related to the velocity sensor.

A velocity sensor capability type may include sensor adaptation preference base attributes related to the velocity sensor.

The sensor adaptation preference base attributes related to the velocity sensor may include a maximum value, a minimum value, and a number of levels.

The maximum value denotes a maximum value of a user preference with respect to velocity information measured by the velocity sensor.

The minimum value denotes a minimum value of the user preference with respect to the velocity information measured by the velocity sensor.

The number of levels denotes a number of levels of the user preference with respect to the velocity information measured by the velocity sensor.

Table 36 denotes a sensor adaptation preference related to an angular velocity sensor using the XML format. However, a program source shown in Table 36 is only an example embodiment, and thus, the present disclosure is not limited thereto.

TABLE 36

```
<!-- ################################################ -->
<!-Angular Velocity Sensor Preference type   -->
<!-- ################################################ -->
<complexType name="AngularVelocitySensorPrefType">
    <complexContent>
        <extension base=cid:SensorCapabilityBaseType/>
    </complexContent>
</complexType>
```

An angular velocity sensor type is a tool for describing the sensor adaptation preference related to the angular velocity sensor.

An angular velocity sensor capability type may include sensor adaptation preference base attributes related to the angular velocity sensor.

The sensor adaptation preference base attributes related to the angular velocity sensor may include a maximum value, a minimum value, and a number of levels.

The maximum value denotes a maximum value of a user preference with respect to angular velocity information measured by the angular velocity sensor.

The minimum value denotes a minimum value of the user preference with respect to the angular velocity information measured by the angular velocity sensor.

The number of levels denotes a number of levels of the user preference with respect to the angular velocity information measured by the angular velocity sensor.

Table 37 denotes a sensor adaptation preference related to an angular acceleration sensor using the XML format. However, a program source shown in Table 37 is only an example embodiment, and thus, the present disclosure is not limited thereto.

TABLE 37

```
<!-- ################################################ -->
<!-- Angular Acceleration Sensor Preference type   -->
<!-- ################################################ -->
<complexType name="AngularAccelerationSensorPrefType">
    <complexContent>
        <extension base=cid:SensorCapabilityBaseType/>
    </complexContent>
</complexType>
```

An angular acceleration sensor type is a tool for describing the sensor adaptation preference related to the angular acceleration sensor.

An angular acceleration sensor capability type may include sensor adaptation preference base attributes related to the angular acceleration sensor.

The sensor adaptation preference base attributes related to the angular acceleration sensor may include a maximum value, a minimum value, and a number of levels.

The maximum value denotes a maximum value of a user preference with respect to angular acceleration information measured by the angular acceleration sensor.

The minimum value denotes a minimum value of the user preference with respect to the angular acceleration information measured by the angular acceleration sensor.

The number of levels denotes a number of levels of the user preference with respect to the angular acceleration information measured by the angular acceleration sensor.

Table 38 denotes a sensor adaptation preference related to a force sensor using the XML format. However, a program source shown in Table 38 is only an example embodiment, and thus, the present disclosure is not limited thereto.

TABLE 38

```
<!-- ################################################ -->
<!-- Force Sensor Preference type Preference type   -->
<!-- ################################################ -->
<complexType name="ForceSensorPrefType">
    <complexContent>
        <extension base="scdv:SensorCapabilityBaseType">
        </extension>
    </complexContent>
</complexType>
```

A force sensor type is a tool for describing the sensor adaptation preference related to the force sensor.

A force sensor capability type may include sensor adaptation preference base attributes related to the force sensor.

The sensor adaptation preference base attributes related to the force sensor may include a maximum value, a minimum value, and a number of levels.

The maximum value denotes a maximum value of a user preference with respect to force information measured by the force sensor.

The minimum value denotes a minimum value of the user preference with respect to the force information measured by the force sensor.

The number of levels denotes a number of levels of the user preference with respect to the force information measured by the force sensor.

Table 39 denotes a sensor adaptation preference related to a torque sensor using the XML format. However, a program source shown in Table 39 is only an example embodiment, and thus, the present disclosure is not limited thereto.

TABLE 39

```
<!-- ############################################ -->
<!-- Torque Sensor Preference type Preference type   -->
<!-- ############################################ -->
<complexType name="ForceSensorPrefType">
    <complexContent>
        <extension base="scdv:SensorCapabilityBaseType">
        </extension>
    </complexContent>
</complexType>
```

A torque sensor type is a tool for describing the sensor adaptation preference related to the torque sensor.

A torque sensor capability type may include sensor adaptation preference base attributes related to the torque sensor.

The sensor adaptation preference base attributes related to the torque sensor may include a maximum value, a minimum value, and a number of levels.

The maximum value denotes a maximum value of a user preference with respect to torque information measured by the torque sensor.

The minimum value denotes a minimum value of the user preference with respect to the torque information measured by the torque sensor.

The number of levels denotes a number of levels of the user preference with respect to the torque information measured by the torque sensor.

Table 40 denotes a sensor adaptation preference related to a pressure sensor using the XML format. However, a program source shown in Table 40 is only an example embodiment, and thus, the present disclosure is not limited thereto.

TABLE 40

```
<!-- ############################################ -->
<!-- Pressure Sensor Preference type               -->
<!-- ############################################ -->
<complexType name="PressureSensorPrefType">
    <complexContent>
        <extension base="scdv:SensorCapabilityBaseType">
        </extension>
    </complexContent>
</complexType>
```

A pressure sensor type is a tool for describing the sensor adaptation preference related to the pressure sensor.

A pressure sensor capability type may include sensor adaptation preference base attributes related to the pressure sensor.

The sensor adaptation preference base attributes related to the pressure sensor may include a maximum value, a minimum value, and a number of levels.

The maximum value denotes a maximum value of a user preference with respect to pressure information measured by the pressure sensor.

The minimum value denotes a minimum value of the user preference with respect to the pressure information measured by the pressure sensor.

The number of levels denotes a number of levels of the user preference with respect to the pressure information measured by the pressure sensor.

The virtual world processing apparatus according to the example embodiments may include sensed information.

The sensed information denotes a command for controlling the sensor. Depending on embodiments, the sensed information may be a command for controlling the sensor so as to reflect the information on the motion, state, intention, shape, and the like of the user of the real world, measured through the sensor, to the virtual world.

Depending on embodiments, the sensed information may serve as a root element for sensed information metadata.

Hereinafter, the sensed information will be described in detail with reference to FIG. 18.

Figure 18:
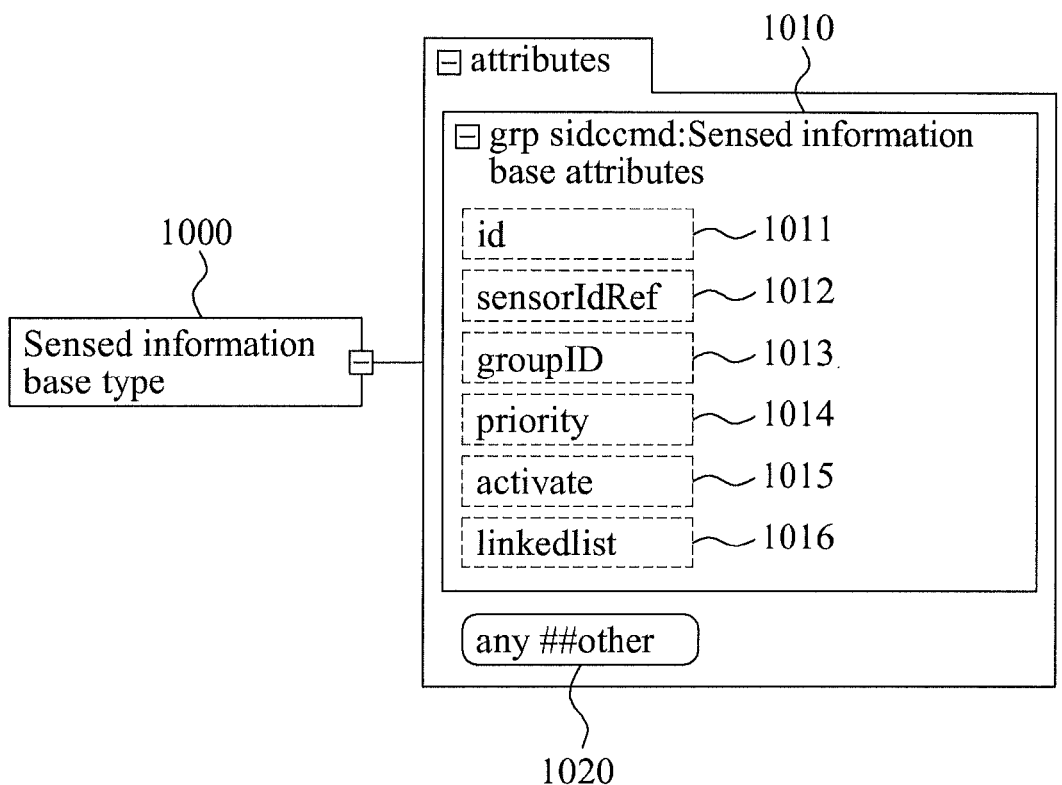
FIG. 18 illustrates a sensed information base type, according to example embodiments.

FIG. 18 illustrates a sensed information base type 1000 according to example embodiments.

Referring to FIG. 18, the sensed information base type 1000 may include sensed information base attributes 1010 and any other attributes 1020.

The sensed information base type 1000 may be a topmost type of a base type that may inherit an individual piece of the sensed information.

The sensed information base attributes 1010 denote a group of attributes for the commands.

The any other attributes 1020 denote a group of additional sensed information. The any other attributes 1020 may be unique additional sensed information applicable to an arbitrary sensor. The any other attributes 1020 may allow for the inclusion of any attributes defined within a namespace other than the target namespace.

Table 41 may be a program denoting a sensed information base type using the XML format. However, Table 41 is only an example embodiment, and thus, the present disclosure is not limited thereto.

TABLE 41

```
<!-- ############################################ -->
    <!-- Sensed information base type              -->
    <!-- ############################################ -->
    <complexType name="SensedInfoBaseType" abstract="true">
        <sequence>
            <element name="TimeStamp" type="mpegvct:TimeStampType"
            use="optional" />
        </sequence>
        <attributeGroup ref="iidl:SensedInfoBaseAttributes"/>
    </complexType>
```

Table 41-2 shows binary encoding syntax related to a sensed information base type, according to example embodiments.

TABLE 41-2

| SensedInfoBaseTypeType{ | (Number of bits) | Mnemonic |
|---|---|---|
| TimeStampFlag | 1 | bslbf |
| SensedInfoBaseAttributes |  | SensedInfoBaseAttributesType |
| If(TimeStampFlag){ |  |  |
|     TimeStamp |  | TimeStampType |
| } |  |  |
| } |  |  |

Table 41-3 shows descriptor components semantics of the sensed information base type according to the example embodiments.

TABLE 41-3

| Names | Description |
|---|---|
| SensedInfoBaseTypeType | Tool for describing sensed information base type. |
| TimeStampFlag | This field, which is only present in the binary representation, signals the presence of the timestamp element. A value of "1" means the timestamp shall be used and "0" means the timestamp shall not be used. |
| SensedInfoBaseAttributes | Provides the topmost type of the base type hierarchy which each individual sensed information can inherit. |
| TimeStamp | Provides the timing information for the sensed information to be executed. As defined in Part 6 of ISO/IEC 23005, there is a choice of selection among three timing schemes, which are absolute time, clock tick time, and delta of clock tick time |

The sensed information base attributes 1010 may include an ID 1011, a sensor reference ID 1012, a group ID 1013, a priority 1014, an activation state 1015, and a linked list 1016.

The ID 1011 denotes ID information for recognizing individual identity of the sensor.

The sensor reference ID 1012 may be information referencing an ID of the sensor that generates information included in particular sensed information.

The group ID 1013 denotes ID information for recognizing individual identity of a multi-sensor structure to which a particular sensor belongs.

The priority 1014 denotes information on a priority related to sensed information of sensors in the same group, the sensors sharing the same point at time when the sensed information is applied. Depending on embodiments, a value 1 may represent a highest priority and larger values may indicate lower priorities, however, the present disclosure is not limited thereto.

The activation state 1015 denotes information for determining whether the sensor is in operation.

The linked list 1016 denotes information on link data for grouping a plurality of sensors. Depending on embodiments, the linked list 1016 may be information on a multi-sensor structure for grouping the sensors by a method including reference information on IDs of neighboring sensors.

Depending on embodiments, the sensed information base attributes 1010 may further include a value, a timestamp, and a life span.

The value denotes a measured value of the sensor. The value may be received from the sensor.

The timestamp denotes information on a sensing time of the sensor.

The life span denotes information on a valid period of a sensor command. Depending on embodiments, the life span may be represented in units of seconds.

The sensed information base attributes including the ID 1011, the sensor ID reference 1012, the group ID 1013, the priority 1014, the activation state 1015, the linked list 1016, the value, the timestamp, and the lifespan may be rearranged as shown in Table 42.

TABLE 42

| Name | Definition |
|---|---|
| id 1011 | Individual identity of sensor |
| sensorIdRef 1012 | References a sensor that has generated the information included in this specific sensed information. |
| groupID 1013 | Identifier for a group multi-sensor structure to which this specific sensor belongs. |
| Priority 1014 | Describes the priority for sensed information with respect to other sensed information in the same group of sensors sharing the same point in time when the sensed information becomes adapted. A value of one indicates the highest priority and larger values indicate lower priorities. |
| Activate 1015 | whether the effect shall be activated. a value of true means the effect shall be activated and false means the effect shall be deactivated. |
| Linked list 1016 | grouping sensor structure that consists of a group of sensors such that in each record there is a field that contains a reference (id) to the next sensor. |
| Value | the value of the effect in percentage according to the max scale defined within the semantics definition of the individual effects. |
| Time stamp | information on a sensing time of the sensor |
| Life span | information on a valid period of a sensor command (expressed with reference to the timestamp in units of second) |

Table 43 may be a program representing the sensed information base attributes using the XML format. However, a program source shown in Table 43 is only an example embodiment, and thus, the present disclosure is not limited thereto.

TABLE 43

```
<!-- ################################################## -->
    <!-- Definition of Sensed information Base Attributes    -->
    <!-- ################################################## -->
    <attributeGroup name="SensedInfoBaseAttributes">
        <attribute name="id" type="ID" use="optional"/>
        <attribute name="sensorIdRef" type="anyURI"
        use="optional"/>
        <attribute name="linkedlist" type="anyURI" use="optional"/>
        <attribute name="groupID" type="anyURI" use="optional"/>
        <attribute name="priority" type="PositiveInteger"
        use="optional"/>
        <attribute name="activate" type="boolean" use="optional"/>
    </attributeGroup>
```

Table 43-2 shows binary encoding syntax related to the sensed information base attributes, according to example embodiments.

TABLE 43-2

| SensedInfoBaseAttributesType{ | (Number of bits) | Mnemonic |
|---|---|---|
| IDFlag | 1 | Bslbf |
| sensorIdRefFlag | 1 | bslbf |
| linkedlistFlag | 1 | bslbf |
| groupIDFlag | 1 | bslbf |
| priorityFlag | 1 | bslbf |
| activateFlag | 1 | bslbf |
| If(IDFlag) { | | |
| ID | See ISO 10646 | UTF-8 |
| } | | |
| if(sensorIdRefFlag) { | | |
| sensorIdRefLength | | vluimsbf5 |
| sensorIdRef | 8* sensorIdRefLength | bslbf |
| } | | |
| if(linkedlistFlag) { | | |
| linkedlistLength | | vluimsbf5 |
| Linkedlist | 8* linkedlistLength | bslbf |
| } | | |

TABLE 43-2-continued

| SensedInfoBaseAttributesType{ | (Number of bits) | Mnemonic |
|---|---|---|
| if(groupIDFlag) { | | |
| groupIDLength | | vluimsbf5 |
| groupID | 8* groupIDLength | bslbf |
| } | | |
| If(priorityFlag) { | | |
| Priority | 8 | uimsbf |
| } | | |
| if(activateFlag) { | | |
| Activate | 1 | bslbf |
| } | | |
| } | | |

Table 43-3 shows descriptor components semantics of the sensed information base attributes, according to the example embodiments.

TABLE 43-3

| | |
|---|---|
| bslbf | Bit string, left bit first, where "left" is the order in which bits are written in ISO/IEC 15938-3. Bit strings are generally written as a string of 1s and 0s within single quote marks, e.g. '1000 0001'. Blanks within a bit string are for ease of reading and have no significance. For convenience, large strings are occasionally written in hexadecimal, in which case conversion to a binary in the conventional manner will yield the value of the bit string. Thus, the left-most hexadecimal digit is first and in each hexadecimal digit the most significant of the four digits is first. |
| UTF-8 | Binary string encoding defined in ISO 10646/IETF RFC 2279. |
| vluimsbf5 | Variable length unsigned integer most significant bit first representation consisting of two parts. The first part defines the number n of 4-bit bit fields used for the value representation, encoded by a sequence of n-1 "1" bits, followed by a "0" bit signaling its end. The second part contains the value of the integer encoded using the number of bit fields specified in the first part. |
| uimsbf | Unsigned integer, most significant bit first. |
| fsbf | Float (32 bit), sign bit first. The semantics of the bits within a float are specified in the IEEE Standard for Binary Floating Point Arithmetic (ANSI/IEEE Std 754-1985). |

Hereinafter, the sensed information of the sensor will be described in relation to specific embodiments.

Table 44 shows sensed information related to a position sensor using the XML format. However, a program source shown in Table 44 is only an example embodiment, and thus, the present disclosure is not limited thereto.

TABLE 44

```
<!--###################################-->
<!--Definition of Position Sensor type-->
<!--###################################-->
<complexType name="PositionSensorType">
  <complexContent>
    <extension base="iidl:SensedInfoBaseType">
      <sequence>
        <element name="position" type="mpegvct:Float3DVectorType"
          minOccurs="0"/>
      </sequence>
      <attribute name="timestamp" type="float" use="optional"/>
      <attribute name="unit" type="mpegvct:unitType" use="optional"/>
    </extension>
  </complexContent>
</complexType>
```

A position sensor type is a tool for describing sensed information related to the position sensor.

The position sensor type may include attributes such as a timestamp, a life span, a position, a position value type, Px, Py, and Pz.

The timestamp denotes information on a sensing time of the position sensor.

The life span denotes information on a valid period of a command of the position sensor. For example, the life span may be expressed by units of seconds.

The position denotes information on a 3-dimensional (3D) value of the position sensor, expressed by a unit of distance, for example, a meter.

The position value type denotes a tool for indicating a 3D position vector.

The Px denotes information on an x-axis value of the position sensor.

The Py denotes information on a y-axis value of the position sensor.

The Pz denotes information on a z-axis value of the position sensor.

Table 45 and Table 46 denote binary representation syntax corresponding to the sensed information related to the position sensor, according to the example embodiments.

TABLE 45

| PositionSensorType{ | Number of bits | Mnemonic |
|---|---|---|
| positionFlag | 1 | bslbf |
| unitFlag | 1 | bslbf |
| SensedInfoBaseType | | SensedInfoBaseTypeType |
| if(positionFlag) { | | |
| position | | Float3DVectorType |
| } | | |
| if(unitFlag) { | | |
| Unit | | unitType |
| } | | |
| } | | |

TABLE 46

| Float3DVectorType { | Number of bits | Mnemonic |
|---|---|---|
| X | 32 | fsbf |
| Y | 32 | fsbf |
| Z | 32 | fsbf |
| } | | |

Table 45 and Table 46 may include binary encoding syntax of the sensed information related to the position sensor, the number of bits occupied by attributes of the binary encoding syntax, and a mnemonic of the attributes.

For example, the binary encoding syntax corresponding to the sensed information of the position sensor may include a priority of the position sensor. Here, the number of bits occupied by the priority may be 8 bits. A priority mnemonic may be uimsbf which stands for 'unsigned integer most significant bit first.'

Depending on embodiments, the mnemonic may further include bslbf which stands for 'bit string left bit first' and Unicode transformation format-8 (UTF-8) which stands for a variable length letter encoding method for Unicode. UTF-8 may use 1 to 4 bytes to express one Unicode letter.

Table 47 shows other examples of a mnemonic of data.

TABLE 47

| | |
|---|---|
| bslbf | Bit string, left bit first, where "left" is the order in which bits are written in ISO/IEC 15938-3. Bit strings are generally written as a string of 1s and 0s within single quote marks, e.g. '1000 0001'. Blanks within a bit string are for ease of reading and have no significance. For convenience, large strings are occasionally written in hexadecimal, in which case conversion to a binary in the conventional manner |

TABLE 47-continued

| | |
|---|---|
| | will yield the value of the bit string. Thus, the left-most hexadecimal digit is first and in each hexadecimal digit the most significant of the four digits is first. |
| UTF-8 | Binary string encoding defined in ISO 10646/IETF RFC 2279. |
| vluimsbf5 | Variable length unsigned integer most significant bit first representation consisting of two parts. The first part defines the number n of 4-bit bit fields used for the value representation, encoded by a sequence of n-1 "1" bits, followed by a "0" bit signaling its end. The second part contains the value of the integer encoded using the number of bit fields specified in the first part. |
| uimsbf | Unsigned integer, most significant bit first. |
| fsbf | Float (32 bit), sign bit first. The semantics of the bits within a float are specified in the IEEE Standard for Binary Floating Point Arithmetic (ANSI/IEEE Std 754-1985). |

Table 48 shows descriptor components semantics of the position sensor according to example embodiments.

TABLE 48

| Names | Description |
|---|---|
| PositionSensorType | Tool for describing sensed information with respect to a position sensor. |
| positionFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| position | Describes the sensed value of the position sensor in 3D with respect to the default unit if the unit is not defined. Otherwise, use the unit type defined in the sensor capability. |
| unit | Specifies the unit of the sensed value, if a unit other than the default unit is used, as a reference to a classification scheme term provided by UnitCS defined in xxx of ISO/IEC 23005-6 and use the binary representation defined above. |
| Float3DVectorType | Tool for describing a 3D position vector |
| X | Describes the sensed position in x-axis in the unit of meter. |
| Y | Describes the sensed position in y-axis in the unit of meter. |
| Z | Describes the sensed position in z-axis in the unit of meter. |

Table 49 shows sensed information related to an orientation sensor using the XML format. However, a program source shown in Table 49 is only an example embodiment, and thus, the present disclosure is not limited thereto.

TABLE 49

```
<!--######################################## -->
    <!--Definition of Orientation Sensor type -->
    <!--######################################## -->
    <complexType name="OrientationSensorType">
        <complexContent>
            <extension base="iidl:SensedInfoBaseType">
                <sequence>
                    <element name="orientation"
type="mpegvct:Float3DVectorType" minOccurs="0"/>
                </sequence>
                <attribute name="timestamp" type="float"
                    use="optional"/>
                <attribute name="unit" type="mpegvct:unitType"
                    use="optional"/>
            </extension>
        </complexContent>
</complexType>
```

An orientation sensor type is a tool for describing sensed information related to the orientation sensor.

The orientation sensor type may include attributes such as a timestamp, a life span, an orientation, an orientation value type, Ox, Oy, and Oz.

The timestamp denotes information on a sensing time of the orientation sensor.

The life span denotes information on a valid period of a command of the orientation sensor. For example, the life span may be expressed in units of seconds.

The orientation denotes information on a 3D value of the orientation sensor, expressed by a unit of orientation, for example, a radian.

The orientation value type denotes a tool for indicating a 3D orientation vector.

The Ox denotes information on a value of an x-axis rotation angle of the orientation sensor.

The Oy denotes information on a value of a y-axis rotation angle of the orientation sensor.

The Oz denotes information on a value of a z-axis rotation angle of the orientation sensor.

Table 50 shows binary representation syntax corresponding to the sensed information related to the orientation sensor, according the example embodiments.

TABLE 50

| OrientationSensorType{ | Number of bits | Mnemonic |
|---|---|---|
| orientationFlag | 1 | bslbf |
| unitFlag | 1 | bslbf |
| SensedInfoBaseType | | SensedInfoBaseTypeType |
| if(orientationFlag) { | | |
| Orientation | | Float3DVectorType |
| } | | |
| if(unitFlag) { | | |
| Unit | | unitType |
| } | | |
| } | | |

Table 51 shows descriptor components semantics of the orientation sensor, according to the example embodiments.

TABLE 51

| Names | Description |
|---|---|
| OrientationSensorType | Tool for describing sensed information with respect to an orientation sensor. |
| orientationFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| orientation | Describes the sensed value of the orientation sensor in 3D with respect to the default unit if the unit is not defined. Otherwise, use the unit type defined in the sensor capability. |
| unit | Specifies the unit of the sensed value, if a unit other than the default unit is used, as a reference to a classification scheme term provided by UnitCS defined in xxx of ISO/IEC 23005-6 and use the binary representation defined above. |

Table 52 shows sensed information related to an acceleration sensor using the XML format. However, a program source shown in Table 52 is only an example embodiment, and thus, the present disclosure is not limited thereto.

TABLE 52

```
<!--######################################## -->
    <!--Definition of Acceleration Sensor type -->
    <!--######################################## -->
    <complexType name="AccelerationSensorType">
        <complexContent>
            <extension base="iidl:SensedInfoBaseType">
                <sequence>
                    <element name="acceleration"
type="mpegvct:Float3DVectorType" minOccurs="0"/>
                </sequence>
                <attribute name="timestamp" type="float"
                    use="optional"/>
                <attribute name="unit" type="mpegvct:unitType"
                    use="optional"/>
            </extension>
        </complexContent>
    </complexType>
```

An acceleration sensor type is a tool for describing sensed information related to the acceleration sensor.

The acceleration sensor type may include attributes such as a timestamp, a life span, an acceleration, an acceleration value type, Ax, Ay, and Az.

The timestamp denotes information on a sensing time of the acceleration sensor.

The life span denotes information on a valid period of a command of the acceleration sensor. For example, the life span may be expressed by units of seconds.

The acceleration denotes information on a value of the acceleration sensor, expressed by a unit of acceleration, for example, $m/s^2$.

The acceleration value type denotes a tool for indicating a 3D acceleration vector.

The Ax denotes information on an x-axis value of the acceleration sensor.

The Ay denotes information on a y-axis value of the acceleration sensor.

The Az denotes information on a z-axis value of the acceleration sensor.

Table 53 shows binary representation syntax corresponding to the sensed information related to the acceleration sensor, according the example embodiments.

TABLE 53

| AccelerationSensorType{ | Number of bits | Mnemonic |
|---|---|---|
| accelerationFlag | 1 | Bslbf |
| unitFlag | 1 | Bslbf |
| SensedInfoBaseType | | SensedInfoBaseTypeType |
| if(accelerationFlag) { | | |
|   acceleration | | Float3DVectorType |
| } | | |
| if(unitFlag) { | | |
|   unit | | unitType |
| } | | |
| } | | |

Table 54 shows descriptor components semantics of the acceleration sensor, according to the example embodiments.

TABLE 54

| Names | Description |
|---|---|
| AccelerationSensorType | Tool for describing sensed information with respect to an acceleration sensor. |
| accelerationFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| acceleration | Describes the sensed value of the acceleration sensor in 3D with respect to the default unit if the unit is not defined. Otherwise, use the unit type defined in the sensor capability. |
| Unit | Specifies the unit of the sensed value, if a unit other than the default unit is used, as a reference to a classification scheme term provided by UnitCS defined in xxx of ISO/IEC 23005-6 and use the binary representation defined above. |

Table 55 denotes sensed information related to a light sensor using the XML format. However, a program source shown in Table 55 is only an example embodiment, and thus, the present disclosure is not limited thereto.

TABLE 55

```
<!--######################################## -->
    <!--Definition of Light Sensor type    -->
    <!--######################################## -->
    <complexType name="LightSensorType">
        <complexContent>
            <extension base="iidl:SensedInfoBaseType">
                <attribute name="value" type="float" use="optional"/>
                <attribute name="unit" type="iidl:unitType"
                    use="optional"/>
                <attribute name="color" type="iidl:colorType"
                    use="optional"/>
            </extension>
        </complexContent>
    </complexType>
```

A light sensor type is a tool for describing sensed information related to the light sensor.

The light sensor type may include attributes such as a timestamp, a life span, a value, and a color.

The timestamp denotes information on a sensing time of the light sensor.

The life span denotes information on a valid period of a command of the light sensor. For example, the life span may be expressed in units of seconds.

The value denotes information on a light sensor value expressed by a unit of light intensity, for example, LUX.

The color denotes a color that may be provided by the light sensor. For example, the color may be an RGB color value.

Table 56 shows binary representation syntax corresponding to the sensed information related to the light sensor, according to the example embodiments.

TABLE 56

| LightSensorType{ | Number of bits | Mnemonic |
|---|---|---|
| valueFlag | 1 | bslbf |
| unitFlag | 1 | bslbf |
| colorFlag | 1 | bslbf |
| SensedInfoBaseType | | SensedInfoBaseTypeType |
| if(valueFlag) { | | |
|   Value | 32 | fsbf |
| } | | |

TABLE 56-continued

| LightSensorType{ | Number of bits | Mnemonic |
|---|---|---|
| if(unitFlag) { | | |
|    Unit | | unitType |
| } | | |
| if(colorFlag) { | | |
|    Color | | colorType |
| } | | |
| } | | |

Table 57 shows binary encoding of a unit CS corresponding to the light sensor, according to the example embodiments. Table 57 may include a unit type and a term ID of unit.

TABLE 57

| unitType | Term ID of unit |
|---|---|
| 00000000 | Micrometer |
| 00000001 | Mm |
| 00000010 | Cm |
| 00000011 | Meter |
| 00000100 | Km |
| 00000101 | Inch |
| 00000110 | Yard |
| 00000111 | Mile |
| 00001000 | Mg |
| 00001001 | Gram |
| 00001010 | Kg |
| 00001011 | Ton |
| 00001100 | Micrometerpersec |
| 00001101 | Mmpersec |
| 00001110 | Cmpersec |
| 00001111 | Meterpersec |
| 00010000 | Kmpersec |
| 00010001 | Inchpersec |
| 00010010 | Yardpersec |
| 00010011 | Milepersec |
| 00010100 | Micrometerpermin |
| 00010101 | Mmpermin |
| 00010110 | Cmpermin |
| 00010111 | Meterpermin |
| 00011000 | Kmpermin |
| 00011001 | Inchpermin |
| 00011010 | Yardpermin |
| 00011011 | Milepermin |
| 00011100 | Micrometerperhour |
| 00011101 | Mmperhour |
| 00011110 | Cmperhour |
| 00011111 | Meterperhour |
| 00100000 | Kmperhour |
| 00100001 | Inchperhour |
| 00100010 | Yardperhour |
| 00100011 | Mileperhour |
| 00100100 | Micrometerpersecsquare |
| 00100101 | Mmpersecsquare |
| 00100110 | Cmpersecsquare |
| 00100111 | Meterpersecsquare |
| 00101000 | Kmpersecsquare |
| 00101001 | Inchpersecsquare |
| 00101010 | Yardpersecsquare |
| 00101011 | Milepersecsquare |
| 00101100 | Micormeterperminsquare |
| 00101101 | Mmperminsquare |
| 00101110 | Cmperminsquare |
| 00101111 | Meterperminsquare |
| 00110000 | Kmpersminsquare |
| 00110001 | Inchperminsquare |
| 00110010 | Yardperminsquare |
| 00110011 | Mileperminsquare |
| 00110100 | Micormeterperhoursquare |
| 00110101 | Mmperhoursquare |
| 00110110 | Cmperhoursquare |
| 00110111 | Meterperhoursquare |
| 00111000 | Kmperhoursquare |
| 00111001 | Inchperhoursquare |
| 00111010 | Yardperhoursquare |
| 00111011 | Mileperhoursquare |

TABLE 57-continued

| unitType | Term ID of unit |
|---|---|
| 00111100 | Newton |
| 00111101 | Nmm |
| 00111110 | Npmm |
| 00111111 | Hz |
| 01000000 | KHz |
| 01000001 | MHz |
| 01000010 | GHz |
| 01000011 | Volt |
| 01000100 | Millivolt |
| 01000101 | Ampere |
| 01000110 | Milliampere |
| 01000111 | Milliwatt |
| 01001000 | Watt |
| 01001001 | Kilowatt |
| 01001010 | Lux |
| 01001011 | Celsius |
| 01001100 | Fahrenheit |
| 01001101 | Radian |
| 01001110 | Degree |
| 01001111 | Radpersec |
| 01010000 | Degpersec |
| 01010001 | Radpersecsquare |
| 01010010 | Degpersecsquare |
| 01010011 | Npermmsquare |
| 01011100-11111111 | Reserved |

Table 58 shows binary encoding of a unit CS corresponding to the light sensor, according to the example embodiments. Table 58 may include a color type and a term ID of unit.

TABLE 58

| colorType | Term ID of color |
|---|---|
| 000000000 | alice_blue |
| 000000001 | Alizarin |
| 000000010 | Amaranth |
| 000000011 | amaranth_pink |
| 000000100 | Amber |
| 000000101 | Amethyst |
| 000000110 | Apricot |
| 000000111 | Aqua |
| 000001000 | Aquamarine |
| 000001001 | army_green |
| 000001010 | Asparagus |
| 000001011 | atomic_tangerine |
| 000001100 | Auburn |
| 000001101 | azure_color_wheel |
| 000001110 | azure_web |
| 000001111 | baby_blue |
| 000010000 | Beige |
| 000010001 | Bistre |
| 000010010 | Black |
| 000010011 | Blue |
| 000010100 | blue_pigment |
| 000010101 | blue_ryb |
| 000010110 | blue_green |
| 000010111 | blue-green |
| 000011000 | blue-violet |
| 000011001 | bondi_blue |
| 000011010 | Brass |
| 000011011 | bright_green |
| 000011100 | bright_pink |
| 000011101 | bright_turquoise |
| 000011110 | brilliant_rose |
| 000011111 | brink_pink |
| 000100000 | Bronze |
| 000100001 | Brown |
| 000100010 | Buff |
| 000100011 | Burgundy |
| 000100100 | burnt_orange |
| 000100101 | burnt_sienna |
| 000100110 | burnt_umber |
| 000100111 | camouflage_green |

TABLE 58-continued

| colorType | Term ID of color |
|---|---|
| 000101000 | caput_mortuum |
| 000101001 | Cardinal |
| 000101010 | Carmine |
| 000101011 | carmine_pink |
| 000101100 | carnation_pink |
| 000101101 | Carolina_blue |
| 000101110 | carrot_orange |
| 000101111 | Celadon |
| 000110000 | Cerise |
| 000110001 | cerise_pink |
| 000110010 | Cerulean |
| 000110011 | cerulean_blue |
| 000110100 | Champagne |
| 000110101 | Charcoal |
| 000110110 | chartreuse_traditional |
| 000110111 | chartreuse_web |
| 000111000 | cherry_blossom_pink |
| 000111001 | Chestnut |
| 000111010 | Chocolate |
| 000111011 | Cinnabar |
| 000111100 | Cinnamon |
| 000111101 | Cobalt |
| 000111110 | Columbia_blue |
| 000111111 | Copper |
| 001000000 | copper_rose |
| 001000001 | Coral |
| 001000010 | coral_pink |
| 001000011 | coral_red |
| 001000100 | Corn |
| 001000101 | cornflower_blue |
| 001000110 | cosmic_latte |
| 001000111 | Cream |
| 001001000 | Crimson |
| 001001001 | Cyan |
| 001001010 | cyan_process |
| 001001011 | dark_blue |
| 001001100 | dark_brown |
| 001001101 | dark_cerulean |
| 001001110 | dark_chestnut |
| 001001111 | dark_coral |
| 001010000 | dark_goldenrod |
| 001010001 | dark_green |
| 001010010 | dark_khaki |
| 001010011 | dark_magenta |
| 001010100 | dark_pastel_green |
| 001010101 | dark_pink |
| 001010110 | dark_scarlet |
| 001010111 | dark_salmon |
| 001011000 | dark_slate_gray |
| 001011001 | dark_spring_green |
| 001011010 | dark_tan |
| 001011011 | dark_turquoise |
| 001011100 | dark_violet |
| 001011101 | deep_carmine_pink |
| 001011110 | deep_cerise |
| 001011111 | deep_chestnut |
| 001100000 | deep_fuchsia |
| 001100001 | deep_lilac |
| 001100010 | deep_magenta |
| 001100011 | deep_magenta |
| 001100100 | deep_peach |
| 001100101 | deep_pink |
| 001100110 | Denim |
| 001100111 | dodger_blue |
| 001101000 | Ecru |
| 001101001 | egyptian_blue |
| 001101010 | electric_blue |
| 001101011 | electric_green |
| 001101100 | elctric_indigo |
| 001101101 | electric_lime |
| 001101110 | electric_purple |
| 001101111 | Emerald |
| 001110000 | Eggplant |
| 001110001 | falu_red |
| 001110010 | fern_green |
| 001110011 | Firebrick |
| 001110100 | Flax |
| 001110101 | forest_green |
| 001110110 | french_rose |
| 001110111 | Fuchsia |
| 001111000 | fuchsia_pink |
| 001111001 | Gamboge |
| 001111010 | gold_metallic |
| 001111011 | gold_web_golden |
| 001111100 | golden_brown |
| 001111101 | golden_yellow |
| 001111110 | Goldenrod |
| 001111111 | grey-asparagus |
| 010000000 | green_color_wheel_x11_green |
| 010000001 | green_html/css_green |
| 010000010 | green_pigment |
| 010000011 | green_ryb |
| 010000100 | green_yellow |
| 010000101 | Grey |
| 010000110 | han_purple |
| 010000111 | Harlequin |
| 010001000 | Heliotrope |
| 010001001 | Hollywood_cerise |
| 010001010 | hot_magenta |
| 010001011 | hot_pink |
| 010001100 | indigo_dye |
| 010001101 | international_klein_blue |
| 010001110 | international_orange |
| 010001111 | Islamic_green |
| 010010000 | Ivory |
| 010010001 | Jade |
| 010010010 | kelly_green |
| 010010011 | Khaki |
| 010010100 | khaki_x11_light_khaki |
| 010010101 | lavender_floral |
| 010010110 | lavender_web |
| 010010111 | lavender_blue |
| 010011000 | lavender_blush |
| 010011001 | lavender_grey |
| 010011010 | lavender_magenta |
| 010011011 | lavender_pink |
| 010011100 | lavender_purple |
| 010011101 | lavender_rose |
| 010011110 | lawn_green |
| 010011111 | Lemon |
| 010100000 | lemon_chiffon |
| 010100001 | light_blue |
| 010100010 | light_pink |
| 010100011 | Lilac |
| 010100100 | lime_color_wheel |
| 010100101 | lime_web_x11_green |
| 010100110 | lime_green |
| 010100111 | Linen |
| 010101000 | Magenta |
| 010101001 | magenta_dye |
| 010101010 | magenta_process |
| 010101011 | magic_mint |
| 010101100 | Magnolia |
| 010101101 | Malachite |
| 010101110 | maroon_html/css |
| 010101111 | marron_x11 |
| 010110000 | maya_blue |
| 010110001 | Mauve |
| 010110010 | mauve_taupe |
| 010110011 | medium_blue |
| 010110100 | medium_carmine |
| 010110101 | medium_lavender_magenta |
| 010110110 | medium_purple |
| 010110111 | medium_spring_green |
| 010111000 | midnight_blue |
| 010111001 | midnight_green_eagle_green |
| 010111010 | mint_green |
| 010111011 | misty_rose |
| 010111100 | moss_green |
| 010111101 | mountbatten_pink |
| 010111110 | Mustard |
| 010111111 | Myrtle |
| 011000000 | navajo_white |
| 011000001 | navy_blue |
| 011000010 | Ochre |
| 011000011 | office_green |

TABLE 58-continued

| colorType | Term ID of color |
|---|---|
| 011000100 | old_gold |
| 011000101 | old_lace |
| 011000110 | old_lavender |
| 011000111 | old_rose |
| 011001000 | Olive |
| 011001001 | olive_drab |
| 011001010 | Olivine |
| 011001011 | orange_color_wheel |
| 011001100 | orange_ryb |
| 011001101 | orange_web |
| 011001110 | orange_peel |
| 011001111 | orange-red |
| 011010000 | Orchid |
| 011010001 | pale_blue |
| 011010010 | pale_brown |
| 011010011 | pale_carmine |
| 011010100 | pale_chestnut |
| 011010101 | pale_cornflower_blue |
| 011010110 | pale_magenta |
| 011010111 | pale_pink |
| 011011000 | pale_red-violet |
| 011011001 | papaya_whip |
| 011011010 | pastel_green |
| 011011011 | pastel_pink |
| 011011100 | Peach |
| 011011101 | peach-orange |
| 011011110 | peach-yellow |
| 011011111 | Pear |
| 011100000 | Periwinkle |
| 011100001 | persian_blue |
| 011100010 | persian_green |
| 011100011 | persian_indigo |
| 011100100 | persian_orange |
| 011100101 | persian_red |
| 011100110 | persian_pink |
| 011100111 | persian_rose |
| 011101000 | Persimmon |
| 011101001 | pine_green |
| 011101010 | Pink |
| 011101011 | pink-orange |
| 011101100 | Platinum |
| 011101101 | plum_web |
| 011101110 | powder_blue_web |
| 011101111 | Puce |
| 011110000 | prussian_blue |
| 011110001 | psychedelic_purple |
| 011110010 | Pumpkin |
| 011110011 | purple_html/css |
| 011110100 | purple_x11 |
| 011110101 | purple_taupe |
| 011110110 | raw_umber |
| 011110111 | Razzmatazz |
| 011111000 | Red |
| 011111001 | red_pigment |
| 011111010 | red_ryb |
| 011111011 | red-violet |
| 011111100 | rich_carmine |
| 011111101 | robin_egg_blue |
| 011111110 | Rose |
| 011111111 | rose_madder |
| 100000000 | rose_taupe |
| 100000001 | royal_blue |
| 100000010 | royal_purple |
| 100000011 | Ruby |
| 100000100 | Russet |
| 100000101 | Rust |
| 100000110 | safety_orange_blaze_orange |
| 100000111 | Saffron |
| 100001000 | Salmon |
| 100001001 | sandy_brown |
| 100001010 | Sangria |
| 100001011 | Sapphire |
| 100001100 | Scarlet |
| 100001101 | school_bus_yellow |
| 100001110 | sea_green |
| 100001111 | Seashell |
| 100010000 | selective_yellow |
| 100010001 | Sepia |
| 100010010 | shamrock_green |
| 100010011 | shocking_pink |
| 100010100 | Silver |
| 100010101 | sky_blue |
| 100010110 | slate_grey |
| 100010111 | smalt_dark_powder_blue |
| 100011000 | spring_bud |
| 100011001 | spring_green |
| 100011010 | steel_blue |
| 100011011 | Tan |
| 100011100 | Tangerine |
| 100011101 | tangerine_yellow |
| 100011110 | Taupe |
| 100011111 | tea_green |
| 100100000 | tea_rose_orange |
| 100100001 | tea_rose_rose |
| 100100010 | Teal |
| 100100011 | tenne tawny |
| 100100100 | terra_cotta |
| 100100101 | Thistle |
| 100100110 | Tomato |
| 100100111 | Turquoise |
| 100101000 | tyrian_purple |
| 100101001 | Ultramarine |
| 100101010 | ultra_pink |
| 100101011 | united_nation_blue |
| 100101100 | vegas_gold |
| 100101101 | Vermilion |
| 100101110 | Violet |
| 100101111 | violet_web |
| 100110000 | violet_ryb |
| 100110001 | Viridian |
| 100110010 | Wheat |
| 100110011 | White |
| 100110100 | Wisteria |
| 100110101 | Yellow |
| 100110110 | yellow_process |
| 100110111 | yellow_ryb |
| 100111000 | yellow_green |
| 100111001-111111111 | Reserved |

Table 59 shows descriptor components semantics of the light sensor, according to the example embodiments.

TABLE 59

| Names | Description |
|---|---|
| LightSensorType | Tool for describing sensed information with respect to a light sensor. |
| valueFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| colorFlag | This field, which is only present in the binary representation, signals the presence of color attribute. A value of "1" means the attribute shall be used and "0" means the attribute shall not be used. |
| SensedInfoBaseType | Provides the topmost type of the base type hierarchy which each individual sensed information can inherit. |
| value | Describes the sensed value of the light sensor with respect to the default unit if the unit is not defined. Otherwise, use the unit type defined in the sensor capability. |
| unit | Specifies the unit of the sensed value, if a unit other than the default unit is used, as a reference to a classification scheme term |

TABLE 59-continued

| Names | Description |
| --- | --- |
| | provided by UnitCS defined in xxx of ISO/IEC 23005-6 and use the binary representation defined above. |
| color | Describes the list of colors which the lighting device can sense as a reference to a classification scheme term or as RGB value. A CS that may be used for this purpose is the ColorCS defined in A.2.3 of ISO/IEC 23005-6 and use the binary representation defined above. |

Table 60 denotes sensed information related to a sound sensor using the XML format. However, a program source shown in Table 60 is only an example embodiment, and thus, the present disclosure is not limited thereto.

TABLE 60

```
<!-- ################### -->
<!-- SCmd Sound Sensor type       -->
<!--######################## -->
<complexType name="SoundSensorType">
    <complexContent>
        <extension base="cid: SCmdBaseType"/>
    </complexContent>
</complexType>
```

A sound sensor command type is a tool for describing sensed information related to the sound sensor.

Table 61 denotes sensed information related to a temperature sensor using the XML format. However, a program source shown in Table 61 is only an example embodiment, and thus, the present disclosure is not limited thereto.

TABLE 61

```
<!--##################################### -->
    <!--Definition of Temperature Sensor type -->
    <!--##################################### -->
    <complexType name="TemperatureSensorType">
        <complexContent>
            <extension base="iidl:SensedInfoBaseType">
                <attribute name="value" type="float" use="optional"/>
                <attribute name="unit" type="iidl:unitType"
                use="optional"/>
            </extension>
        </complexContent>
    </complexType>
```

A temperature sensor type is a tool for describing sensed information related to the temperature sensor.

The temperature sensor type may include attributes such as a timestamp, a life span, and a value.

The timestamp denotes information on a sensing time of the temperature sensor.

The life span denotes information on a valid period of a command of the temperature sensor. For example, the life span may be expressed in units of seconds.

The value denotes information on a temperature sensor value expressed by a unit of temperature, for example, ° C. and ° F.

Table 62 shows binary representation syntax corresponding to the sensed information related to the temperature sensor, according to the example embodiments.

TABLE 62

| TemperatureSensorType{ | Number of bits | Mnemonic |
| --- | --- | --- |
| valueFlag | 1 | bslbf |
| unitFlag | 1 | bslbf |
| if(valueFlag) { | | |
|   Value | 32 | fsbf |
| } | | |
| if(unitFlag) { | | |
|   Unit | | unitType |
| } | | |
| } | | |

Table 63 shows descriptor components semantics of the temperature sensor, according to the example embodiments.

TABLE 63

| Names | Description |
| --- | --- |
| TemperatureSensorType | Tool for describing sensed information with respect to a temperature sensor. |
| valueFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| Value | Describes the sensed value of the temperature sensor with respect to the default unit if the unit is not defined. Otherwise, use the unit type defined in the sensor capability. |
| Unit | Specifies the unit of the sensed value, if a unit other than the default unit is used, as a reference to a classification scheme term provided by UnitCS defined in xxx of ISO/IEC 23005-6 and use the binary representation defined above. |

Table 64 denotes sensed information related to a humidity sensor using the XML format. However, a program source shown in Table 64 is only an example embodiment, and thus, the present disclosure is not limited thereto.

TABLE 64

```
<!--##################################### -->
    <!--Definition of Humidity Sensor type -->
    <!--##################################### -->
    <complexType name="HumiditySensorType">
        <complexContent>
            <extension base="iidl:SensedInfoBaseType">
                <attribute name="value" type="float" use="optional"/>
                <attribute name="unit" type="iidl:unitType"
                use="optional"/>
            </extension>
        </complexContent>
    </complexType>
```

A humidity sensor type is a tool for describing sensed information related to the humidity sensor.

The humidity sensor type may include attributes such as a timestamp, a life span, and a value.

The timestamp denotes information on a sensing time of the humidity sensor.

The life span denotes information on a valid period of a command of the humidity sensor. For example, the life span may be expressed in units of seconds.

The value denotes information on a humidity sensor value expressed by a unit of humidity, for example, % humidity.

Table 65 shows binary representation syntax corresponding to the sensed information related to the humidity sensor, according to the example embodiments.

TABLE 65

| HumiditySensorType{ | Number of bits | Mnemonic |
|---|---|---|
| valueFlag | 1 | bslbf |
| unitFlag | 1 | bslbf |
| SensedInfoBaseType | | SensedInfoBaseTypeType |
| if(valueFlag) { | | |
|   value | 32 | fsbf |
| } | | |
| if(unitFlag) { | | |
|   Unit | | unitType |
| } | | |
| } | | |

Table 66 shows descriptor components semantics of the humidity sensor, according to the example embodiments.

TABLE 66

| Names | Description |
|---|---|
| HumiditySensorType | Tool for describing sensed information with respect to a humidity sensor. |
| valueFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| value | Describes the sensed value of the humidity sensor with respect to the default unit if the unit is not defined. Otherwise, use the unit type defined in the sensor capability. |
| unit | Specifies the unit of the sensed value, if a unit other than the default unit is used, as a reference to a classification scheme term provided by UnitCS defined in xxx of ISO/IEC 23005-6 and use the binary representation defined above. |

Table 67 denotes sensed information related to a distance sensor using the XML format. However, a program source shown in Table 67 is only an example embodiment, and thus, the present disclosure is not limited thereto.

TABLE 67

```
<!--####################################-->
    <!--Definition of Distance Sensor type-->
    <!--####################################-->
    <complexType name="DistanceSensorType">
        <complexContent>
            <extension base="iidl:SensedInfoBaseType">
                <attribute name="value" type="float" use="optional"/>
                <attribute name="unit" type="iidl:unitType"
                use="optional"/>
            </extension>
        </complexContent>
    </complexType>
```

A distance sensor type is a tool for describing sensed information related to the distance sensor.

The distance sensor type may include attributes such as a timestamp, a life span, and a value.

The timestamp denotes information on a sensing time of the distance sensor.

The life span denotes information on a valid period of a command of the distance sensor. For example, the life span may be expressed in units of seconds.

The value denotes information on a distance sensor value expressed by a unit of distance, for example, meter.

Table 68 shows binary representation syntax corresponding to the sensed information related to the distance sensor, according to the example embodiments.

TABLE 68

| DistanceSensorType{ | Number of bits | Mnemonic |
|---|---|---|
| valueFlag | 1 | bslbf |
| unitFlag | 1 | bslbf |
| SensedInfoBaseType | | SensedInfoBaseTypeType |
| if(valueFlag) { | | |
|   value | 32 | fsbf |
| } | | |
| if(unitFlag) { | | |
|   unit | | unitType |
| } | | |
| } | | |

Table 69 shows descriptor components semantics of the distance sensor, according to the example embodiments.

TABLE 69

| Names | Description |
|---|---|
| DistanceSensorType | Tool for describing sensed information with respect to a distance sensor. |
| valueFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| value | Describes the sensed value of the humidity sensor with respect to the default unit if the unit is not defined. Otherwise, use the unit type defined in the sensor capability. |
| unit | Specifies the unit of the sensed value, if a unit other than the default unit is used, as a reference to a classification scheme term provided by UnitCS defined in xxx of ISO/IEC 23005-6 and use the binary representation defined above. |

Table 70 denotes sensed information related to a motion sensor using the XML format. However, a program source shown in Table 70 is only an example embodiment, and thus, the present disclosure is not limited thereto.

TABLE 70

```
<!-- ##################################################-->
    <!-- Definition of Motion Sensor Type             -->
    <!-- ##################################################-->
    <complexType name="MotionSensorType">
        <complexContent>
            <extension base="iidl:SensedInfoBaseType">
                <sequence>
                    <element name="position"
type="siv:PositionSensorType" minOccurs="0"/>
                    <element name="orientation"
type="siv:OrientationSensorType" minOccurs="0"/>
                    <element name="velocity"
```

TABLE 70-continued

```
type="siv:VelocitySensorType" minOccurs="0"/>
                <element name="angularvelocity"
type="siv:AngularVelocitySensorType" minOccurs="0"/>
                <element name="acceleration"
type="siv:AccelerationSensorType" minOccurs="0"/>
                <element name="angularacceleration"
type="siv:AngularAccelerationSensorType" minOccurs="0"/>
            </sequence>
        </extension>
    </complexContent>
</complexType>
```

A motion sensor type is a tool for describing sensed information related to the length sensor.

The motion sensor type may include attributes, such as, an ID, an ID reference, a position, a velocity, an acceleration, an orientation, an angular velocity, and an angular acceleration.

The ID denotes ID information for recognizing individual identity of the motion sensor.

The ID reference denotes additional information related to the ID for recognizing individual identity of the motion sensor.

The position denotes information on a position vector value of a unit of position, for example, meter.

The velocity denotes information on a velocity vector value of a unit of velocity, for example, m/s.

The acceleration denotes information on an acceleration vector value of a unit of velocity, for example, m/s$^2$.

The orientation denotes information on an orientation vector value of a unit of orientation, for example, radian.

The angular velocity denotes information on an angular velocity vector value of a unit of velocity, for example, radian/s.

The angular acceleration denotes information on a velocity vector value of a unit of velocity, for example, radian/s$^2$.

Table 71 shows binary representation syntax corresponding to the sensed information related to the motion sensor, according to the example embodiments.

TABLE 71

| MotionSensorType{ | Number of bits | Mnemonic |
|---|---|---|
| positionFlag | 1 | bslbf |
| orientationFlag | 1 | bslbf |
| velocityFlag | 1 | bslbf |
| angularvelocityFlag | 1 | bslbf |
| accelerationFlag | 1 | bslbf |
| angularaccelerationFlag | 1 | bslbf |
| SensedInfoBaseType | | SensedInfoBaseTypeType |
| if(positionFlag) { | | |
|    Position | | PositionSensorType |
| } | | |
| if(orientationFlag) { | | |
|    Orientation | | OrientationSensorType |
| } | | |
| if(velocityFlag) { | | |
|    Velocity | | VelocitySensorType |
| } | | |
| if(angularvelocityFlag) { | | |
|    Angularvelocity | | AngularVelocitySensorType |
| } | | |
| if(accelerationFlag) { | | |
|    acceleration | | AccelerationSensorType |
| } | | |
| if(angularaccelerationFlag) { | | |
|    angularacceleration | | AngularAccelerationSensorType |
| } | | |

Table 72 shows descriptor components semantics of the motion sensor, according to the example embodiments.

TABLE 72

| Names | Description |
|---|---|
| MotionSensorType | Tool for describing sensed information with respect to a motion sensor. |
| positionFlag | This field, which is only present in the binary representation, signals the presence of position value attribute. A value of "1" means the attribute shall be used and "0" means the attribute shall not be used. |
| orientationFlag | This field, which is only present in the binary representation, signals the presence of orientation value attribute. A value of "1" means the attribute shall be used and "0" means the attribute shall not be used. |
| velocityFlag | This field, which is only present in the binary representation, signals the presence of velocity value attribute. A value of "1" means the attribute shall be used and "0" means the attribute shall not be used. |
| angularvelocityFlag | This field, which is only present in the binary representation, signals the presence of angular velocity value attribute. A value of "1" means the attribute shall be used and "0" means the attribute shall not be used. |
| accelerationFlag | This field, which is only present in the binary representation, signals the presence of acceleration value attribute. A value of "1" means the attribute shall be used and "0" means the attribute shall not be used. |
| angularaccelerationFlag | This field, which is only present in the binary representation, signals the presence of angular acceleration value attribute. A value of "1" means the attribute shall be used and "0" means the attribute shall not be used. |
| position | Describes the sensed position value of the motion sensor with respect to the default unit if the unit is not defined. Otherwise, use the unit type defined in the sensor capability. |
| orientation | Describes the sensed orientation value of the motion sensor with respect to the default unit if the unit is not defined. Otherwise, use the unit type defined in the sensor capability. |
| velocity | Describes the sensed velocity value of the motion sensor with respect to the default unit if the unit is not defined. Otherwise, use the unit type defined in the sensor capability. |

TABLE 72-continued

| Names | Description |
| --- | --- |
| angularvelocity | Describes the sensed angular velocity value of the motion sensor with respect to the default unit if the unit is not defined. Otherwise, use the unit type defined in the sensor capability. |
| acceleration | Describes the sensed acceleration value of the motion sensor with respect to the default unit if the unit is not defined. Otherwise, use the unit type defined in the sensor capability. |
| angularacceleration | Describes the sensed angular acceleration value of the motion sensor with respect to the default unit if the unit is not defined. Otherwise, use the unit type defined in the sensor capability. |

Table 73 denotes sensed information related to an intelligent camera sensor using the XML format. However, a program source shown in Table 73 is only an example embodiment, and thus, the present disclosure is not limited thereto.

TABLE 73

```
<!-- ################################################# -->
<!-- Definition of Intelligent Camera Type          -->
<!-- ################################################# -->
<complexType name="IntelligentCameraType">
    <complexContent>
        <extension base="iidl:SensedInfoBaseType">
            <sequence>
                <element name="FacialAnimationID" type="anyURI" minOccurs="0"/>
                <element name="BodyAnimationID" type="anyURI" minOccurs="0"/>
                <element name="FaceFeature" type="mpegvct:Float3DVectorType" minOccurs="0" maxOccurs="255"/>
                <element name="BodyFeature" type="mpegvct:Float3DVectorType" minOccurs="0" maxOccurs="255"/>
            </sequence>
            <attribute name="timestamp" type="float" use="optional"/>
```

TABLE 73-continued

```
        </extension>
    </complexContent>
</complexType>
```

An intelligent camera sensor type is a tool for describing sensed information related to the intelligent camera sensor.

The intelligent camera sensor type may include a facial animation ID, a body animation ID, a face feature, and a body feature.

The facial animation ID denotes an ID referencing an animation clip with respect to a facial expression.

The body animation ID denotes an ID referencing an animation clip with respect to a body.

The face feature denotes information on a 3D position of each face feature sensed by the intelligent camera sensor.

The body feature denotes information on a 3D position of each body feature sensed by the intelligent camera sensor.

Table 74 shows binary representation syntax corresponding to the sensed information related to the intelligent camera sensor, according to the example embodiments.

TABLE 74

| IntelligentCameraType{ | Number of bits | Mnemonic |
| --- | --- | --- |
| FacialIDFlag | 1 | Bslbf |
| BodyIDFlag | 1 | Bslbf |
| FaceFeatureFlag | 1 | bslbf |
| BodyFeatureFlag | 1 | bslbf |
| SensedInfoBaseType | | SensedInfoBaseTypeType |
| if( FacialIDFlag ) { | | |
|    FacialAnimationIDLength | | vluimsbf5 |
|    FacialAnimationID | 8 * FacialAnimationIDLength | bslbf |
| } | | |
| if( BodyIDFlag ) { | | |
|    BodyAnimationIDLength | | vluimsbf5 |
|    BodyAnimationID | 8 * BodyAnimationIDLength | bslbf |
| } | | |
| if( FaceFeatureFlag ) { | | |
| NumOfFaceFeature | 8 | uimsbf |
|   for( k=0; k<NumOfFaceFeature; k++ ) { | | |
|   FaceFeature[k] | | Float3DVectorType |
|   } | | |
| } | | |
| if( BodyFeatureFlag ) { | | |
| NumOfBodyFeature | 8 | uimsbf |

TABLE 74-continued

| IntelligentCameraType{ | Number of bits | Mnemonic |
|---|---|---|
| for( k=0; k<NumOfBodyFeature; k++ ) { | | |
|   BodyFeature[k] | | Float3DVectorType |
| } | | |
| } | | |
| } | | |

Table 75 shows descriptor components semantics of the intelligent camera sensor, according to the example embodiments.

TABLE 75

| Names | Description |
|---|---|
| IntelligentCameraType | Tool for describing sensed information with respect to an intelligent camera sensor. |
| FacialIDFlag | This field, which is only present in the binary representation, signals the presence of the facial animation ID. A value of "1" means the facial animation ID mode shall be used and "0" means the facial animation ID mode shall not be used. |
| BodyIDFlag | This field, which is only present in the binary representation, signals the presence of the body animation ID. A value of "1" means the body animation ID mode shall be used and "0" means the body animation ID mode shall not be used. |
| FaceFeatureFlag | This field, which is only present in the binary representation, signals the presence of the face features. A value of "1" means the face feature tracking mode shall be used and "0" means the face feature tracking mode shall not be used. |
| BodyFeatureFlag | This field, which is only present in the binary representation, signals the presence of the body features. A value of "1" means the body feature tracking mode shall be used and "0" means the body feature tracking mode shall not be used. |
| FacialAnimationIDLength | This field, which is only present in the binary representation, specifies the length of the following FacialAnimationID attribute. |
| FacialAnimationID | Describes the ID referencing the facial expression animation clip. |
| BodyAnimationIDLength | This field, which is only present in the binary representation, specifies the length of the following BodyAnimationID attribute. |
| BodyAnimationID | Describes the ID referencing the body animation clip. |
| NumOfFaceFeature | This field, which is only present in the binary representation, specifies the number of face feature points. |
| FaceFeature | Describes the 3D position of each of the face feature points detected by the camera.<br>Note: The order of the elements corresponds to the order of the face feature points defined at the featureControl for face in 2.2.15 of ISO/IEC_23005-4 |
| NumOfBodyFeature | This field, which is only present in the binary representation, specifies the number of body feature points. |
| BodyFeature | Describes the 3D position of each of the body feature points detected by the camera.<br>Note: The order of the elements corresponds to the order of the body feature points defined at the featureControl for body in 2.2.14 of ISO/IEC_23005-4. |

Table 76 denotes sensed information related to an ambient noise sensor using the XML format. However, a program source shown in Table 76 is only an example embodiment, and thus, the present disclosure is not limited thereto.

TABLE 76

```
<!--######################################## -->
<!--Definition of Ambient Noise Sensor type -->
<!--######################################## -->
<complexType name="AmbientNoiseSensorType">
    <complexContent>
        <extension base="iidl:SensedInfoBaseType">
            <attribute name="lifespan" type="float" use="optional"/>
            <attribute name="value" type="float" use="optional"/>
```

TABLE 76-continued

```
            <attribute name="unit" type="iidl:unitType" use="optional"/>
        </extension>
    </complexContent>
</complexType>
```

An ambient noise sensor type is a tool for describing sensed information related to the ambient noise sensor.

The ambient noise sensor type may include attributes such as a timestamp, a life span, and a value.

The timestamp denotes information on a sensing time of the ambient noise sensor.

The life span denotes information on a valid period of a command of the ambient noise sensor. For example, the life span may be expressed in units of seconds.

The value denotes information on an ambient noise sensor value expressed by a unit of sound intensity, for example, dB.

Table 77 shows binary representation syntax corresponding to the sensed information related to the ambient noise sensor, according to the example embodiments.

TABLE 77

| AmbientNoiseSensorType{ | Number of bits | Mnemonic |
|---|---|---|
| lifespanFlag | 1 | bslbf |
| valueFlag | 1 | bslbf |
| unitFlag | 1 | bslbf |
| SensedInfoBaseType | | SensedInfoBaseTypeType |
| if(lifespanFlag) { | | |
|   lifespan | 32 | fsbf |
| } | | |
| if(valueFlag) { | | |
|   value | 32 | fsbf |
| } | | |
| if(unitFlag) { | | |
|   unit | | unitType |
| } | | |
| } | | |

Table 78 shows descriptor components semantics of the ambient noise sensor, according to the example embodiments.

TABLE 78

| Names | Description |
|---|---|
| AmbientNoiseSensorType | Tool for describing sensed information with respect to an ambient noise sensor. |
| lifespanFlag | This field, which is only present in the binary representation, signals the presence of the life span attribute. A value of "1" means the lifespan shall be used and "0" means the lifespan shall not be used. |
| valueFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| SensedInfoBaseType | Provides the topmost type of the base type hierarchy which each individual sensed information can inherit. |
| lifespan | Describes the duration taken to measure the information based on the timestamp. |
| value | Describes the sensed value of the ambient noise sensor with respect to the default unit if the unit is not defined. Otherwise, use the unit type defined in the sensor capability. |
| unit | Specifies the unit of the sensed value, if a unit other than the default unit is used, as a reference to a classification scheme term provided by UnitCS defined in xxx of ISO/IEC 23005-6 and use the binary representation defined above. |

Table 79 denotes sensed information related to an atmospheric pressure sensor using the XML format. However, a program source shown in Table 79 is only an example embodiment, and thus, the present disclosure is not limited thereto.

TABLE 79

```
<!--######################################-->
    <!--Definition of Atmospheric pressure Sensor type -->
<!--######################################-->
    <complexType name="AtmosphericPressureSensorType">
        <complexContent>
            <extension base="iidl:SensedInfoBaseType">
                <attribute name="value" type="float" use="optional"/>
                <attribute name="unit" type="iidl:unitType"
                    use="optional"/>
            </extension>
        </complexContent>
    </complexType>
```

An atmospheric pressure sensor type is a tool for describing sensed information related to the atmospheric pressure sensor.

The atmospheric pressure sensor type may include attributes such as a timestamp, a life span, and a value.

The timestamp denotes information on a sensing time of the atmospheric pressure sensor.

The life span denotes information on a valid period of a command of the atmospheric pressure sensor. For example, the life span may be expressed in units of seconds.

The value denotes information on an atmospheric pressure sensor value expressed by a unit of atmospheric pressure, for example, hPa.

Table 80 shows binary representation syntax corresponding to the sensed information related to the atmospheric pressure sensor according to the example embodiments.

TABLE 80

| AtmosphericPressureSensorType{ | Number of bits | Mnemonic |
|---|---|---|
| valueFlag | 1 | Bslbf |
| unitFlag | 1 | Bslbf |
| SensedInfoBaseType | | SensedInfoBaseTypeType |
| if(valueFlag) { | | |
|   value | 32 | Fsbf |
| } | | |
| if(unitFlag) { | | |
|   unit | | unitType |
| } | | |
| } | | |

Table 81 shows descriptor components semantics of the atmospheric pressure sensor, according to the example embodiments.

TABLE 81

| Names | Description |
|---|---|
| AtmosphericPressureSensorType | Tool for describing sensed information with respect to an atmospheric pressure sensor. |
| valueFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| Value | Describes the sensed value of the atmospheric pressure sensor with respect to the default unit if the unit is not defined. Otherwise, use the unit type defined in the sensor capability. |
| Unit | Specifies the unit of the sensed value, if a unit other than the default unit is used, as a reference to a classification scheme term provided by UnitCS |

TABLE 81-continued

| Names | Description |
|---|---|
| | defined in xxx of ISO/IEC 23005-6 and use the binary representation defined above. |

Table 82 denotes sensed information related to a velocity sensor using the XML format. However, a program source shown in Table 82 is only an example embodiment, and thus, the present disclosure is not limited thereto.

TABLE 82

```
<!--######################################-->
    <!--Definition of Velocity Sensor type -->
    <!--######################################-->
    <complexType name="VelocitySensorType">
        <complexContent>
            <extension base="iidl:SensedInfoBaseType">
                <sequence>
                    <element name="velocity"
type="mpegvct:Float3DVectorType" minOccurs="0"/>
                </sequence>
                <attribute name="timestamp" type="float"
                use="optional"/>
                <attribute name="unit" type="mpegvct:unitType"
                use="optional"/>
            </extension>
        </complexContent>
    </complexType>
```

A velocity sensor type is a tool for describing sensed information related to the velocity sensor.

The velocity sensor type may include attributes such as a timestamp, a life span, a velocity, a velocity value type, Vx, Vy, and Vz.

The timestamp denotes information on a sensing time of the velocity sensor.

The life span denotes information on a valid period of a command of the velocity sensor. For example, the life span may be expressed in units of seconds.

The velocity denotes information on a velocity sensor value expressed by a unit of velocity, for example, m/s.

The velocity value type denotes a tool for indicating a 3D velocity vector.

The Vx denotes information on an x-axis value of the velocity sensor.

The Vy denotes information on a y-axis value of the velocity sensor.

The Vz denotes information on a z-axis value of the velocity sensor.

Table 83 shows binary representation syntax corresponding to the sensed information related to the velocity sensor, according to the example embodiments.

TABLE 83

| VelocitySensorType{ | Number of bits | Mnemonic |
|---|---|---|
| velocityFlag | 1 | Bslbf |
| unitFlag | 1 | Bslbf |
| SensedInfoBaseType | | SensedInfoBaseTypeType |
| if(velocityFlag) { | | |
|   Velocity | | Float3DVectorType |
| } | | |
| if(unitFlag) { | | |
|   Unit | | unitType |
| } | | |
| } | | |

Table 84 shows descriptor components semantics of the velocity sensor, according to the example embodiments.

TABLE 84

| Names | Description |
|---|---|
| VelocitySensorType | Tool for describing sensed information with respect to a velocity sensor. |
| velocityFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| Velocity | Describes the sensed value of the velocity sensor in 3D with respect to the default unit if the unit is not defined. Otherwise, use the unit type defined in the sensor capability. |
| Unit | Specifies the unit of the sensed value, if a unit other than the default unit is used, as a reference to a classification scheme term provided by UnitCS defined in xxx of ISO/IEC 23005-6 and use the binary representation defined above. |

Table 85 denotes sensed information related to an angular velocity sensor using the XML format. However, a program source shown in Table 85 is only an example embodiment, and thus, the present disclosure is not limited thereto.

TABLE 85

```
<!--######################################-->
    <!--Definition of Angular Velocity Sensor type -->
    <!--######################################-->
    <complexType name="AngularVelocitySensorType">
        <complexContent>
            <extension base="iidl:SensedInfoBaseType">
                <sequence>
                    <element name="AngularVelocity"
type="mpegvct:Float3DVectorType" minOccurs="0"/>
                </sequence>
                <attribute name="timestamp" type="float"
                use="optional"/>
                <attribute name="unit" type="mpegvct:unitType"
                use="optional"/>
            </extension>
        </complexContent>
    </complexType>
```

An angular velocity sensor type is a tool for describing sensed information related to the angular velocity sensor.

The angular velocity sensor type may include attributes such as a timestamp, a life span, an angular velocity, an angular velocity value type, AVx, AVy, and AVz.

The timestamp denotes information on a sensing time of the angular velocity sensor.

The life span denotes information on a valid period of a command of the angular velocity sensor. For example, the life span may be expressed in units of seconds.

The angular velocity denotes information on an angular velocity sensor value expressed by a unit of angular velocity, for example, radian.

The angular velocity value type denotes a tool for indicating a 3D angular velocity vector.

The AVx denotes information on a value of an x-axis rotation angular velocity of the angular velocity sensor.

The AVy denotes information on a value of a y-axis rotation angular velocity of the angular velocity sensor.

The AVz denotes information on a value of a z-axis rotation angular velocity of the angular velocity sensor.

Table 86 shows binary representation syntax corresponding to the sensed information related to the angular velocity sensor, according to the example embodiments.

TABLE 86

| AngularVelocitySensorType{ | Number of bits | Mnemonic |
|---|---|---|
| angularvelocityFlag | 1 | Bslbf |
| unitFlag | 1 | bslbf |
| SensedInfoBaseType | | SensedInfoBaseTypeType |
| if(angularvelocityFlag) { | | |
|   angularvelocity | | Float3DVectorType |
| } | | |
| if(unitFlag) { | | |
|   Unit | | unitType |
| } | | |
| } | | |

Table 87 shows descriptor components semantics of the angular velocity sensor, according to the example embodiments.

TABLE 87

| Names | Description |
|---|---|
| AngularVelocitySensorType | Tool for describing sensed information with respect to an angular velocity sensor |
| angularvelocityFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| angularvelocity | Describes the sensed value of the angular velocity sensor in 3D with respect to the default unit if the unit is not defined. Otherwise, use the unit type defined in the sensor capability. |
| Unit | Specifies the unit of the sensed value, if a unit other than the default unit is used, as a reference to a classification scheme term provided by UnitCS defined in xxx of ISO/IEC 23005-6 and use the binary representation defined above. |

Table 88 denotes sensed information related to an angular acceleration sensor using the XML format. However, a program source shown in Table 88 is only an example embodiment, and thus, the present disclosure is not limited thereto.

TABLE 88

```
<!--###############################################-->
    <!--Definition of Angular Acceleration Sensor type -->
    <!--###############################################-->
    <complexType name="AngularAccelerationSensorType">
        <complexContent>
            <extension base="iidl:SensedInfoBaseType">
                <sequence>
                    <element name="AngularAcceleration"
type="mpegvct:Float3DVectorType" minOccurs="0"/>
                </sequence>
                <attribute name="timestamp" type="float"
                    use="optional"/>
                <attribute name="unit" type="mpegvct:unitType"
                    use="optional"/>
            </extension>
        </complexContent>
    </complexType>
```

An angular acceleration sensor type is a tool for describing sensed information related to the angular acceleration sensor.

The angular acceleration sensor type may include attributes such as a timestamp, a life span, an angular acceleration, an angular acceleration value type, an AAx, an My, and an AAz.

The timestamp denotes information on a sensing time of the angular acceleration sensor.

The life span denotes information on a valid period of a command of the angular acceleration sensor. For example, the life span may be expressed in units of seconds.

The angular acceleration denotes information on an angular acceleration sensor value expressed by a unit of angular acceleration, for example, radian/s$^2$.

The angular acceleration value type denotes a tool for indicating a 3D angular acceleration vector.

The AAx denotes information on an x-axis value of the angular acceleration sensor.

The AAy denotes information on a y-axis value of the angular acceleration sensor.

The AAz denotes information on a z-axis value of the angular acceleration sensor.

Table 89 shows binary representation syntax corresponding to the sensed information related to the angular acceleration sensor according to the example embodiments.

TABLE 89

| AngularAccelerationSensorType{ | Number of bits | Mnemonic |
|---|---|---|
| angularaccelerationFlag | 1 | bslbf |
| unitFlag | 1 | bslbf |
| SensedInfoBaseType | | SensedInfoBaseTypeType |
| if(angularaccelerationFlag) { | | |
|   angularacceleration | | Float3DVectorType |
| } | | |
| if(unitFlag) { | | |
|   unit | | unitType |
| } | | |
| } | | |

Table 90 shows descriptor components semantics of the angular acceleration sensor, according to the example embodiments.

TABLE 90

| Names | Description |
|---|---|
| AngularAccelerationSensorType | Tool for describing sensed information with respect to an angular acceleration sensor |
| angularaccelerationFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| SensedInfoBaseType | Provides the topmost type of the base type hierarchy which each individual sensed information can inherit. |
| Angularacceleration | Describes the sensed value of the angular acceleration sensor in 3D with respect to the default unit if the unit is not defined. Otherwise, use the unit type defined in the sensor capability. |
| Unit | Specifies the unit of the sensed value, if a unit other than the default unit is used, as a reference to a classification scheme term provided by UnitCS defined in xxx of ISO/IEC 23005-6 and use the binary representation defined above. |

Table 91 denotes sensed information related to a force sensor using the XML format. However, a program source shown in Table 91 is only an example embodiment, and thus, the present disclosure is not limited thereto.

TABLE 91

```
<!--######################################-->
    <!--Definition of Force Sensor type    -->
    <!--######################################-->
    <complexType name="ForceSensorType">
        <complexContent>
            <extension base="iidl:SensedInfoBaseType">
                <sequence>
                    <element name="force"
type="mpegvct:Float3DVectorType" minOccurs="0"/>
                </sequence>
                <attribute name="timestamp" type="float"
                    use="optional"/>
                <attribute name="unit" type="mpegvct:unitType"
                    use="optional"/>
            </extension>
        </complexContent>
    </complexType>
```

A force sensor type is a tool for describing sensed information related to the force sensor.

The force sensor type may include attributes such as a timestamp, a life span, a force, a force value type, FSx, FSy, and FSz.

The timestamp denotes information on a sensing time of the force sensor.

The life span denotes information on a valid period of a command of the force sensor. For example, the life span may be expressed in units of seconds.

The force denotes information on a force sensor value expressed by a unit of force, for example, N.

The force value type denotes a tool for indicating a 3D force vector.

The FSx denotes information on an x-axis force value of the force sensor.

The FSy denotes information on a y-axis force value of the force sensor.

The FSz denotes information on a z-axis force value of the force sensor.

Table 92 shows binary representation syntax corresponding to the sensed information related to the force sensor, according to the example embodiments.

TABLE 92

| ForceSensorType{ | Number of bits | Mnemonic |
|---|---|---|
| forceFlag | 1 | bslbf |
| unitFlag | 1 | bslbf |
| SensedInfoBaseType |  | SensedInfoBaseTypeType |
| if(forceFlag) { |  |  |
|   force |  | Float3DVectorType |
| } |  |  |
| if(unitFlag) { |  |  |
|   unit |  | unitType |
| } |  |  |
| } |  |  |

Table 93 shows descriptor components semantics of the force sensor according to the example embodiments.

TABLE 93

| Names | Description |
|---|---|
| ForceSensorType | Tool for describing sensed information with respect to a force sensor |
| forceFlag | This field, which is only present in the binary representation, signals the presence of sensor value attribute. A value of "1" means the attribute shall be used and "0" means the attribute shall not be used. |

TABLE 93-continued

| Names | Description |
|---|---|
| unitFlag | This field, which is only present in the binary representation, signals the presence of unit attribute. A value of "1" means the user-defined unit shall be used and "0" means the user-defined unit shall not be used. |
| SensedInfo-BaseType | Provides the topmost type of the base type hierarchy which each individual sensed information can inherit. |
| force | Describes the sensed value of the force sensor in 3D with respect to the default unit if the unit is not defined. Otherwise, use the unit type defined in the sensor capability. |
| unit | Specifies the unit of the sensed value, if a unit other than the default unit is used, as a reference to a classification scheme term provided by UnitCS defined in xxx of ISO/IEC 23005-6 and use the binary representation defined above. |

Table 94 denotes sensed information related to a torque sensor using the XML format. However, a program source shown in Table 94 is only an example embodiment, and thus, the present disclosure is not limited thereto.

TABLE 94

```
<!--######################################-->
    <!--Definition of Torque Sensor type    -->
    <!--######################################-->
    <complexType name="TorqueSensorType">
        <complexContent>
            <extension base="iidl:SensedInfoBaseType">
                <sequence>
                    <element name="Torque"
type="mpegvct:Float3DVectorType" minOccurs="0"/>
                </sequence>
                <attribute name="timestamp" type="float"
                    use="optional"/>
                <attribute name="unit" type="mpegvct:unitType"
                    use="optional"/>
            </extension>
        </complexContent>
    </complexType>
```

A torque sensor type is a tool for describing sensed information related to the torque sensor.

The torque sensor type may include attributes such as a timestamp, a life span, a torque, a torque value type, TSx, TSy, and TSz.

The timestamp denotes information on a sensing time of the torque sensor.

The life span denotes information on a valid period of a command of the torque sensor. For example, the life span may be expressed in units of units.

The torque denotes information on a torque sensor value expressed by a unit of torque, for example, N-mm.

The torque value type denotes a tool for indicating a 3D torque vector.

The TSx denotes information on an x-axis torque value of the torque sensor.

The TSy denotes information on a y-axis torque value of the torque sensor.

The TSz denotes information on a z-axis torque value of the force sensor.

Table 95 shows binary representation syntax corresponding to the sensed information related to the torque sensor according to the example embodiments.

TABLE 95

| TorqueSensorType{ | Number of bits | Mnemonic |
|---|---|---|
| TorqueFlag | 1 | Bslbf |
| unitFlag | 1 | Bslbf |
| SensedInfoBaseType |  | SensedInfoBaseTypeType |
| if(torqueFlag) { |  |  |
|   torque |  | Float3DVectorType |
| } |  |  |
| if(unitFlag) { |  |  |
|   unit |  | unitType |
| } |  |  |
| } |  |  |

Table 96 shows descriptor components semantics of the torque sensor, according to the example embodiments.

TABLE 96

| Names | Description |
|---|---|
| TorqueSensorType | Tool for describing sensed information with respect to a torque sensor |
| torqueFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| SensedInfoBaseType | Provides the topmost type of the base type hierarchy which each individual sensed information can inherit. |
| torque | Describes the sensed value of the torque sensor in 3D with respect to the default unit if the unit is not defined. Otherwise, use the unit type defined in the sensor capability. |
| unit | Specifies the unit of the sensed value, if a unit other than the default unit is used, as a reference to a classification scheme term provided by UnitCS defined in xxx of ISO/IEC 23005-6 and use the binary representation defined above. |

Table 97 denotes sensed information related to a pressure sensor using the XML format. However, a program source shown in Table 97 is only an example embodiment, and thus, the present disclosure is not limited thereto.

TABLE 97

```
<!--###################################### -->
<!--Definition of Pressure Sensor type -->
<!--###################################### -->
<complexType name="PressureSensorType">
    <complexContent>
        <extension base="iidl:SensedInfoBaseType">
            <attribute name="timestamp" type="float" use="optional"/>
            <attribute name="value" type="float" use="optional"/>
            <attribute name="unit" type="mpegvct:unitType"
                use="optional"/>
        </extension>
    </complexContent>
</complexType>
```

A pressure sensor type is a tool for describing sensed information related to the pressure sensor.

The pressure sensor type may include attributes such as a timestamp, a life span, and a value.

The timestamp denotes information on a sensing time of the pressure sensor.

The life span denotes information on a valid period of a command of the pressure sensor. For example, the life span may be expressed in units of seconds.

The value denotes information on a pressure sensor value expressed by a unit of pressure, for example, $N/mm^2$.

Table 98 shows binary representation syntax corresponding to the sensed information related to the torque pressure, according to the example embodiments.

TABLE 98

| PressureSensorType{ | Number of bits | Mnemonic |
|---|---|---|
| valueFlag | 1 | bslbf |
| unitFlag | 1 | bslbf |
| SensedInfoBaseType |  | SensedInfoBaseTypeType |
| if(valueFlag) { |  |  |
|   value | 32 | fsbf |
| } |  |  |
| if(unitFlag) { |  |  |
|   unit |  | unitType |
| } |  |  |
| } |  |  |

Table 99 shows descriptor components semantics of the pressure sensor, according to the example embodiments.

TABLE 99

| Names | Description |
|---|---|
| PressureSensorType | Tool for describing sensed information with respect to a pressure sensor. |
| valueFlag | This field, which is only present in the binary representation, signals the presence of sensor value attribute. A value of "1" means the attribute shall be used and "0" means the attribute shall not be used. |
| unitFlag | This field, which is only present in the binary representation, signals the presence of unit attribute. A value of "1" means the user-defined unit shall be used and "0" means the user-defined unit shall not be used. |
| SensedInfoBaseType | Provides the topmost type of the base type hierarchy which each individual sensed information can inherit. |
| value | Describes the sensed value of the pressure sensor with respect to the default unit if the unit is not defined. Otherwise, use the unit type defined in the sensor capability. |
| Unit | Specifies the unit of the sensed value, if a unit other than the default unit is used, as a reference to a classification scheme term provided by UnitCS defined in xxx of ISO/IEC 23005-6 and use the binary representation defined above. |

Table 100 may be a program representing a timestamp type using the XML format. However, the program source shown in Table 100 is only an example embodiment, and thus, the present disclosure is not limited thereto.

TABLE 100

```
<complexType name="TimeStampType" abstract="true"/>
<complexType name="AbsoluteTimeType">
    <complexContent>
        <extension base="ct:TimeStampType">
            <attribute name="absTimeScheme" type="string"
                use="optional"/>
            <attribute name="absTime" type="string"/>
        </extension>
    </complexContent>
</complexType>
<complexType name="ClockTickTimeType">
    <complexContent>
        <extension base="ct:TimeStampType">
            <attribute name="timeScale" type="unsignedInt"
                use="optional"/>
            <attribute name="pts" type="nonNegativeInteger"/>
```

TABLE 100-continued

```
        </extension>
    </complexContent>
</complexType>
<complexType name="ClockTickTimeDeltaType">
    <complexContent>
        <extension base="ct:TimeStampType">
            <attribute name="timeScale" type="unsignedInt"
                use="optional"/>
            <attribute name="ptsDelta" type="unsignedInt"/>
        </extension>
    </complexContent>
</complexType>
```

Table 101 shows binary representation syntax related to the timestamp type, according to the example embodiments.

TABLE 101

```
TimeStampType{
TimeStampSelect                          2      Bslbf
if(TimeStampSelect==00){
   AbsoluteTimeStamp                            AbsoluteTimeStampType
} else if (TimeStampSelect==01){
   ClockTickTimeStamp                           ClockTickTimeStampType
} else if (TimeStampSelect==10){
   ClockTickTimeDeltaStamp                      ClockTickTimeDeltaStampType
}
}
```

TABLE 101-continued

| AbsoluteTimeStampType { | Number of bits | Mnemonic |
|---|---|---|
| absTimeSchemeFlag | 1 | bslbf |
| if(absTimeSchemeFlag){ | | |
| AbsTimeSchemeLength | | vluimsbf5 |
| absTimeScheme | 8*AbsTimeSchemeLength | bslbf |
| } | | |
| AbsTimeLength | | vluimsbf5 |
| absTime | 8*AbsTimeLength | bslbf |
| } | | |

| ClockTickTimeType { | Number of bits | Mnemonic |
|---|---|---|
| timeScaleFlag | 1 | bslbf |
| if(timeScaleFlag){ | | |
| timeScale | 32 | uimsbf |
| } | | |
| pts | | vluimsbf5 |
| } | | |

| ClockTickTimeDeltaType { | Number of bits | Mnemonic |
|---|---|---|
| timeScaleFlag | 1 | bslbf |
| if(timeScaleFlag){ | | |
| timeScale | 32 | uimsbf |
| } | | |
| ptsDelta | 32 | uimsbf |
| } | | |

Table 101-2 shows descriptor components semantics of the timestamp type, according to the example embodiments.

TABLE 101-2

| Names | Description |
|---|---|
| TimeStampType | Tools for Providing the timing information for the device command to be executed. As defined in Part 6 of ISO/IEC 23005, there is a choice of selection among three timing schemes, which are absolute time, clock tick time, and delta of clock tick time |
| TimeStampSelect | This field, which is only present in the binary representation, describes which time stamp scheme shall be used. "00" means that the absolute time stamp type shall be used, "01" means that the clock tick time stamp type shall be used, and "10" means that the clock tick time delta stamp type shall be used. |
| AbsoluteTimeStamp | The absolute time stamp is defined in A.2.3 of ISO/IEC 23005-6. |
| ClockTickTimeStamp | The clock tick time stamp is defined in A.2.3 of ISO/IEC 23005-6. |
| ClockTickTimeDeltaStamp | The clock tick time delta stamp, which value is the time delta between the present and the past time, is defined in A.2.3 of ISO/IEC 23005-6. |
| AbsoluteTimeStampType | Tools for Providing the absolute timing information for the sensed information. |
| ClockTickTimeType | Tools for Providing the clock tick timing information for the sensed information. |
| ClockTickTimeDeltaType | Tools for Providing the delta of clock tick timing information for the sensed information. |
| absTimeSchemeFlag | This field, which is only present in the binary representation, describes whether an optional absolute time stamp scheme shall be selected or not. |
| AbsTimeSchemeLength | This field, which is only present in the binary representation, describes the length of the absolute time scheme. |
| absTimeScheme | Specifies the absolute time scheme used in the format of string. See the annex C of ISO/IEC 21000-17:2006 for examples of time schemes syntax. If mpeg-7 time scheme is used, the value for this field shall be "mp7t". |
| AbsTimeLength | This field, which is only present in the binary representation, describes the length of the absolute time element. |
| absTime | Provides value of time information in the format defined in the absolute time scheme specified in absTimeScheme attribute. |

TABLE 101-2-continued

| Names | Description |
| --- | --- |
| timeScaleFlag | This field, which is only present in the binary representation, describes whether a time scale element shall be used or not. |
| timeScale | An optional attribute to provide the time scale for the clock tick, i.e. the number of clock ticks per second. |
| Pts | Specifies the number of clock ticks from the origin of the target device. |
| timeScaleFlag | This field, which is only present in the binary representation, describes whether a time scale element shall be used or not. |
| timeScale | An optional attribute to provide the time scale for the clock tick, i.e. the number of clock ticks per second. |
| ptsDelta | Specifies the number of clock ticks from the time point specified by the last timing information provided. |

Figure 19:
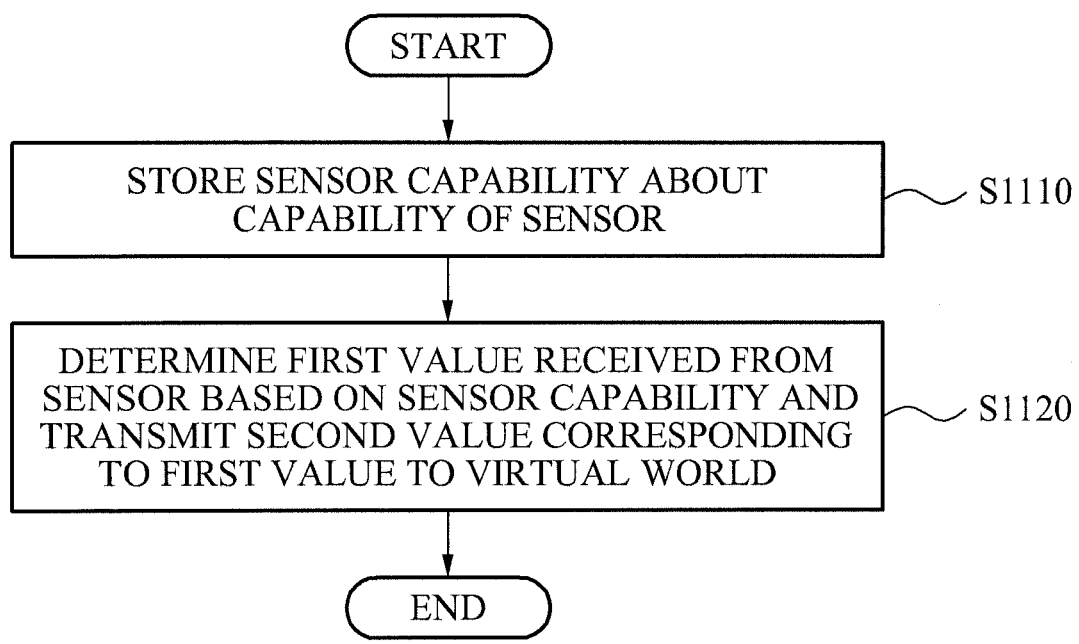
FIG. 19 is a flowchart illustrating a virtual world processing method, according to example embodiments.

FIG. 19 is a flowchart illustrating a virtual world processing method, according to example embodiments.

Referring to FIG. 19, the virtual world processing method may store sensor capability related to capability of a sensor in operation 1110.

In operation 1120, a first value received from the sensor may be determined based on the sensor capability and a second value corresponding to the first value may be transmitted to the virtual world.

Depending on embodiments, the sensor capability may include a maximum value and a minimum value measurable by the sensor. For example, when the first value is within a range, i.e., less than or equal to the maximum value and greater than or equal to the minimum value, the virtual world processing method may transmit the second value corresponding to the first value to the virtual world.

Depending on embodiments, the sensor capability may also include a unit of the first value measured by the sensor. In addition, the sensor capability may include an offset value added to the first value measured by the sensor to obtain an absolute value. The sensor capability may further include a number of values measurable by the sensor. The sensor capability may further include a minimum input value required for the sensor to measure an output value. The sensor capability may further include an SNR of the sensor. The sensor capability may further include an error of the sensor. Additionally, the sensor capability may further include a position of the sensor.

The virtual world processing method may further include an operation (not shown) of storing a sensor adaptation preference for manipulation of the first value received from the sensor. The operation of transmitting the first value may include generating a third value from the first value based on the sensor capability and generating the second value from the third value based on the sensor adaptation preference.

Depending on embodiments, the sensor adaptation preference may include information on a method of applying the sensor adaptation preference to the first value. The sensor adaptation preference may further include information on whether to activate the sensor in the virtual world. The sensor adaptation preference may further include a unit of the second value used in the virtual world. The sensor adaptation preference may further include a maximum value and a minimum value of the second value used in the virtual world. In addition, the sensor adaptation preference may further include a number of the second values used in the virtual world.

Figure 20:
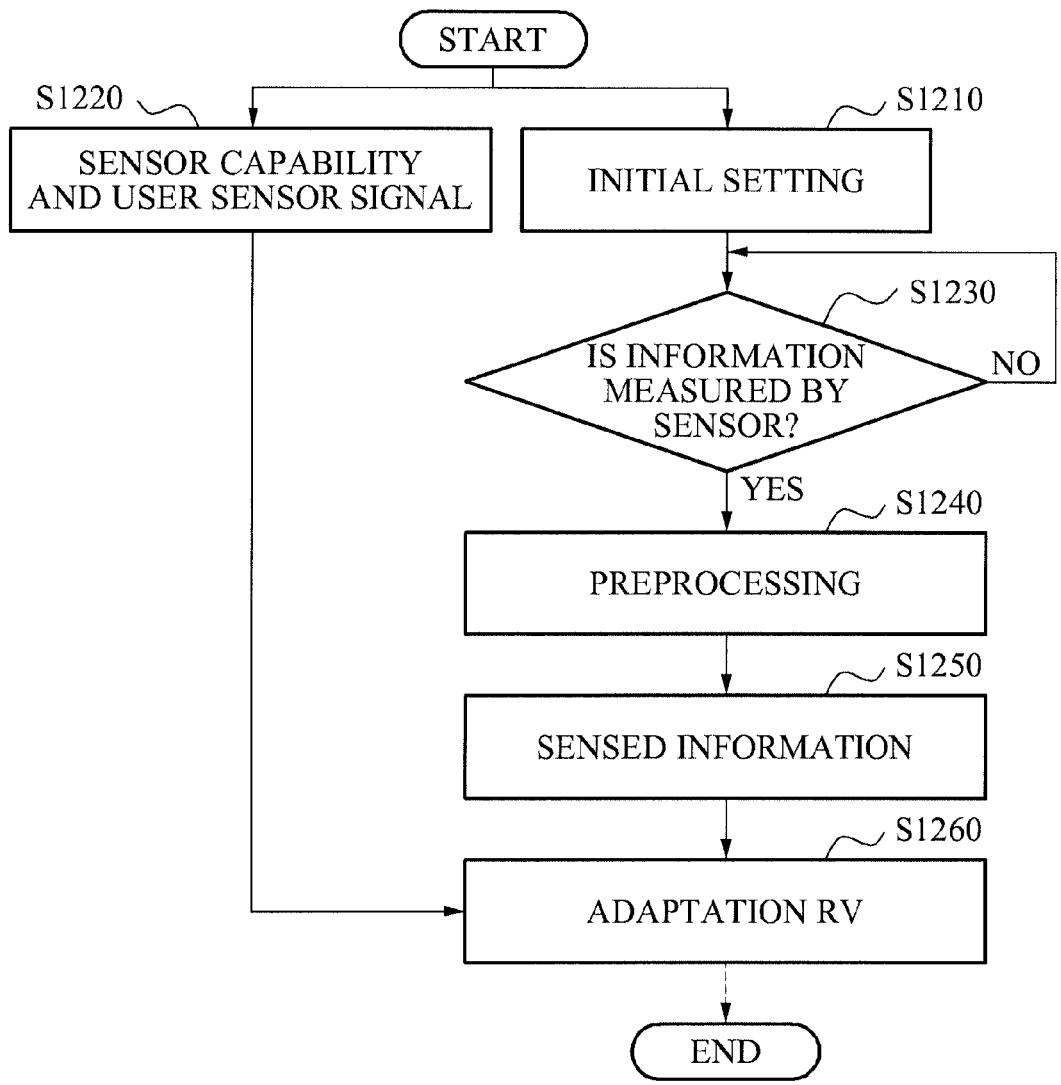
FIG. 20 is a flowchart illustrating a virtual world processing apparatus, according to other example embodiments.

FIG. 20 illustrates a flowchart of a virtual world processing method, according to other example embodiments.

Referring to FIG. 20, the virtual world processing method may perform an initial setting to be input with information of a real world from a sensor in operation 1210. Depending on embodiments, the initial setting may be an operation of activating the sensor.

The virtual world processing method may store sensor capability as information on capability of the sensor and a sensor adaptation preference as information for manipulation of a value received from the sensor, in operation 1220.

The virtual world processing method may measure information on a motion, state, intention, shape, and the like of a user of the real world through eth sensor, in operation 1230. When the sensor is incapable of measuring the information, operation 1230 may be repeated until the information is measured.

When the information is measured through the sensor, preprocessing with respect to the information may be performed in operation 1240.

Also, the virtual world processing method may control the sensor using sensed information which is a command for controlling the sensor in operation 1250.

An adaptation RV may determine a first value received from the sensor based on the sensor capability and transmit a second value corresponding to the first value to a virtual world, in operation 1260. Depending on embodiments, a third value may be generated from the first value based on the sensor capability, the second value may be generated from the third value based on the sensor adaptation preference, and the second value may be transmitted to the virtual world.

Figure 21:
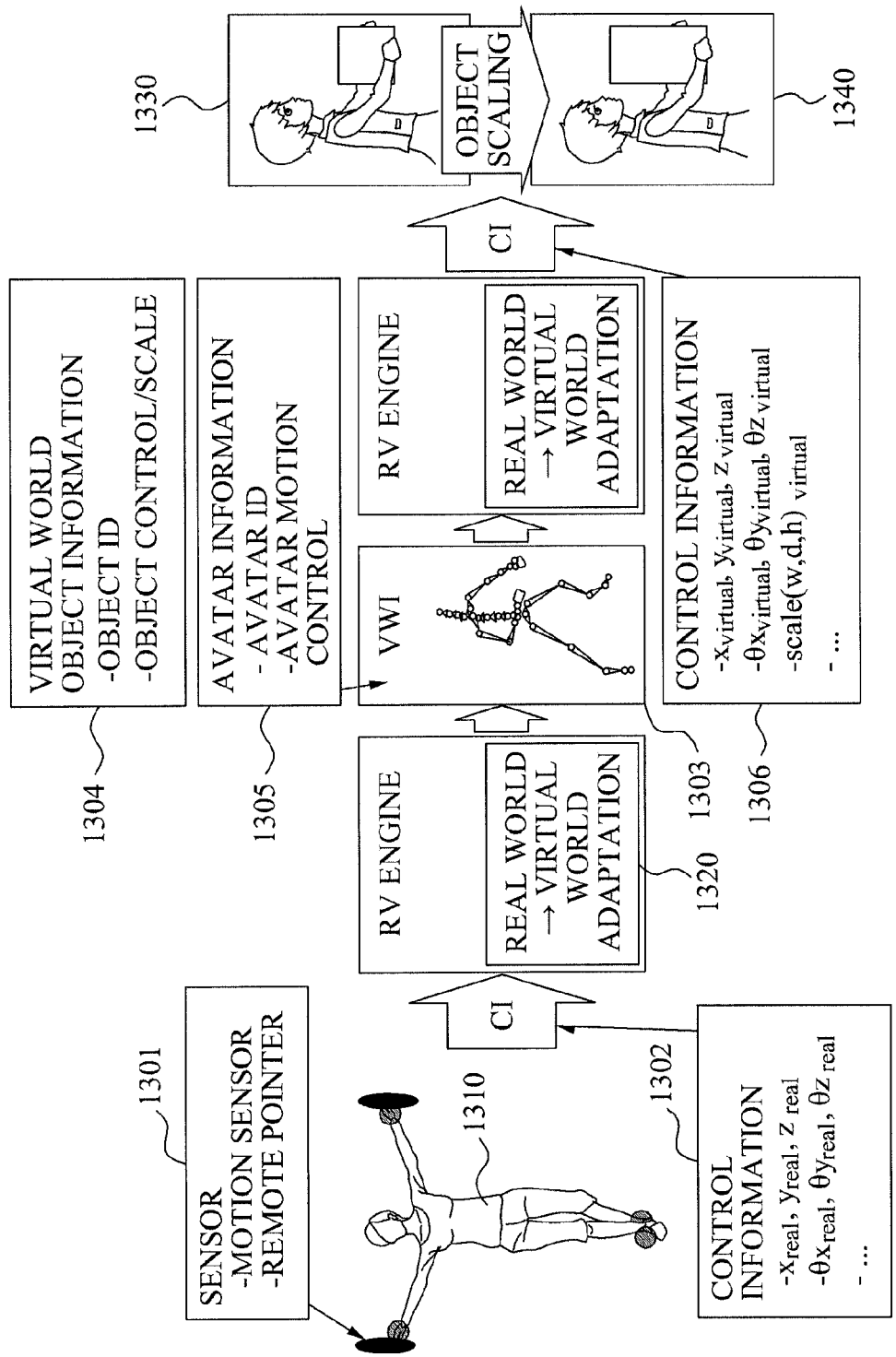
FIG. 21 illustrates an operation of using a virtual world processing apparatus, according to example embodiments.

FIG. 21 illustrates an operation of using a virtual world processing apparatus according to example embodiments.

Referring to FIG. 21, a user 1310 of a real world may input his or her intention through a sensor 1301. Depending on embodiments, the sensor 1301 may include a motion sensor configured to measure a motion of the user 1310 of the real world, and remote pointers attached to ends of arms and legs of the user 1310 and configured to measure directions and positions indicated by the ends of the arms and legs.

A sensor signal may be transmitted to the virtual world processing apparatus, the sensor signal which includes control information (CI) 1302 related to an arm opening motion, a still standing state, positions of hands and feet, an open angle of a hand, and the like of the user 1310.

Depending on embodiments, the CI 1302 may include sensor capability, a sensor adaptation preference, and sensed information.

Depending on embodiments, the CI 1302 may include position information of the arms and the legs of the user 1310, expressed by $X_{real}$, $Y_{real}$, and $Z_{real}$ denoting values on an x-axis, y-axis, and z-axis and $\Theta_{Xreal}$, $\Theta_{Yreal}$ and $\Theta_{Zreal}$ denoting angles with respect to the x-axis, y-axis, and z-axis.

The virtual world processing apparatus may include an RV engine 1320. The RV engine 1320 may convert information of the real world to information applicable to a virtual world, using the CI 1302 included in the sensor signal.

Depending on embodiments, the RV engine 1320 may convert VWI 1303 using the CI 1302.

The VWI 1303 denotes information on the virtual world. For example, the VWI 1303 may include information on an object of the virtual world or elements constituting the object.

The VWI 1303 may include virtual world object information 1304 and avatar information 1305.

The virtual world object information 1304 denotes information on the object of the virtual world. The virtual world object information 1304 may include an object ID denoting ID information for recognizing identity of the object of the virtual world, and an object control and scale denoting information for controlling a state, size, and the like of the object of the virtual world.

Depending on embodiments, the virtual world processing apparatus may control the virtual world object information 1304 and the avatar information 1305 by a control command. The control command may include commands such as generation, disappearance, copy, and the like. The virtual world processing apparatus may generate the commands by selecting information to be manipulated from the virtual world object information 1304 and the avatar information 1305, along with the control command, and designating an ID corresponding to the selected information.

Table 102 denotes a method of constructing the control command using an XML. However, a program source shown in Table 102 is not limiting but only an example embodiment.

TABLE 102

```
<!-- ################################################## -->
<!-- Definition of Control command for Avatar and virtual object -->
<!-- ################################################## -->
<complexType name="ControlCommand">
    <SimpleContent>
        <attribute name="command" type="scdv:commandType"
            use="required"/>
        <attribute name="Object" type="scdv:ObjectType"
            use="required"/>
        <attribute name="ObjectID" type="ID" use="optional"/>
    </SimpleContent>
</complexType>
<simpleType name="commandType">
<restriction base="string">
    <enumeration value="Create"/>
    <enumeration value="Remove"/>
    <enumeration value="Copy"/>
</restriction>
</simpleType>
<simpleType name="ObjectType">
<restriction base="string">
    <enumeration value="Avatar"/>
    <enumeration value="VirtualObject"/>
</restriction>
</simpleType>
```

The RV engine 1320 may convert the VWI 1303 by applying information on the arm opening motion, the still standing state, the positions of hands and feet, the open angle of a hand, and the like, using the CI 1302.

The RV engine 1320 may transmit information 1306 on the converted VWI to the virtual world. The information 1306 on the converted VWI may include position information of arms and legs of an avatar of the virtual world, expressed by $X_{virtual}$, $Y_{virtual}$, and $Z_{virtual}$ denoting values on the x-axis, y-axis, and z-axis and $\Theta_{Xvirtual}$, $\Theta_{Yvirtual}$, and $\Theta_{Zvirtual}$ denoting angles with respect to the x-axis, y-axis, and z-axis. In addition, the information 1306 may include information on a size of the object of the virtual world, expressed by a scale $(s,d,h)_{virtual}$ denoting a width value, a height value, and a depth value of the object.

Depending on embodiments, in a virtual world 1330 of before transmission of the information 1306, the avatar is holding the object. In a virtual world 1340 of after transmission of the information 1306, since the arm opening motion, the still standing state, the positions of hands and feet, the open angle of a hand, and the like are reflected, the avatar of the virtual world may scale up the object.

That is, when the user 1310 of the real world makes a motion of holding and enlarging the object, the CI 1302 related to the arm opening motion, the still standing state, the positions of hands and feet, the open angle of a hand, and the like may be generated through the sensor 1301. Also, the RV engine 1320 may convert the CI 1302 related to the user 1310 of the virtual world, which is data measured in the real world, to the information applicable to the virtual world. The converted information may be applied to a structure of information related to the avatar and the object of the virtual world. Therefore, the motion of holding and enlarging the object may be reflected to the avatar, and the object may be enlarged.

Example embodiments include computer-readable media including program instructions to implement various operations embodied by a computer. The media may also include, alone or in combination with the program instructions, data files, data structures, tables, and the like. The media and program instructions may be those specially designed and constructed for the purposes of example embodiments, or they may be of the kind well known and available to those having skill in the computer software arts. Examples of computer-readable media include magnetic media such as hard disks, floppy disks, and magnetic tape; optical media such as CD ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter. The described hardware devices may be configured to act as one or more software modules in order to perform the operations of the above-described example embodiments, or vice versa. Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW.

Further, according to an aspect of the embodiments, any combinations of the described features, functions and/or operations can be provided.

Moreover, the virtual world processing apparatus may include at least one processor to execute at least one of the above-described units and methods.

Although a few example embodiments have been shown and described, the present disclosure is not limited to the described example embodiments. Instead, it would be appreciated by those skilled in the art that changes may be made to these example embodiments without departing from the principles and spirit of the disclosure, the scope of which is defined by the claims and their equivalents.

The invention claimed is:

1. A virtual world processing apparatus comprising:
a sensor to encode information relating to sensor capability into first metadata based on predetermined representation syntax,
wherein the predetermined representation syntax defines attributes, and flags corresponding to the attributes, and
wherein the first metadata includes the flags corresponding to the attributes, and at least one attribute corresponding to at least one flag having a predefined logic value.

2. The virtual world processing apparatus of claim 1, wherein the information relating to the sensor capability includes at least a minimum value and a maximum value.

3. The virtual world processing apparatus of claim 1, further comprising:
an adaptation virtual world to real world (VR) unit to encode information relating to a virtual world into second metadata,
wherein the information relating to the virtual world comprises a virtual world object characteristic; and
an adaptation real world to virtual world (RV) unit to generate information that is applied to the virtual world, based on the first metadata and the second metadata, and to encode the generated information into third metadata.

4. The virtual world processing apparatus of claim 3, wherein
the sensor encodes information collected from a real world into fourth metadata, and
the adaptation RV unit generates information that is applied to the virtual world, based on the first metadata, the second metadata, and the fourth metadata.

5. The virtual world processing apparatus of claim 4, wherein the information collected from the real world is sensed information, sensed by the sensor, relating to at least one of movement, state, intention, and shape of a user.

6. The virtual world processing apparatus of claim 3, wherein the sensor generates the first metadata by encoding the information relating to sensor capability into a binary format, and transmits the binary-encoded first metadata to the adaptation RV unit.

7. The virtual world processing apparatus of claim 6, wherein the binary-encoded first metadata comprises binary encoding syntax, a number of bits of attributes of the binary encoding syntax, and a mnemonic of the attributes.

8. The virtual world processing apparatus of claim 3, wherein the sensor generates the first metadata by encoding the information relating to sensor capability into an extensible markup language (XML) format, and transmits the XML-encoded first metadata to the adaptation RV unit.

9. The virtual world processing apparatus of claim 3, wherein the sensor generates the first metadata by encoding the information relating to sensor capability into an XML format and encoding the XML-encoded data into a binary format, and transmits the binary-encoded first metadata to the adaptation RV unit.

10. The virtual world processing apparatus of claim 3, wherein the adaptation VR unit generates the second metadata by encoding the information on the virtual world into a binary format, and transmits the binary-encoded second metadata to the adaptation RV unit.

11. The virtual world processing apparatus of claim 10, wherein the binary-encoded second metadata comprises binary encoding syntax, a number of bits of attributes of the binary encoding syntax, and a mnemonic of the attributes.

12. The virtual world processing apparatus of claim 3, wherein the adaptation VR unit generates the second metadata by encoding the information relating to the virtual world into an XML format, and transmits the XML-encoded second metadata to the adaptation RV unit.

13. The virtual world processing apparatus of claim 3, wherein the adaptation VR unit generates the second metadata by encoding the information relating to the virtual world into an XML format and encoding the XML-encoded data to a binary format, and transmits the binary-encoded second metadata to the adaptation RV unit.

14. The virtual world processing apparatus of claim 3, wherein the sensor generates fourth metadata by encoding information relating to a real world into an extensible markup language (XML) format, and encoding the encoded information relating to the real world into a binary format, and
transmitting the fourth metadata, encoded into the binary format, to the adaptation RV unit.

15. The virtual world processing apparatus of claim 3, further comprising:
an actuator to reflect information on the virtual world to the real world by decoding encoded data of an XML format received from the adaptation VR unit, such that the actuator operates in response to the decoded data.

16. The virtual world processing apparatus of claim 3, further comprising:
an actuator to reflect information on the virtual world to the real world by decoding encoded data of a binary format received from the adaptation VR unit, such that the actuator operates in response to the decoded data.

17. A virtual world processing method comprising:
encoding information relating to sensor capability into first metadata based on predetermined representation syntax,
wherein the predetermined representation syntax defines attributes and flags corresponding to the attributes, and
wherein the first metadata includes the flags corresponding to the attributes, and at least one attribute corresponding to at least one flag having a predefined logic value;
encoding information relating to a virtual world into second metadata,
wherein the information relating to the virtual world comprises a virtual world object characteristic;
generating information that is applied to the virtual world, based on the first metadata and the second metadata; and
encoding the generated information into third metadata.

18. The virtual world processing method of claim 17, further comprising:
encoding information collected from a real world into fourth metadata,
wherein the generating comprises generating the information that is applied to the virtual world based on the first metadata, the second metadata, and the fourth metadata.

19. The virtual world processing method of claim 17, wherein the encoding of the information on sensor capability into the first metadata comprises generating the first metadata by encoding the information relating to sensor capability into a binary format.

20. The virtual world processing method of claim 17, wherein the encoding of the information on sensor capability into the first metadata comprises generating the first metadata by encoding the information relating to sensor capability into an XML format.

21. The virtual world processing method of claim 17, wherein the encoding of the information on sensor capability into the first metadata comprises generating the first metadata by encoding the information relating to sensor capability into an XML format and encoding the XML-encoded information into a binary format.

22. The virtual world processing method of claim 17, wherein the encoding of the information relating the sensor capability into the first metadata comprises generating the first metadata by encoding the information on sensor capability into an XML format and encoding the XML-encoded information into a binary format.

23. A non-transitory computer-readable recording medium storing a program to cause a computer to implement the method of claim 17.

* * * * *